US012604536B2

(12) United States Patent
Iikubo et al.

(10) Patent No.: US 12,604,536 B2
(45) Date of Patent: Apr. 14, 2026

(54) SEMICONDUCTOR DEVICE AND METHOD FOR MANUFACTURING SEMICONDUCTOR DEVICE

(71) Applicant: Semiconductor Energy Laboratory Co., Ltd., Kanagawa-ken (JP)

(72) Inventors: Yoichi Iikubo, Tokyo (JP); Daisuke Yamaguchi, Iwata (JP); Yuichi Yanagisawa, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 683 days.

(21) Appl. No.: 17/912,753

(22) PCT Filed: Mar. 12, 2021

(86) PCT No.: PCT/IB2021/052065
§ 371 (c)(1),
(2) Date: Sep. 19, 2022

(87) PCT Pub. No.: WO2021/191716
PCT Pub. Date: Sep. 30, 2021

(65) Prior Publication Data
US 2023/0144044 A1     May 11, 2023

(30) Foreign Application Priority Data

Mar. 26, 2020     (JP) ................................. 2020-056394

(51) Int. Cl.
*H10D 99/00* (2025.01)
*H10D 30/67* (2025.01)
*H10B 12/00* (2023.01)

(52) U.S. Cl.
CPC ......... *H10D 99/00* (2025.01); *H10D 30/6755* (2025.01); *H10B 12/05* (2023.02)

(58) Field of Classification Search
CPC ..... H10D 30/6755; H10D 99/00; H10B 12/05
See application file for complete search history.

(56) References Cited

U.S. PATENT DOCUMENTS 6,251,800 B1 *   6/2001   Sun ........................ C23C 16/402
                                                    438/653
8,901,556 B2   12/2014   Okazaki et al.
                 (Continued)

FOREIGN PATENT DOCUMENTS

CN         111918982 A     11/2020
JP       2011-151383 A      8/2011
                 (Continued)

OTHER PUBLICATIONS

International Search Report (Application No. PCT/IB2021/052065) Dated Jun. 22, 2021.
                 (Continued)

*Primary Examiner* — Jeff W Natalini
*Assistant Examiner* — Ian Isaac Degrasse
(74) *Attorney, Agent, or Firm* — Husch Blackwell LLP

(57) ABSTRACT

A method for manufacturing a semiconductor device with a high yield is provided. In a semiconductor device including an oxide semiconductor over a substrate, when an insulator in contact with the oxide semiconductor, such as a gate insulator or an interlayer film, is deposited, the insulator can be deposited without diffusion of hydrogen into the oxide semiconductor by setting a constant derived from deposition conditions within a given range. Specifically, setting values of deposition power, the effective electrode area, deposition pressure, and the flow rate of a deposition gas containing hydrogen in the deposition conditions can be selected as appropriate.

18 Claims, 24 Drawing Sheets

(56) References Cited

U.S. PATENT DOCUMENTS

| | | | |
|---|---|---|---|
| 9,318,317 B2 | 4/2016 | Okazaki et al. | |
| 9,337,342 B2 | 5/2016 | Okazaki et al. | |
| 9,570,626 B2 | 2/2017 | Okazaki et al. | |
| 10,096,719 B2 | 10/2018 | Okazaki et al. | |
| 10,170,599 B2 | 1/2019 | Okazaki et al. | |
| 10,741,694 B2 | 8/2020 | Okazaki et al. | |
| 11,257,960 B2 | 2/2022 | Yamazaki et al. | |
| 11,437,523 B2 | 9/2022 | Okazaki et al. | |
| 2011/0018073 A1* | 1/2011 | Wang | H01L 21/28088 |
| | | | 257/E21.177 |
| 2011/0156027 A1 | 6/2011 | Yamazaki et al. | |
| 2012/0032730 A1 | 2/2012 | Koyama | |
| 2015/0380561 A1* | 12/2015 | Won | H10D 99/00 |
| | | | 257/43 |
| 2017/0040457 A1* | 2/2017 | Okazaki | H10D 99/00 |
| 2017/0162678 A1* | 6/2017 | Yim | H10D 62/80 |
| 2017/0309732 A1* | 10/2017 | Yamazaki | H10D 30/6755 |
| 2020/0185528 A1 | 6/2020 | Yamazaki et al. | |
| 2021/0119054 A1 | 4/2021 | Yamazaki et al. | |
| 2021/0222298 A1 | 7/2021 | Kobayashi et al. | |
| 2021/0320192 A1 | 10/2021 | Yamazaki et al. | |
| 2022/0352384 A1 | 11/2022 | Oota et al. | |
| 2023/0006064 A1 | 1/2023 | Okazaki et al. | |
| 2024/0178323 A1 | 5/2024 | Okazaki et al. | |

FOREIGN PATENT DOCUMENTS

| | | | |
|---|---|---|---|
| JP | 2012-257187 A | | 12/2012 |
| JP | 2014-007381 A | | 1/2014 |
| JP | 2014-033181 A | | 2/2014 |
| JP | 2020004913 A | * | 1/2020 |
| JP | 2020-027825 A | | 2/2020 |
| KR | 2020-0123207 A | | 10/2020 |
| TW | 202033825 | | 9/2020 |
| WO | WO-2013/150927 | | 10/2013 |
| WO | WO 2019/186331 A1 | | 10/2019 |
| WO | WO 2020/175152 A1 | | 9/2020 |

OTHER PUBLICATIONS

Written Opinion (Application No. PCT/IB2021/052065) Dated Jun. 22, 2021.

Yamazaki, S. et al., "Research, Development, and Application of Crystalline Oxide Semiconductor," SID Digest '12: SID International Symposium Digest of Technical Papers, Jun. 5, 2012, vol. 43, No. 1, pp. 183-186.

Yamazaki, S. et al., "Properties of crystalline In—Ga—Zn-oxide semiconductor and its transistor characteristics," Jpn. J. Appl. Phys. (Japanese Journal of Applied Physics), Mar. 31, 2014, vol. 53, No. 4S, pp. 04ED18-1-04ED18-10.

Kato, K. et al., "Evaluation of Off-State Current Characteristics of Transistor Using Oxide Semiconductor Material, Indium-Gallium-Zinc Oxide," Jpn. J. Appl. Phys. (Japanese Journal of Applied Physics) , 2012, vol. 51, pp. 021201-1-021201-7.

Shishido, H. et al., "2351-ppi OLED Display with Stacked OS-FETs with L = 0.36μm," SID Digest '19: SID International Symposium Digest of Technical Papers, May 29, 2019, vol. 50, No. 1, pp. 315-318.

* cited by examiner

FIG. 1A
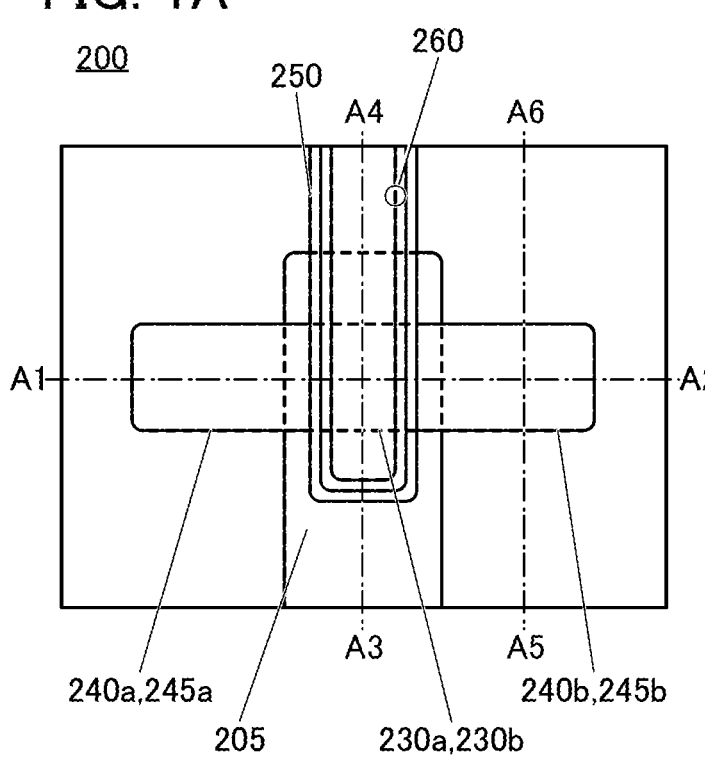
FIG. 1C
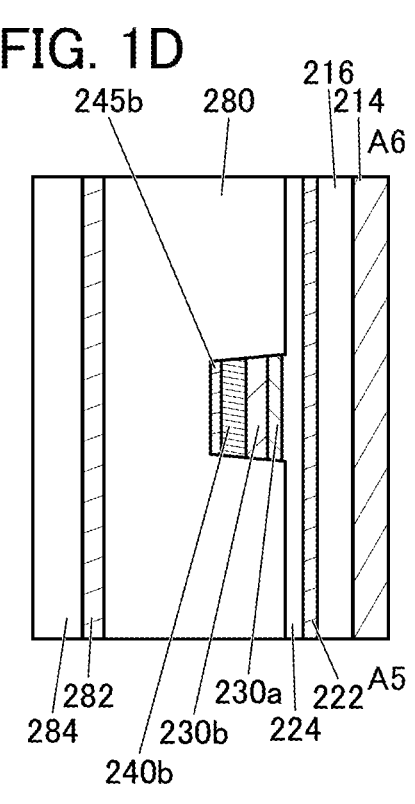
FIG. 1B
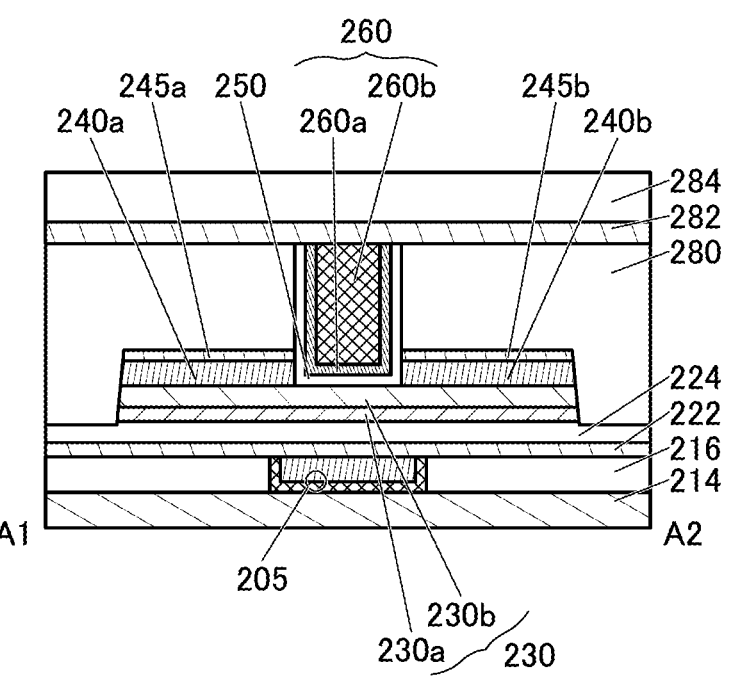
FIG. 1D

VDD   VIL

1400

1411

1470

1420

MC - - - MC

MC - - - MC

ADDR

CE

WE

RE

1460

1430

1440

WDATA          VSS          RDATA

1400

1470

1411

FIG. 16A
<u>1471</u>
FIG. 16B
<u>1472</u>
FIG. 16C
<u>1473</u>
FIG. 16D
<u>1474</u>
FIG. 16E
<u>1475</u>
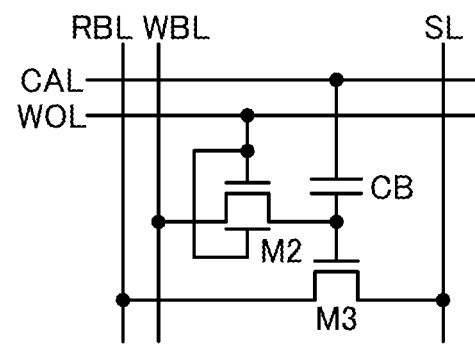
FIG. 16F
<u>1476</u>
FIG. 16G
<u>1477</u>
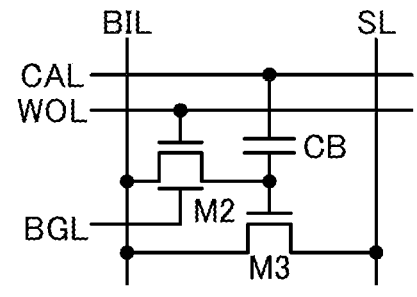
FIG. 16H
<u>1478</u>
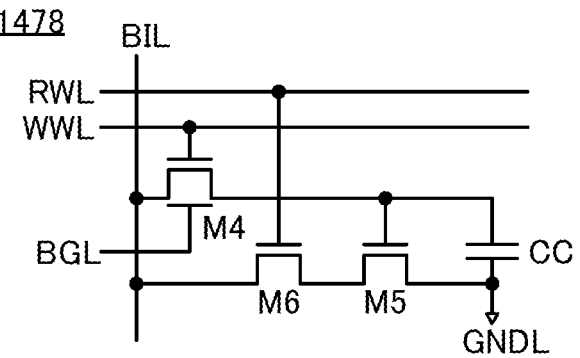

| |
|---|
| <div align="right">950</div> |
| <div align="right">930</div> |
| <div align="right">922</div> |
| <div align="right">916</div> |
| <div align="right">914</div> |
| <div align="right">900</div> |

| |
|---|
| 880 |
| 845 |
| 840 |
| 830 |
| 824 |
| 822 |
| 820 |
| 816 |
| 814 |
| 800 |

SEMICONDUCTOR DEVICE AND METHOD FOR MANUFACTURING SEMICONDUCTOR DEVICE

This application is a 371 of international application PCT/IB2021/052065 filed on Mar. 12, 2021 which is incorporated herein by reference.

TECHNICAL FIELD

One embodiment of the present invention relates to a semiconductor device and a method for manufacturing the semiconductor device. One embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

A technique by which a transistor is formed using a semiconductor thin film formed over a substrate having an insulating surface has been attracting attention. The transistor is applied to a wide range of electronic devices, such as an integrated circuit (IC) and an image display device (also simply referred to as a display device). A silicon-based semiconductor material is widely known as a semiconductor thin film applicable to the transistor; in addition, an oxide semiconductor has been attracting attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186
[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

An object of one embodiment of the present invention is to provide a highly reliable semiconductor device. Another object of one embodiment of the present invention is to provide a semiconductor device having favorable electrical characteristics. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. One embodiment of the present invention does not have to achieve all these objects. Other objects will be apparent from and can be derived from the description of the specification, the drawings, the claims, and the like.

Means for Solving the Problems

One embodiment of the present invention is a method for manufacturing a semiconductor device, in which an oxide semiconductor is formed over a substrate; and an insulator is formed over the oxide semiconductor by a chemical vapor deposition method under conditions satisfying a relation of Formula (1) below. In the formula, PW [W] represents a deposition power, S [cm$^2$] represents an effective electrode area, P [Pa] represents a deposition pressure, and f [sccm] represents a flow rate of a silane (SiH$_4$)-based deposition gas.

[Formula 1]

$$0 < \frac{(PW[W]/S[\mathrm{cm}^2]) \times P[Pa]}{f[sccm]} \leq 8 \tag{1}$$

One embodiment of the present invention is a method for manufacturing a semiconductor device, in which an oxide semiconductor is formed over a substrate; and an insulator is formed over the oxide semiconductor by a chemical vapor deposition method under conditions satisfying a relation of Formula (2) below. In the formula, PW [W] represents a deposition power, S [cm$^2$] represents an effective electrode area, P [Pa] represents a deposition pressure, and f [sccm] represents a flow rate of a silane (SiH$_4$)-based deposition gas.

[Formula 2]

$$0 < \frac{(PW[W]/S[\mathrm{cm}^2]) \times P[Pa]}{f[sccm]} \leq 7 \tag{2}$$

In the above-described method for manufacturing a semiconductor device, a conductor is deposited in contact with the oxide semiconductor after the oxide semiconductor is deposited; part of the conductor is removed to expose the oxide semiconductor; and the insulator is deposited in the exposed region of the oxide semiconductor.

In the above-described method for manufacturing a semiconductor device, a metal oxide film is deposited in contact with the conductor.

In the above-described method for manufacturing a semiconductor device, the metal oxide film inhibits diffusion of hydrogen and impurities.

In the above-described method for manufacturing a semiconductor device, the oxide semiconductor is an In—Ga—Zn oxide.

Effect of the Invention

According to one embodiment of the present invention, a semiconductor device can be manufactured with a high yield. According to one embodiment of the present invention, a semiconductor device can be manufactured at low cost.

According to one embodiment of the present invention, a highly reliable semiconductor device can be provided. According to one embodiment of the present invention, a semiconductor device having favorable electrical characteristics can be provided. According to one embodiment of the present invention, a semiconductor device with a high on-state current can be provided. According to one embodiment of the present invention, a semiconductor device that can be miniaturized or highly integrated can be provided. According to one embodiment of the present invention, a semiconductor device with low power consumption can be provided.

Note that the description of these effects does not preclude the existence of other effects. One embodiment of the present invention does not have to have all these effects. Other effects will be apparent from and can be derived from the descriptions of the specification, the drawings, the claims, and the like.

BRIEF DESCRIPTION OF THE DRAWINGS

FIG. 1A is a top view of a semiconductor device of one embodiment of the present invention.

FIG. 1B to FIG. 1D are cross-sectional views of a semiconductor device of one embodiment of the present invention.

FIG. 11A is a top view of a semiconductor device of one embodiment of the present invention.

FIG. 11B to FIG. 11D are cross-sectional views of a semiconductor device of one embodiment of the present invention.

FIG. 16A to FIG. 16H are circuit diagrams illustrating structure examples of a memory device of one embodiment of the present invention.

FIG. 18A to FIG. 18E are schematic views of memory devices of one embodiment of the present invention.

FIG. 19A to FIG. 19H are diagrams illustrating electronic devices of one embodiment of the present invention.

MODE FOR CARRYING OUT THE INVENTION

Figure 2A:
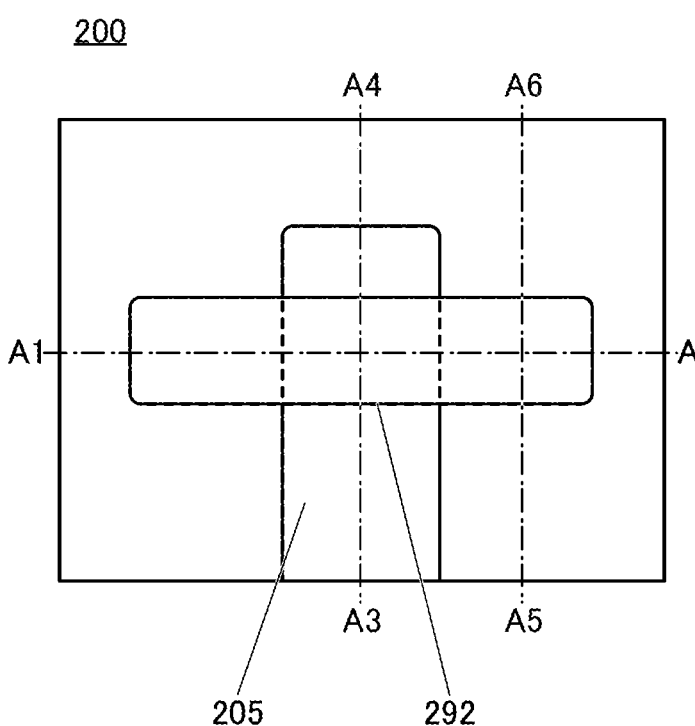
FIG. 2A is a top view of a semiconductor device of one embodiment of the present invention.
Figure 2C:
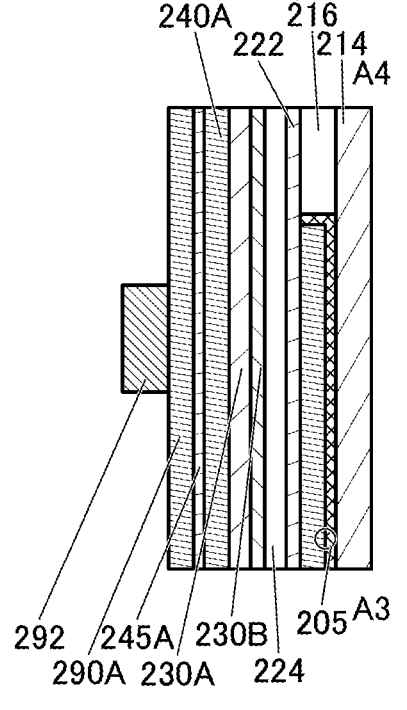
FIG. 2B to FIG. 2D are cross-sectional views of a semiconductor device of one embodiment of the present invention.
Figure 2B:
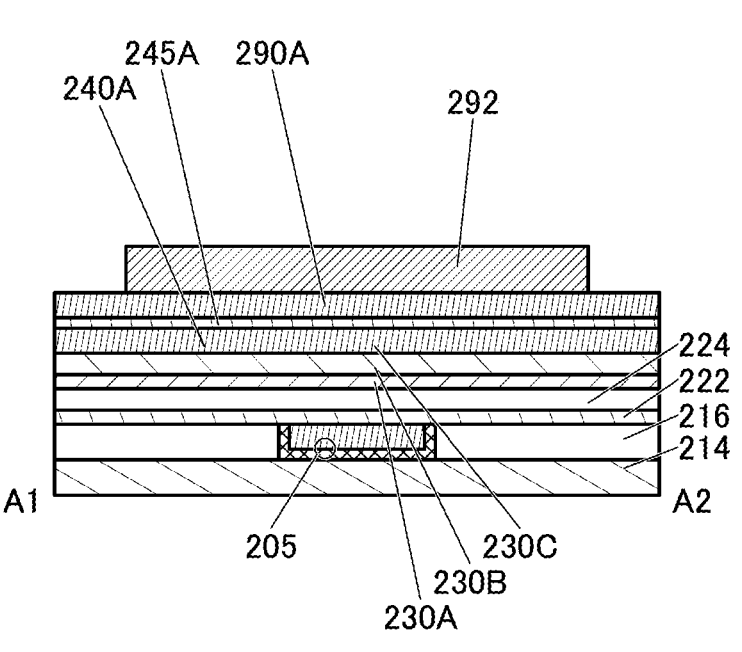
Figure 2D:
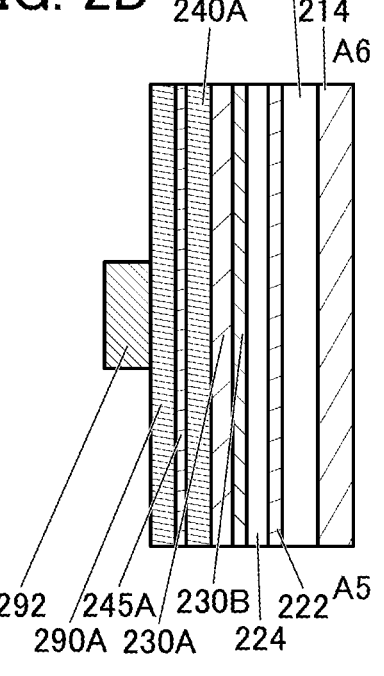
Figure 3A:
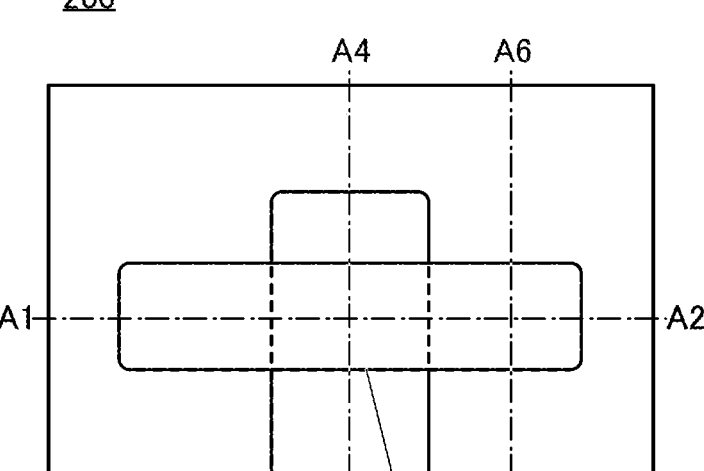
FIG. 3A is a top view of a semiconductor device of one embodiment of the present invention.
Figure 3C:
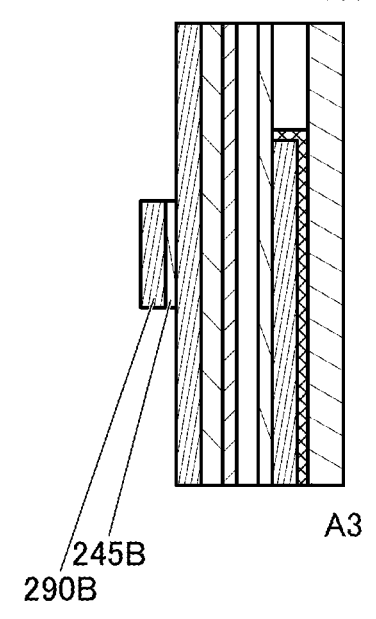
FIG. 3B to FIG. 3D are cross-sectional views of a semiconductor device of one embodiment of the present invention.
Figure 3B:
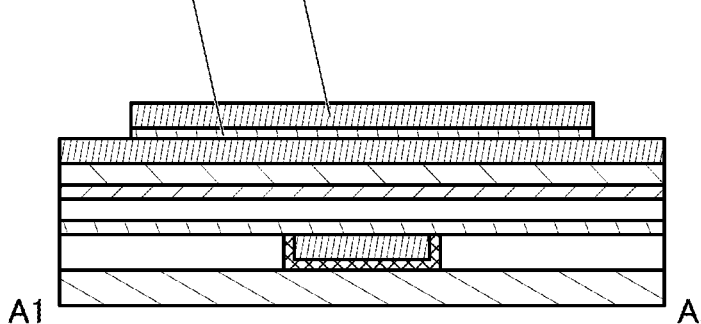
Figure 3D:
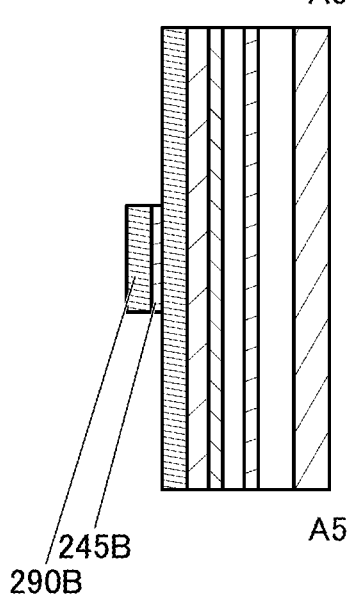
Figure 4A:
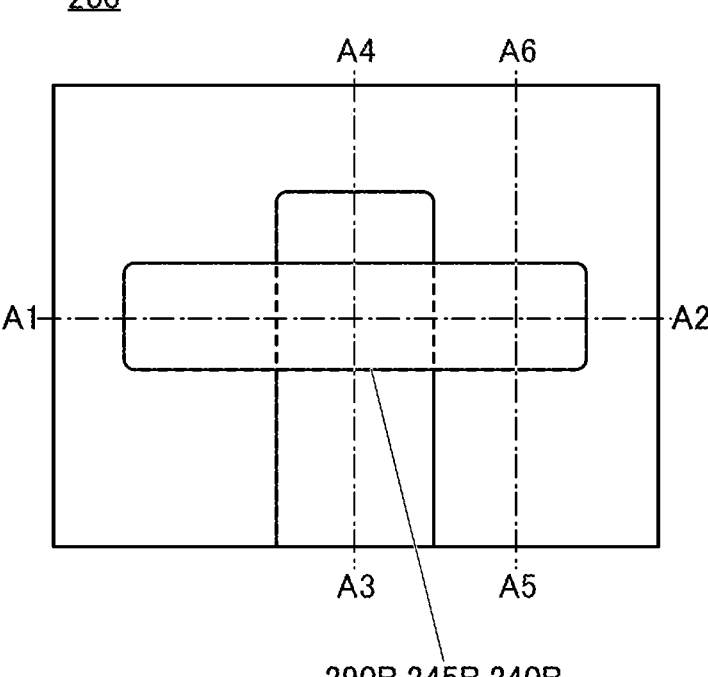
FIG. 4A is a top view of a semiconductor device of one embodiment of the present invention.
Figure 4C:
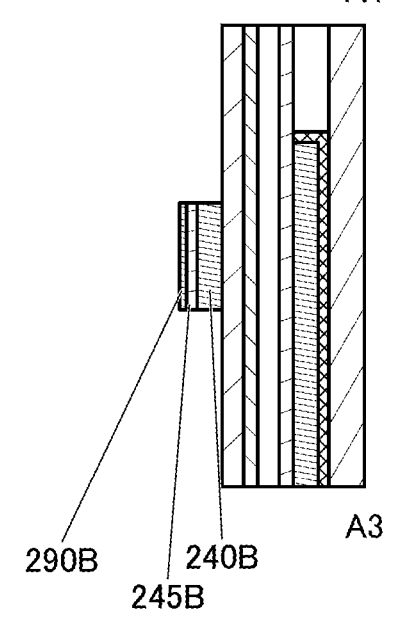
FIG. 4B to FIG. 4D are cross-sectional views of a semiconductor device of one embodiment of the present invention.
Figure 4B:
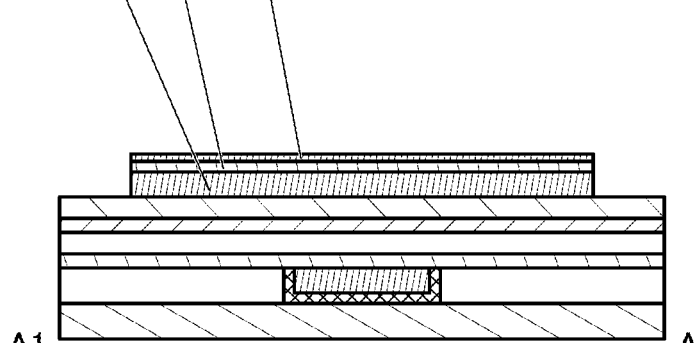
Figure 4D:
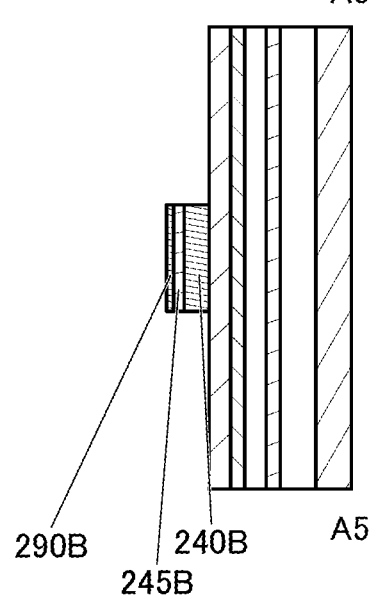
Figure 5A:
FIG. 5A is a top view of a semiconductor device of one embodiment of the present invention.
Figure 5A:
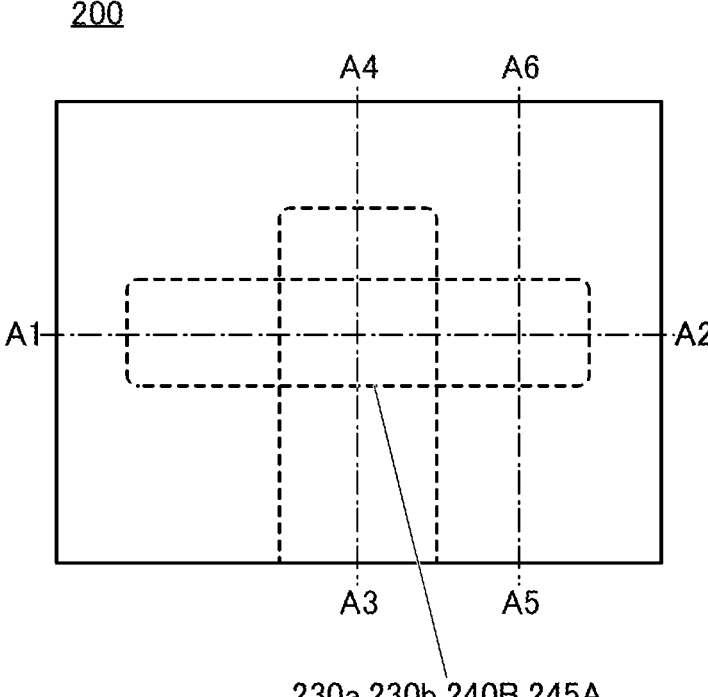
Figure 5C:
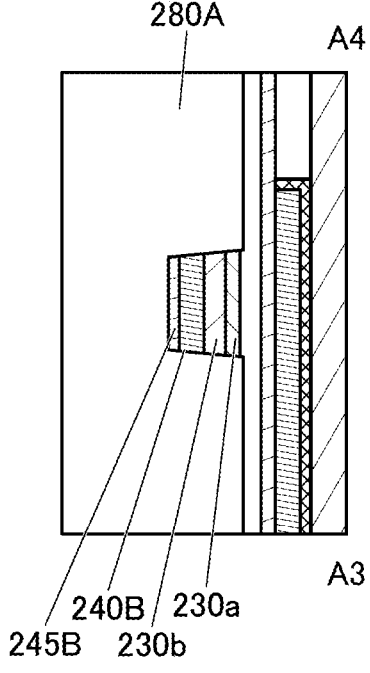
FIG. 5B to FIG. 5D are cross-sectional views of a semiconductor device of one embodiment of the present invention.
Figure 5B:
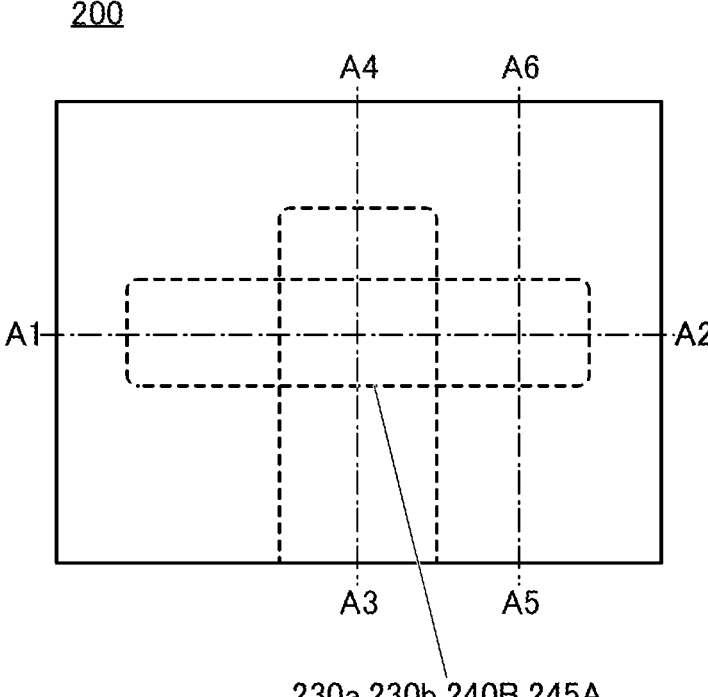
Figure 5D:
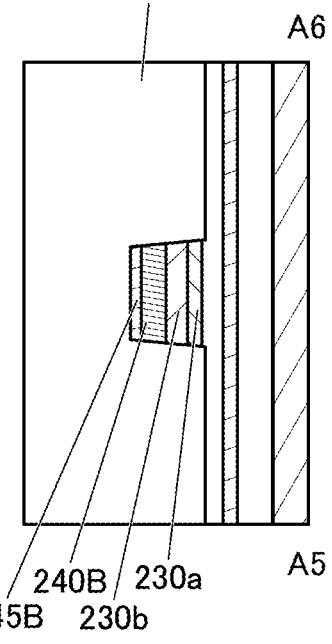
Figure 6A:
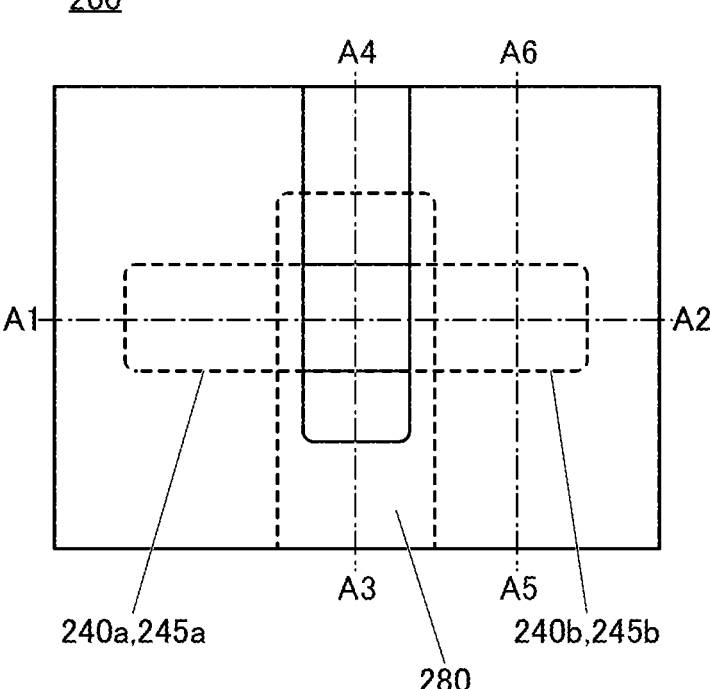
FIG. 6A is a top view of a semiconductor device of one embodiment of the present invention.
Figure 6C:
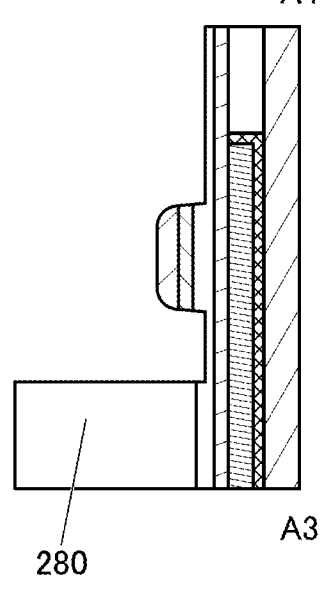
FIG. 6B to FIG. 6D are cross-sectional views of a semiconductor device of one embodiment of the present invention.
Figure 6B:
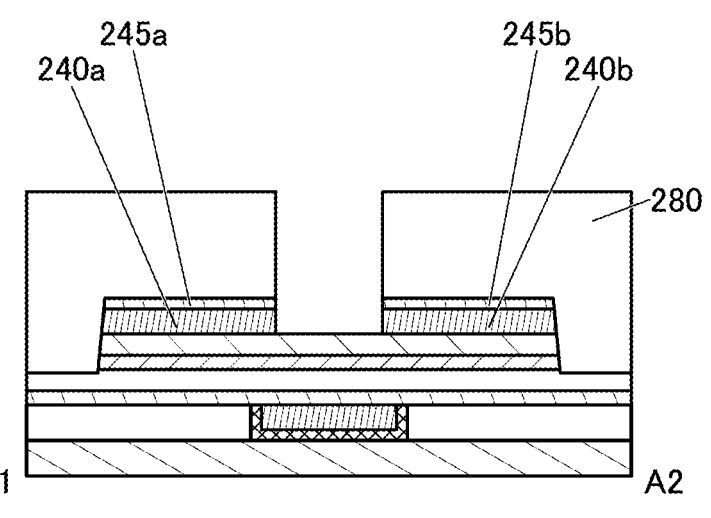
Figure 6D:
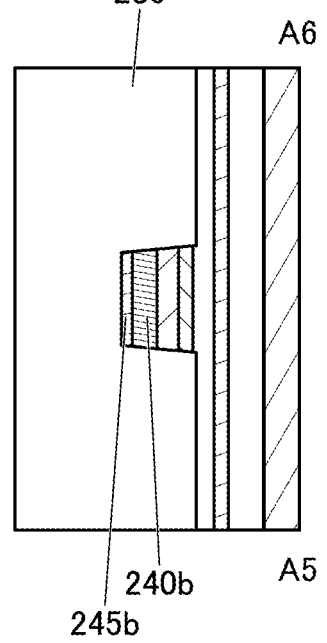
Figure 7A:
FIG. 7A is a top view of a semiconductor device of one embodiment of the present invention.
Figure 7A:
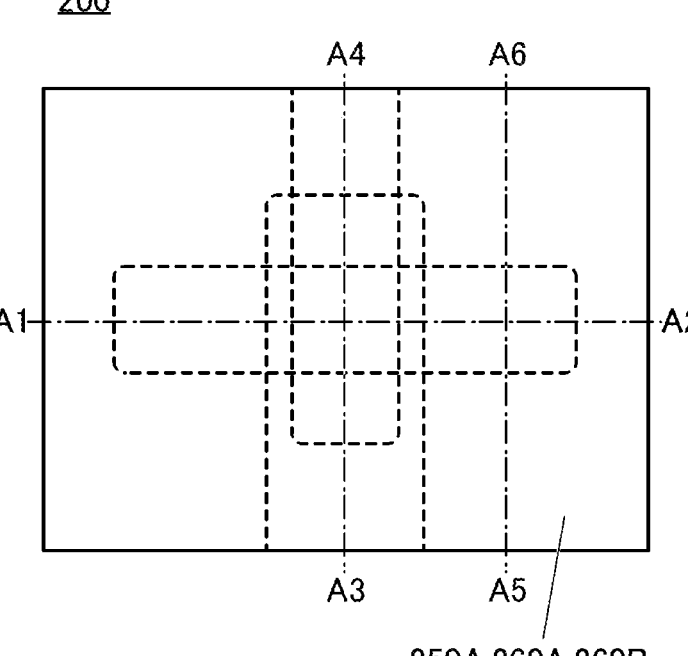
Figure 7C:
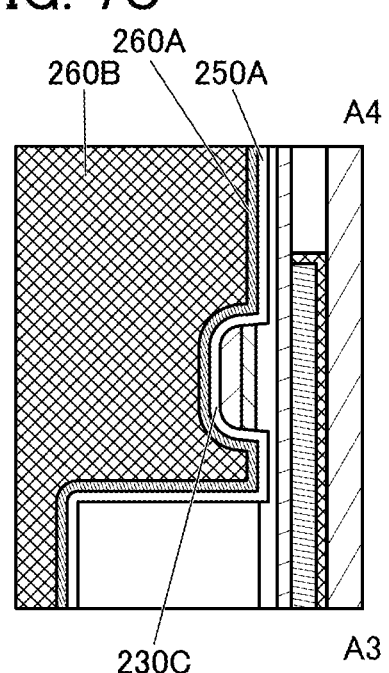
FIG. 7B to FIG. 7D are cross-sectional views of a semiconductor device of one embodiment of the present invention.
Figure 7B:
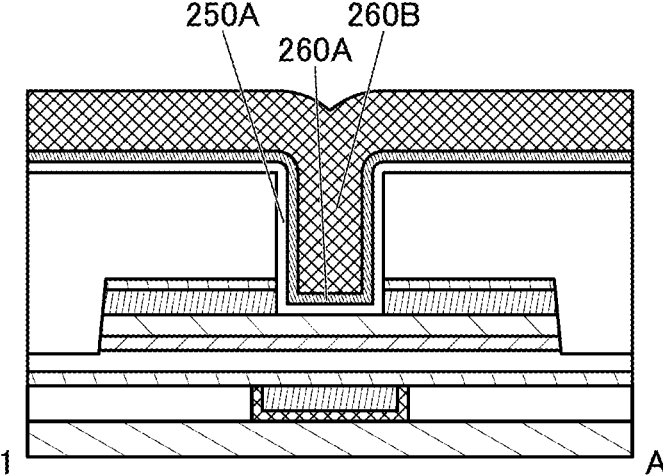
Figure 7D:
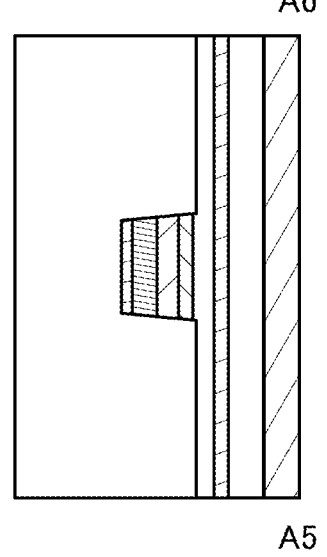
Figure 8A:
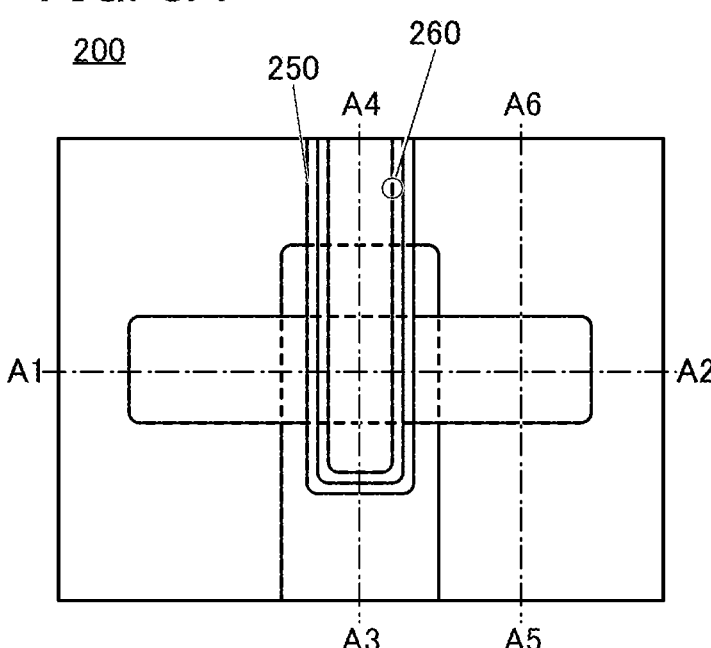
FIG. 8A is a top view of a semiconductor device of one embodiment of the present invention.
Figure 8C:
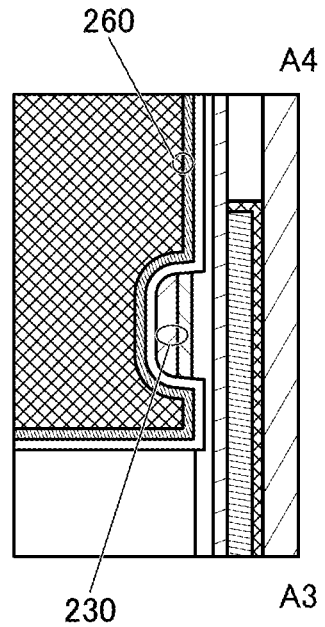
FIG. 8B to FIG. 8D are cross-sectional views of a semiconductor device of one embodiment of the present invention.
Figure 8B:
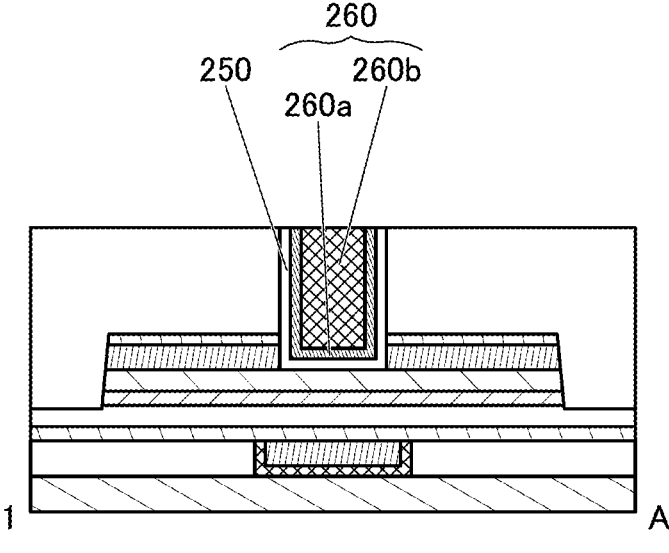
Figure 8D:
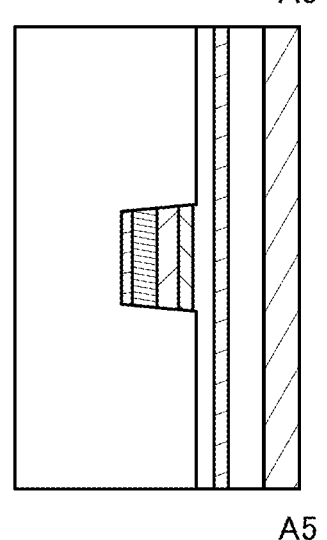

Embodiments will be described below with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. The same hatch pattern is used for the portions having similar functions, and the portions are not especially denoted by reference numerals in some cases.

Particularly in a top view (also referred to as a "plan view"), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "under", are used for convenience to describe the positional relation between components with reference to drawings. The positional relation between components is changed as appropriate in accordance with the direction from which each component is described. Thus, without limitation to terms described in this specification, the description can be changed appropriately depending on the situation.

For example, when this specification and the like explicitly state that X and Y are connected, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than that shown in the drawings or the text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which a current mainly flows.

Furthermore, functions of a source and a drain might be interchanged with each other when a transistor of opposite polarity is employed or when the direction of current is changed in circuit operation, for example. Therefore, the terms "source" and "drain" can sometimes be interchanged with each other in this specification and the like.

The channel length refers to, for example, a distance between a source (a source region or a source electrode) and a drain (a drain region or a drain electrode) in a region where a semiconductor (or a portion where a current flows in a semiconductor when a transistor is in the on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

The channel width refers to, for example, the length of a channel formation region in a direction perpendicular to a channel length direction in a region where a semiconductor (or a portion where a current flows in a semiconductor when a transistor is in the on state) and a gate electrode overlap with each other or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed on the side surface of the semiconductor is sometimes increased. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. Entry of an impurity may cause oxygen vacancies in an oxide semiconductor, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, "parallel" indicates a state where two straight lines are placed at an angle greater than or equal to −10° and less than or equal to 10°. Thus, the case where the angle is greater than or equal to −5° and less than or equal to 5° is also included. In addition, "substantially parallel" indicates a state where two straight lines are placed at an angle greater than or equal to −30° and less than or equal to 30°. In addition, "perpendicular" indicates a state where two straight lines are placed at an angle greater than or equal to 80° and less than or equal to 100°. Thus, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

An example of a semiconductor device including a transistor 200 of one embodiment of the present invention will be described in this embodiment. The transistor 200 of one embodiment of the present invention is a transistor including an oxide semiconductor in its channel formation region.

Here, an example of the semiconductor device including the transistor of one embodiment of the present invention will be described in detail below with reference to drawings.

<Structure Example of Semiconductor Device>

FIG. 1 is a top view and cross-sectional views of a semiconductor device including the transistor 200 of one embodiment of the present invention. FIG. 1A is a top view of the semiconductor device. FIG. 1B and FIG. 1C are cross-sectional views of the semiconductor device. Here, FIG. 1B is a cross-sectional view of a portion indicated by the dashed-dotted line A1-A2 in FIG. 1A. FIG. 1C is a cross-sectional view of a portion indicated by the dashed-dotted line A3-A4 in FIG. 1A. FIG. 1D is a cross-sectional view of a portion indicated by the dashed-dotted line A5-A6 in FIG. 1A. Note that for clarity of the drawing, some components are omitted in the top view of FIG. 1A.

The semiconductor device of one embodiment of the present invention includes the transistor 200, and an insulator 214, an insulator 216, an insulator 280, an insulator 282, and an insulator 284 that function as interlayer films. Note that the insulator 280 is provided to be in contact with at least an oxide 230.

[Transistor 200]

As illustrated in FIG. 1, the transistor 200 is positioned over a substrate (not illustrated) and includes a conductor 205 that is positioned to be embedded in the insulator 216, an insulator 222 positioned over the insulator 216 and the conductor 205, an insulator 224 positioned over the insulator 222, the oxide 230 (an oxide 230a and an oxide 230b) positioned over the insulator 224, an insulator 250 positioned over the oxide 230, a conductor 260 (a conductor 260a and a conductor 260b) positioned over the insulator 250, a conductor 240a and a conductor 240b in contact with part of the top surface of the oxide 230b, an insulator 245a over the conductor 240a, and an insulator 245b over the conductor 240b. Note that the conductor 240a and the conductor 240b are collectively referred to as a conductor 240 in some cases. Note that the insulator 245a and the insulator 245b are collectively referred to as an insulator 245 in some cases.

In the transistor 200, a metal oxide functioning as an oxide semiconductor (hereinafter also referred to as an oxide semiconductor) is preferably used for the oxide 230 (the oxide 230a and the oxide 230b), which includes a region where a channel is formed (hereinafter also referred to as a channel formation region).

As an oxide semiconductor, a metal oxide such as an In-M-Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used, for example. As the oxide semiconductor, an In—Ga—Zn oxide, an In—Ga oxide, or an In—Zn oxide may be used.

Note that the oxide semiconductor functioning as the channel formation region preferably has a band gap of preferably 2 eV or higher, further preferably 2.5 eV or higher. With the use of an oxide semiconductor having such a wide band gap, the off-state current of the transistor can be reduced.

The transistor 200 using an oxide semiconductor in the channel formation region has an extremely low leakage current in the off state; hence, a semiconductor device with low power consumption can be provided.

Furthermore, by using an oxide semiconductor, a variety of elements can be stacked and three-dimensionally integrated. In other words, an oxide semiconductor can be deposited by a sputtering method or the like; therefore, a three-dimensional integrated circuit (a 3D integrated circuit) in which a circuit is developed not only on a flat surface of a substrate but also in a perpendicular direction can be obtained.

On the other hand, the transistor including an oxide semiconductor easily has normally-on characteristics (the characteristics are that a channel exists without voltage application to a gate electrode and a current flows in a transistor) owing to impurities and oxygen vacancies in the oxide semiconductor that affect the electrical characteristics. Examples of the impurities in the oxide semiconductor that affect the electrical characteristics include hydrogen, nitrogen, alkali metal, alkaline earth metal, iron, nickel, and silicon.

Here, the influence of each impurity in the oxide semiconductor is described.

Entry of impurities into the oxide semiconductor forms defect states or oxygen vacancies in some cases. When impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

The above-described defect states may include a trap state. Charges trapped by the trap states in the metal oxide take a long time to be released and may behave like fixed charges. Thus, a transistor whose channel formation region includes a metal oxide having a high density of trap states has unstable electrical characteristics in some cases.

If impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor.

Specifically, the concentration of hydrogen, nitrogen, alkali metal, alkaline earth metal, iron, nickel, silicon, or the like, which serves as an impurity, obtained by SIMS (Secondary Ion Mass Spectrometry) is lower than or equal to $1 \times 10^{20}$ atoms/cm$^3$, preferably lower than or equal to $2 \times 10^{19}$ atoms/cm$^3$ in and around the channel formation region of the oxide semiconductor.

Alternatively, the concentration of the impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

Therefore, it is preferable to use, as the oxide semiconductor used for the channel formation region of the transistor, a highly purified intrinsic oxide semiconductor in which impurities and oxygen vacancies are reduced. In this specification and the like, a state with a low impurity concentration and a low density of defect states is referred to as a highly purified intrinsic or substantially highly purified intrinsic state.

Even when a highly purified intrinsic or substantially highly purified intrinsic oxide semiconductor is deposited, an impurity is sometimes diffused into the oxide semiconductor from a component in contact with the oxide semiconductor or from the outside of the component.

In particular, hydrogen is sometimes added when an insulator that is formed to be in contact with the oxide semiconductor and functions as a gate insulator or an insulator functioning as an interlayer film is deposited.

Specifically, for the gate insulator or the interlayer film, silicon oxide, silicon oxynitride, silicon nitride oxide, silicon nitride, silicon oxide to which fluorine is added, silicon oxide to which carbon is added, silicon oxide to which carbon and nitrogen are added, porous silicon, or the like oxide can be used. In particular, silicon oxide and silicon oxynitride are preferable because they are thermally stable.

Meanwhile, to deposit silicon oxide or silicon oxynitride by a chemical vapor deposition (CVD) method, a deposition gas containing hydrogen, for example, a silane (SiH$_4$)-based deposition gas such as monosilane (SiH$_4$), tetraethoxysilane ([Si(OC$_2$H$_5$)$_4$], TEOS), or trimethoxysilane ([Si(OCH$_3$)$_3$H], TMS) is used in some cases.

Furthermore, an organosilane gas may be used. For example, as the organosilane gas, a silicon-containing compound such as tetramethylsilane (TMS: chemical formula Si(CH$_3$)$_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), or tri sdimethylaminosilane (SiH(N(CH$_3$)$_2$)$_3$) is used, as well as tetraethoxysilane (TEOS: chemical formula Si(OC$_2$H$_5$)$_4$) described above.

When an insulator is deposited using a deposition gas containing hydrogen, it is highly probable that hydrogen contained in the deposition gas is diffused into an oxide semiconductor exposed on the surface where the insulator is deposited.

Among impurities, hydrogen, which has a small atomic radius, has a property of easily transferring (i.e., a strong tendency to diffuse) in an insulating layer or a conductive layer.

In the case where a conductor is provided in contact with a metal oxide, when hydrogen reaches the structure (the stacked-layer structure of the metal oxide and the conductor), film lifting and film separation (also referred to as peeling) are highly likely to occur between the metal oxide and the conductor.

In other words, in the case where an insulating metal oxide is provided between an oxide semiconductor that is a metal oxide and a conductor or is provided as part of a component of a transistor to be in contact with a conductor, hydrogen diffused in the oxide semiconductor may reach the interface between the metal oxide and the conductor, and film lifting and film separation occur in some cases.

Specifically, in the semiconductor device including the transistor 200 illustrated in FIG. 1, film lifting or film separation tends to occur at the surface where the oxide 230*b* and the conductor 240 are in contact with each other or the surface where the conductor 240 and the insulator 245 are in contact with each other.

In view of the above, in this embodiment, in the case of using a deposition gas containing hydrogen in a chemical vapor deposition method to deposit a component forming a semiconductor, a deposition condition where a constant Y satisfying the following formula is $0<Y\leq8.0$, preferably $0<Y\leq7.0$ is employed. Note that the constant Y can be expressed using a deposition power PW [W], an effective electrode area S [cm$^2$], a deposition pressure P [Pa], and a flow rate/[sccm] of a deposition gas containing hydrogen.

[Formula 3]

$$Y = \frac{(PW[W]/S[\text{cm}^2]) \times P[Pa]}{f[sccm]} \quad (3)$$

By the deposition using the deposition condition where the constant Y is $0 < Y \leq 8.0$, preferably $0 < Y \leq 7.0$, hydrogen in a deposition atmosphere can be prevented from diffusing into a component on which the deposition is performed from the deposition surface that is exposed to the deposition gas. In other words, by optimizing the deposition power PW, the pressure P, and the flow rate f, an insulator can be deposited without diffusion of hydrogen contained in the deposition gas into the component under the insulator.

When the insulator deposited using the deposition condition where the constant Y is $0 < Y \leq 8.0$, preferably $0 < Y \leq 7.0$ is provided close to the metal oxide, film lifting and film separation (also referred to as peeling) that would occur between the metal oxide and the conductor can be inhibited. Specifically, in the semiconductor device including the transistor 200 illustrated in FIG. 1, it is possible to prevent film lifting or film separation that would occur at the surface where the oxide 230b and the conductor 240 are in contact with each other or the surface where the conductor 240 and the insulator 245 are in contact with each other.

The detailed structure of the transistor will be described below.

The oxide 230 preferably has a stacked-layer structure of a plurality of oxide layers with different chemical compositions. Specifically, the atomic ratio of an element M to In in the metal oxide used as the oxide 230a is preferably higher than the atomic ratio of the element M to In in the metal oxide used as the oxide 230b.

Although the oxide 230 in the transistor 200 illustrated in FIG. 1 has a structure in which two layers of the oxide 230a and the oxide 230b are stacked, the present invention is not limited thereto. For example, a single layer of the oxide 230b or a stacked-layer structure of three or more layers may be provided. Each of the oxide 230a and the oxide 230b may have a stacked-layer structure.

It is preferable that at least a side surface of the oxide 230b and a side surface of the conductor 240 be substantially perpendicular to the surface where the insulator 224 and the oxide 230a are in contact with each other, as illustrated in FIG. 1D. Specifically, in FIG. 1D, the side surface of the oxide 230b and the side surface of the conductor 240 preferably form an angle greater than or equal to 60° and less than or equal to 95°, further preferably greater than or equal to 88° and less than or equal to 92°, with respect to the surface where the insulator 224 and the oxide 230a are in contact with each other.

As illustrated in FIG. 1C, an upper end portion of the oxide 230 in the channel formation region preferably has a shape with curvature. That is, in the channel formation region, the top surface and the side surface of the oxide 230 are preferably smoothly connected with a curved surface without a corner. Since there is no corner in the channel formation region, electric field concentration due to electric fields of one or both of the conductor 260 functioning as a first gate electrode and the conductor 205 functioning as a second gate electrode does not occur, so that deterioration of the oxide 230 can be inhibited.

On the other hand, as illustrated in FIG. 1D, the upper end portions of the oxide 230 in a region overlapping with the conductor 240 preferably have a smaller curvature than the upper end portions of the oxide 230 in the channel formation region. The above structure can be formed by processing the oxide 230b and the conductor 240 with the same mask. Accordingly, the conductor 240 overlaps with the projected area of the oxide 230b, so that a minute transistor can be formed.

The conductor 260 functions as a first gate electrode (also referred to as a top gate).

Here, an end portion of the conductor 240a and an end portion of the conductor 240b are preferably on the same plane as side surfaces of an opening portion. Moreover, as shown in FIG. 1B or FIG. 1C, the top surface of the conductor 260 is substantially aligned with the top surface of the insulator 250 and the top surface of an oxide 230c.

In a region where the conductor 260 does not overlap with the oxide 230, the shortest distance from the surface where the conductor 260 is in contact with the insulator 250 to the top surface of the insulator 222 is preferably shorter than the shortest distance from the surface where the oxide 230b is in contact with the oxide 230a to the top surface of the insulator 222, as illustrated in FIG. 1C. That is, in the channel width direction of the transistor 200, the side surface of the oxide 230b is covered with the conductor 260 with at least the insulator 250 therebetween.

When the conductor 260 functioning as the gate electrode covers the side surface and the top surface of the channel formation region of the oxide 230b with the insulator 250 and the like therebetween, the electric field of the conductor 260 affects the entire channel formation region of the oxide 230b. Thus, the on-state current of the transistor 200 can be increased, and the frequency characteristics can be improved.

Note that the conductor 260 preferably includes the conductor 260a and the conductor 260b positioned over the conductor 260a. For example, the conductor 260a is preferably positioned so as to cover the bottom surface and the side surface of the conductor 260b.

The conductor 260a is preferably formed using a conductive material that has a function of inhibiting diffusion of impurities such as hydrogen atoms, hydrogen molecules, water molecules, nitrogen atoms, nitrogen molecules, nitrogen oxide molecules, and copper atoms. Alternatively, it is preferable to use a conductive material that has a function of inhibiting diffusion of oxygen (e.g., at least one of oxygen atoms and oxygen molecules).

When the conductor 260a has a function of inhibiting diffusion of oxygen, the conductivity of the conductor 260b can be prevented from being lowered because of oxidation of the conductor 260b due to oxygen in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of titanium or titanium nitride and the conductive material may be employed.

Although the conductor 260 has a two-layer structure of the conductor 260a and the conductor 260b in FIG. 1, the conductor 260 may have a single-layer structure or a stacked-layer structure of three or more layers.

The conductor 205 functions as a second gate (also referred to as bottom gate) electrode.

When the conductor 205 functions as a gate electrode, by changing a potential applied to the conductor 205 not in conjunction with but independently of a potential applied to the conductor 260, the threshold voltage (Vth) of the transistor 200 can be adjusted. In particular, Vth of the transistor 200 can be higher in the case where a negative potential is applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is provided to overlap with the oxide 230 and the conductor 260. Furthermore, the conductor 205 is preferably provided to be embedded in the insulator 216 or the insulator 214.

Note that in the channel width direction, the conductor 205 is preferably provided larger than the channel formation region of the oxide 230. As illustrated in FIG. 1C, it is particularly preferable that the conductor 205 extend to intersect the channel width direction of the oxide 230.

That is, the conductor 205 and the conductor 260 preferably overlap with each other with the insulators therebetween on an outer side of the side surface of the oxide 230 in the channel width direction. With this structure, the channel formation region of the oxide 230 can be electrically surrounded by the electric field of the conductor 260 functioning as the first gate electrode and the electric field of the conductor 205 functioning as the second gate electrode.

Although the conductor 205 has a structure in which a first conductor and a second conductor are stacked in FIG. 1, the present invention is not limited thereto. For example, the conductor 205 may have a single-layer structure or a stacked-layer structure of three or more layers. In the case where a component has a stacked-layer structure, the layers may be distinguished by ordinal numbers corresponding to the formation order.

Here, for the first conductor of the conductor 205, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material that has a function of inhibiting diffusion of oxygen (e.g., at least one of oxygen atoms and oxygen molecules).

When a conductive material having a function of inhibiting diffusion of oxygen is used for the first conductor of the conductor 205, a reduction in the conductivity of the second conductor of the conductor 205 due to oxidation can be inhibited. As a conductive material having a function of inhibiting diffusion of oxygen, for example, tantalum, tantalum nitride, ruthenium, or ruthenium oxide is preferably used. Accordingly, the first conductor of the conductor 205 is a single layer or stacked layers of the above conductive materials. For example, the first conductor of the conductor 205 may be a stack of tantalum, tantalum nitride, ruthenium, or ruthenium oxide and titanium or titanium nitride.

A conductive material containing tungsten, copper, or aluminum as its main component is preferably used for the second conductor of the conductor 205. Note that the second conductor of the conductor 205 is illustrated as a single layer but may have a stacked-layer structure; for example, a stack of titanium or titanium nitride and the above conductive material may be employed.

Furthermore, as illustrated in FIG. 1C, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

The conductor 240 (the conductor 240a and the conductor 240b) functions as a source electrode or a drain electrode.

Specifically, TaNxOy is preferably used as the conductor 240. Note that TaNxOy may contain aluminum. As another example, titanium nitride, a nitride containing titanium and aluminum, ruthenium oxide, ruthenium nitride, an oxide containing strontium and ruthenium, or an oxide containing lanthanum and nickel may be used. These materials are preferable because they are a conductive material that is not easily oxidized or a material that maintains the conductivity even when absorbing oxygen.

The insulator 245 functioning as a barrier layer is preferably provided over the conductor 240.

The insulator 245 is preferably in contact with the top surface of the conductor 240 as illustrated in FIG. 1B. This structure can inhibit the conductor 240 from absorbing excess oxygen included in the insulator 280. Furthermore, by inhibiting oxidation of the conductor 240, an increase in the contact resistance between the transistor 200 and a wiring can be inhibited. Consequently, the transistor 200 can have favorable electrical characteristics and reliability.

Thus, the insulator 245 preferably has a function of inhibiting diffusion of oxygen. For example, the insulator 245 preferably has a function of inhibiting oxygen diffusion more than the insulator 280.

An insulator containing an oxide of one or both of aluminum and hafnium is preferably deposited as the insulator 245, for example. An insulator containing aluminum nitride may be used as the insulator 245, for example.

The insulator 250 functions as a first gate insulator.

The insulator 250 is provided in contact with at least the oxide 230. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride are preferable because they are thermally stable.

For the insulator 250, an oxide material from which oxygen is released by heating is preferably used. An oxide from which oxygen is released by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

When an insulator from which oxygen is released by heating is provided as the insulator 250 in contact with the oxide 230, oxygen can be effectively supplied to the channel formation region of the oxide 230b and oxygen vacancies in the channel formation region of the oxide 230b can be reduced. Thus, a transistor that has stable electrical characteristics with small variation in electrical characteristics and improved reliability can be provided. Furthermore, the concentration of impurities such as water and hydrogen in the insulator 250 is preferably reduced.

A metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

Note that the metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, an insulator containing an oxide of one or both of aluminum and hafnium is preferably used.

The metal oxide may have a function of part of the first gate electrode. For example, an oxide semiconductor that can be used for the oxide 230 can be used as the metal oxide. In that case, when the conductor 260 is deposited by a sputtering method, the metal oxide can have a reduced electric resistance to be a conductor.

With the metal oxide, the on-state current of the transistor 200 can be increased without a reduction in the influence of the electric field from the conductor 260. Since a distance between the conductor 260 and the oxide 230 is kept by the physical thicknesses of the insulator 250 and the metal oxide, a leakage current between the conductor 260 and the oxide 230 can be inhibited. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The insulator 222 and the insulator 224 function as a second gate insulator.

The insulator 222 preferably has a function of inhibiting diffusion of hydrogen (e.g., at least one of a hydrogen atom, a hydrogen molecule, and the like). Moreover, the insulator 222 preferably has a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

For the insulator 222, an insulator containing an oxide of one or both of aluminum and hafnium, which is an insulating material, is preferably used. As the insulator, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 222.

For example, a single layer or stacked layers of an insulator containing what is called a high-k material, such as aluminum oxide, hafnium oxide, tantalum oxide, zirconium oxide, lead zirconate titanate (PZT), strontium titanate (Sr-$TiO_3$), or $(Ba,Sr)TiO_3$ (BST) may be used for the insulator 222. With miniaturization and high integration of transistors, a problem such as a leakage current might arise because of a thinner gate insulator. When a high-k material is used for the insulator functioning as a gate insulator, a gate potential during operation of the transistor can be lowered while the physical thickness of the gate insulator is maintained.

It is preferable that the insulator 224 in contact with the oxide 230 release oxygen by heating, like the insulator 250. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

Note that the insulator 222 and the insulator 224 may each have a stacked-layer structure of two or more layers. In such cases, without limitation to a stacked-layer structure formed of the same material, a stacked-layer structure formed of different materials may be employed.

The insulator 214, the insulator 216, the insulator 280, the insulator 282, and the insulator 284 function as interlayer films.

The insulator 214 preferably functions as an insulating barrier film that inhibits diffusion of impurities such as water and hydrogen from the substrate side into the transistor 200. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use an insulating material having a function of inhibiting diffusion of oxygen (e.g., at least one of an oxygen atom, an oxygen molecule, and the like).

For example, aluminum oxide, silicon nitride, or the like is preferably used for the insulator 214. Accordingly, impurities such as water and hydrogen can be inhibited from being diffused to the transistor 200 side from the substrate side through the insulator 214. Alternatively, oxygen contained in the insulator 224 and the like can be inhibited from being diffused to the substrate side through the insulator 214. Note that the insulator 214 may have a stacked-layer structure of two or more layers. In that case, without limitation to a stacked-layer structure formed of the same material, a stacked-layer structure formed of different materials may be employed. For example, a stack of aluminum oxide and silicon nitride may be employed.

Furthermore, silicon nitride deposited by a sputtering method is preferably used for the insulator 214, for example. Accordingly, the hydrogen concentration in the insulator 214 can be low, and impurities such as water and hydrogen can be further inhibited from being diffused to the transistor 200 side from the substrate side through the insulator 214.

The permittivity of the insulator 216 functioning as an interlayer film is preferably lower than the permittivity of the insulator 214. When a material with a low permittivity is used for the interlayer film, the parasitic capacitance generated between wirings can be reduced. For the insulator 216, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 216 preferably includes a region that has a low hydrogen concentration and contains oxygen in excess of that in the stoichiometric composition (hereinafter also referred to as an excess-oxygen region), or preferably contains oxygen that is released by heating (hereinafter also referred to as excess oxygen). For example, silicon oxide deposited by a sputtering method is preferably used for the insulator 216. Thus, entry of hydrogen into the oxide 230 can be inhibited; alternatively, oxygen can be supplied to the oxide 230 to reduce oxygen vacancies in the oxide 230. Thus, a transistor that has stable electrical characteristics with small variation in electrical characteristics and improved reliability can be provided.

Note that the insulator 216 may have a stacked-layer structure. For example, in the insulator 216, an insulator similar to the insulator 214 may be provided at least in a portion in contact with a side surface of the conductor 205. With such a structure, oxidation of the conductor 205 due to oxygen contained in the insulator 216 can be inhibited. Alternatively, a reduction in the amount of oxygen contained in the insulator 216 due to the conductor 205 can be inhibited.

The insulator 280 is provided over the insulator 224, the oxide 230, and the conductor 240. The top surface of the insulator 280 may be planarized.

The insulator 280 functioning as an interlayer film preferably has a low permittivity. When a material with a low permittivity is used for the interlayer film, the parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen released by heating can be easily formed.

The concentration of impurities such as water and hydrogen in the insulator 280 is preferably reduced. Moreover, the insulator 280 preferably has a low hydrogen concentration and includes an excess-oxygen region or excess oxygen, and may be provided using a material similar to that for the insulator 216, for example. Note that the insulator 280 may have a stacked-layer structure of two or more layers.

Like the insulator 214 and the like, the insulator 282 preferably functions as an insulating barrier film that inhibits diffusion of impurities such as water and hydrogen into the insulator 280 from above. In addition, like the insulator 214 and the like, the insulator 282 preferably has a low hydrogen concentration and has a function of inhibiting diffusion of hydrogen.

As illustrated in FIG. 1B, the insulator 282 is preferably in contact with the top surfaces of the conductor 260 and the insulator 250. This can inhibit entry of impurities such as hydrogen contained in the insulator 284 and the like into the insulator 250. Thus, adverse effects on the electrical characteristics of the transistor and the reliability of the transistor can be inhibited.

The insulator 284 functioning as an interlayer film is preferably provided over the insulator 282. Like the insulator 216 and the like, the insulator 284 preferably has a low permittivity. As in the insulator 224 and the like, the concentration of impurities such as water and hydrogen in the insulator 284 is preferably reduced.

<Constituent Materials of Semiconductor Device>

Constituent materials that can be used for the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate containing a metal nitride and a substrate containing a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of the transistor progress, for example, a problem such as leakage current may arise because of a thinner gate insulator. When a high-k material is used for the insulator functioning as the gate insulator, voltage during operation of the transistor can be lowered while the physical thickness of the gate insulator is maintained. In contrast, when a material with a low dielectric constant is used for the insulator functioning as an interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of oxygen and impurities such as hydrogen (e.g., the insulator 214, the insulator 222, the insulator 245, the insulator 282, and the like), the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a semiconductor having high electric conductivity, typified by polycrystalline silicon containing an impurity element such as phosphorus, or silicide such as nickel silicide may be used.

A stack including a plurality of conductive layers formed of the above materials may be used. For example, a stacked-layer structure in which a material containing the above metal element and a conductive material containing oxygen are combined may be employed. Alternatively, a stacked-layer structure in which a material containing the above metal element and a conductive material containing nitrogen are combined may be employed. Alternatively, a stacked-layer structure in which a material containing the above metal element, a conductive material containing oxygen, and a conductive material containing nitrogen are combined may be employed.

Note that when an oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Hydrogen entering from an external insulator or the like can be captured in some cases.

<<Metal Oxide>>

As the oxide 230, a metal oxide functioning as an oxide semiconductor is preferably used. A metal oxide that can be used as the oxide 230 of the present invention will be described below.

The metal oxide preferably contains at least indium or zinc. In particular, indium and zinc are preferably contained. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where a plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear grain boundary even in the vicinity of distortion in the CAAC-OS. That is, formation of a grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear grain boundary is difficult to observe in the CAAC-OS; thus, it can be said that a reduction in electron mobility due to the grain boundary is unlikely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure might be obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Method for Manufacturing Semiconductor Device>

Next, a method of manufacturing the semiconductor device including the transistor 200 of one embodiment of the present invention, which is illustrated in FIG. 1, will be described with FIG. 2 to FIG. 8.

In FIG. 2 to FIG. 8, A of each drawing is a top view. Moreover, B of each drawing is a cross-sectional view corresponding to a portion indicated by the dashed-dotted line A1-A2 in A, and is also a cross-sectional view of the transistor 200 in the channel length direction. Furthermore, C of each drawing is a cross-sectional view corresponding to a portion indicated by the dashed-dotted line A3-A4 in A, and is also a cross-sectional view of the transistor 200 in the channel width direction. Moreover, D of each drawing is a cross-sectional view corresponding to a portion indicated by the dashed-dotted line A5-A6 in A of the drawing, and is also a cross-sectional view of the transistor 200 in the channel width direction. For clarity of the drawing, some components are not illustrated in the top view of A of each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that the CVD method can be classified into a plasma enhanced CVD (PECVD) method utilizing plasma, a thermal CVD (TCVD) method utilizing heat, a photo CVD method utilizing light, and the like. Moreover, the CVD method can be classified into a metal CVD (MCVD) method and a metal organic CVD (MOCVD) method depending on a source gas to be used.

A plasma CVD method enables a high-quality film to be obtained at a comparatively low temperature. A thermal CVD method is a deposition method that does not use plasma and thus causes less plasma damage to an object to be processed. For example, a wiring, an electrode, an element (a transistor, a capacitor, or the like), or the like included in a semiconductor device might be charged up by receiving charge from plasma. In that case, accumulated charge might break the wiring, the electrode, the element, or the like included in the semiconductor device. In contrast, in the case of a thermal CVD method not using plasma, such plasma damage is not caused and the yield of the semiconductor device can be increased. Furthermore, a film with few defects can be obtained by a thermal CVD method because plasma damage during deposition is not caused.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. Furthermore, the ALD method includes a PEALD (plasma enhanced ALD) method using plasma. The use of plasma is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object to be processed. Thus, the CVD method and the ALD method are deposition methods that enable good step coverage almost regardless of the shape of an object to be processed. In particular, the ALD method enables excellent step coverage and excellent thickness uniformity and thus is suitably used to cover a surface of an opening portion with a high aspect ratio, for example. Meanwhile, the ALD method has a comparatively low deposition rate, and thus is preferably used in combination with another deposition method with a high deposition rate, such as the CVD method, in some cases.

The CVD method and the ALD method enable control of the composition of a film to be obtained with the flow rate ratio of source gases. For example, by the CVD method and the ALD method, a film with a certain composition can be deposited depending on the flow rate ratio of the source gases. Moreover, for example, by the CVD method and the ALD method, a film whose composition is continuously changed can be deposited by changing the flow rate ratio of the source gases during deposition. In the case where the film is formed while the flow rate ratio of the source gases is changed, as compared with the case where the film is formed using a plurality of deposition chambers, the time taken for the deposition can be shortened because the time taken for transfer and pressure adjustment is not required. Thus, the productivity of the semiconductor device can be increased in some cases.

In this embodiment, for the insulator 214, aluminum oxide is deposited by a sputtering method. In addition, the insulator 214 may have a multilayer structure.

Next, the insulator 216 is deposited over the insulator 214. The insulator 216 can be deposited by a sputtering method, a CVD method, an MBE method, a PLD method, an ALD method, or the like. In this embodiment, for the insulating film to be the insulator 216, silicon oxynitride is deposited by a CVD method.

Then, an opening reaching the insulator 214 is formed in the insulator 216. Examples of the opening include a groove and a slit. A region where an opening is formed is referred to as an opening portion in some cases. Wet etching may be used for the formation of the opening; however, dry etching is preferably used for microfabrication. As the insulator 214, it is preferable to select an insulator that functions as an etching stopper film used in forming the groove by etching the insulator 216. For example, in the case where silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. A dry etching apparatus including a high-density plasma source can be used. As the dry etching apparatus including a high-density plasma source, an inductively coupled plasma (ICP) etching apparatus can be used, for example.

After the formation of the opening, a conductive film to be the first conductor of the conductor 205 is deposited. The conductive film preferably includes a conductor that has a function of inhibiting passage of oxygen. For example, tantalum nitride, tungsten nitride, or titanium nitride can be used. Alternatively, stacked-layer films of the conductor having a function of inhibiting passage of oxygen and tantalum, tungsten, titanium, molybdenum, aluminum, copper, or a molybdenum-tungsten alloy can be used. The conductive film can be formed by a sputtering method, a CVD method, an MBE method, a PLD method, an ALD method, or the like.

In this embodiment, as the conductive film to be the first conductor of the conductor 205, a tantalum nitride film or a film in which titanium nitride is stacked over tantalum nitride is deposited by a sputtering method. With the use of such a metal nitride for the first conductor of the conductor 205, even when a metal that easily diffuses, such as copper, is used for the second conductor of the conductor 205 described later, the metal can be prevented from diffusing outward through the first conductor of the conductor 205.

Next, a conductive film to be the second conductor of the conductor 205 is deposited over the conductive film to be the first conductor of the conductor 205. The conductive film can be deposited by a plating method, a sputtering method, a CVD method, an MBE method, a PLD method, an ALD method, or the like. In this embodiment, tungsten is deposited for the conductive film.

Subsequently, CMP (Chemical Mechanical Polishing) treatment is performed to partly remove the conductive film to be the first conductor of the conductor 205 and the conductive film to be the second conductor of the conductor 205 to expose the insulator 216. As a result, the conductive film to be the first conductor of the conductor 205 and the conductive film to be the second conductor of the conductor 205 remain only in the opening portion. Thus, the conductor 205 that has a flat top surface and includes the first conductor of the conductor 205 and the second conductor of the conductor 205 can be formed (see FIG. 2).

Note that after the conductor 205 is formed, a groove may be formed in the second conductor of the conductor 205 by removal of part of the second conductor of the conductor 205, a conductive film may be deposited over the conductor 205 and the insulator 216 so as to fill the groove, and then CMP treatment may be performed. By the CMP treatment, part of the conductive film is removed to expose the insulator 216. Note that part of the second conductor of the conductor 205 is preferably removed by a dry etching method or the like.

Through the above steps, the conductor 205 that has a flat top surface and includes the conductive films can be formed. The improvement in planarity of the top surfaces of the insulator 216 and the conductor 205 can improve crystallinity of the oxide 230. Note that the conductive film is preferably formed using a material similar to that for the first conductor of the conductor 205 or the second conductor of the conductor 205.

A method for forming the conductor 205 that is different from the above will be described below.

A conductive film to be the conductor 205 is deposited over the insulator 214. The conductive film to be the conductor 205 can be deposited by a sputtering method, a CVD method, an MBE method, a PLD method, an ALD method, or the like. The conductive film to be the conductor 205 can be a multilayer film. For example, tungsten is deposited as the conductive film to be the conductor 205.

Next, the conductive film to be the conductor 205 is processed by a lithography method, so that the conductor 205 is formed.

Note that in the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed, for example, by exposing the resist to KrF excimer laser light, ArF excimer laser light, or EUV (Extreme Ultraviolet) light. A liquid immersion technique may be employed in which a gap between a substrate and a projection lens is filled with a liquid (e.g., water) to perform light exposure. An electron beam or an ion beam may be used instead of the above-mentioned light. Note that a mask is unnecessary in the case of using an electron beam or an ion beam. Note that the resist mask can be removed by dry etching process such as ashing, wet etching process, dry etching process followed by wet etching process, or wet etching process followed by dry etching process.

A hard mask formed of an insulator or a conductor may be used instead of the resist mask. In the case of using a hard mask, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removing the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect subsequent steps or can be utilized in subsequent steps.

Next, an insulating film to be the insulator 216 is formed over the insulator 214 and the conductor 205. The insulating film is formed to be in contact with the top surface and the side surface of the conductor 205. The insulating film can be deposited by a sputtering method, a CVD method, an MBE method, a PLD method, an ALD method, or the like.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3.

Then, CMP treatment is performed on the insulating film to be the insulator 216, so that part of the insulating film to be the insulator 216 is removed and the surface of the conductor 205 is exposed. Thus, the conductor 205 and the insulator 216 whose top surfaces are flat can be formed. The above is the different method for forming the conductor 205.

Next, the insulator 222 is deposited over the insulator 216 and the conductor 205. The insulator 222 can be deposited by a sputtering method, a CVD method, an MBE method, a PLD method, an ALD method, or the like. In this embodiment, hafnium oxide or aluminum oxide is deposited as the insulator 222 by an ALD method.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment is performed at 400° C. in a nitrogen atmosphere for one hour after the deposition of the insulator 222, and then another treatment is successively performed at 400° C. in an oxygen atmosphere for one hour. By the heat treatment, impurities such as water and hydrogen contained in the insulator 222 can be removed, for example. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, as the insulator 224, a silicon oxynitride film is deposited by a CVD method.

Here, the insulator 224 is deposited using the deposition condition where the constant Y, which satisfies Formula 1 described above, is $0<Y \leq 8.0$, preferably $0<Y \leq 7.0$. By the deposition using the deposition condition where the constant Y is $0<Y \leq 8.0$, preferably $0<Y \leq 7.0$, a high-quality film with a reduced hydrogen concentration can be formed. Moreover, by optimizing the deposition power PW, the pressure P, and the flow rate f, the insulator can be deposited without implantation of hydrogen contained in the deposition gas into component under the insulator.

Plasma treatment using oxygen may be performed under reduced pressure so that an excess-oxygen region can be formed in the insulator 224. For the plasma treatment using oxygen, an apparatus including a power source for generating high-density plasma using a microwave is preferably used, for example. Alternatively, a power source for applying an RF (Radio Frequency) to the substrate side may be included. The use of high-density plasma enables high-density oxygen radicals to be generated, and RF application to the substrate side allows the oxygen radicals generated by the high-density plasma to be efficiently introduced into the insulator 224. Alternatively, after plasma treatment using an inert gas is performed using this apparatus, plasma treatment using oxygen may be performed to compensate for released oxygen. Note that impurities such as water and hydrogen contained in the insulator 224 can be removed by selecting the conditions for the plasma treatment appropriately. In that case, the heat treatment does not need to be performed.

A specific example of plasma treatment is microwave-excited plasma treatment. By performing microwave-excited plasma treatment, hydrogen, water, or an impurity that serves as an impurity in an insulator subjected to the treatment can be removed. Furthermore, microwave-excited plasma treatment improves the film quality of the insulator, whereby diffusion of hydrogen, water, an impurity, or the like can be inhibited. Accordingly, hydrogen, water, or an impurity can be inhibited from diffusing into the oxide 230 through the insulator 250 and the insulator 224 in a later step such as deposition of a conductive film to be the conductor 260 or by later treatment such as heat treatment.

In solid silicon oxide, for example, bond energy between a hydrogen atom and a silicon atom is 3.3 eV, bond energy between a carbon atom and a silicon atom is 3.4 eV, and bond energy between a nitrogen atom and a silicon atom is 3.5 eV. Thus, in order to remove a hydrogen atom bonded to a silicon atom, radicals or ions having an energy of at least greater than or equal to 3.3 eV are made to collide with a bond portion between the hydrogen atom and the silicon atom to cut the bond between the hydrogen atom and the silicon atom.

Note that the same applies to other impurities such as nitrogen and carbon; radicals or ions having an energy at least greater than or equal to the bond energy are made to collide with a bond portion between an impurity atom and a silicon atom to cut the bond between the impurity atom and the silicon atom.

Here, examples of radicals and ions generated by microwave-excited plasma include $O(^3P)$, which is an oxygen atom radical in the ground state, $O(^1D)$, which is an oxygen atom radical in the first excited state, and $O_{2+}$, which is a monovalent cation of an oxygen molecule. The energy of $O(^3P)$ is 2.42 eV, and the energy of $O(^1D)$ is 4.6 eV. The energy of $O^2+$ having charges is not uniquely determined because it is accelerated by the potential distribution in plasma and a bias; however, at least only the internal energy is higher than the energy of $O(^1D)$.

That is, radicals and ions such as $O(^1D)$ and $O_{2+}$ can cut the bond between each of hydrogen, nitrogen, and a carbon atom in the insulator 250 and a silicon atom to remove hydrogen, nitrogen, and carbon bonded to the silicon atom. Furthermore, impurities such as hydrogen, nitrogen, and carbon can also be reduced by thermal energy and the like applied to a substrate in performing the microwave-excited plasma treatment.

On the other hand, $O(^3P)$ has low reactivity, and thus does not react in the insulator 250 and is diffused deeply in the film. Alternatively, $O(^3P)$ reaches the oxide 230 through the insulator 250, and is diffused into the oxide 230. When $O(^3P)$ diffused into the oxide 230 comes close to an oxygen vacancy into which hydrogen has entered, hydrogen in the oxygen vacancy is released from the oxygen vacancy and $O(^3P)$ enters the oxygen vacancy instead; thus, the oxygen vacancy is filled. Accordingly, an electron serving as a carrier can be inhibited from being generated in the oxide 230.

The proportion of $O(^3P)$ in the total radicals and ion species increases when microwave-excited plasma treatment is performed under a high pressure condition. The proportion of $O(^3P)$ is preferably high for compensation of the oxygen vacancies in the oxide 230. Thus, the pressure during the microwave-excited plasma treatment is higher than or equal to 133 Pa, preferably higher than or equal to 200 Pa, further preferably higher than or equal to 400 Pa. Furthermore, the oxygen flow rate ratio $(O_2/O_2+Ar)$ is lower than or equal to 50%, preferably higher than or equal to 10% and lower than or equal to 30%.

After aluminum oxide is deposited over the insulator 224 by, for example, a sputtering method, the aluminum oxide may be subjected to CMP treatment until the insulator 224 is reached. The CMP treatment can planarize and smooth the surface of the insulator 224. When the CMP treatment is performed on the aluminum oxide provided over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can sometimes prevent deterioration in the coverage with an oxide deposited later and a decrease in the yield of the semiconductor device. The deposition of aluminum oxide over the insulator 224 by a sputtering method is preferred because oxygen can be added to the insulator 224.

Next, an oxide film 230A and an oxide film 230B are deposited in this order over the insulator 224 (see FIG. 2). Note that it is preferable to deposit the oxide film 230A and the oxide film 230B successively without exposure to the air.

By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be formed by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, a target of the above-described In-M-Zn oxide or the like can be used.

In particular, when the oxide film 230A is formed, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is being heated, the crystallinity of the oxide film can be improved.

In this embodiment, the oxide film 230A is formed by a sputtering method using an In—Ga—Zn oxide target with 1:3:4 [atomic ratio]. The oxide film 230B is formed by a sputtering method using an In—Ga—Zn oxide target with In:Ga:Zn=4:2:4.1 [atomic ratio]. Note that each of the oxide films is preferably formed by appropriate selection of deposition conditions and the atomic ratio to have characteristics required for the oxide 230.

Note that the insulator 222, the insulator 224, the oxide film 230A, and the oxide film 230B are preferably deposited without exposure to the air. For example, a multi-chamber deposition apparatus is used.

Next, heat treatment may be performed. For the heat treatment, the above-described heat treatment conditions can be used. By the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Then, a conductive film 240A is deposited over the oxide film 230B. The conductive film 240A can be deposited by a sputtering method, a CVD method, an MBE method, a PLD method, an ALD method, or the like (see FIG. 2). Note that heat treatment may be performed before the deposition of the conductive film 240A. This heat treatment may be performed under reduced pressure, and the conductive film 240A may be successively formed without exposure to the air. The treatment can remove moisture and hydrogen adsorbed onto the surface of the oxide film 230B, and can reduce the moisture concentration and the hydrogen concentration of the oxide film 230A and the oxide film 230B. The heat treatment temperature is preferably higher than or equal to 100° C. and lower than or equal to 400° C. In this embodiment, the heat treatment temperature is 200° C.

Next, an insulating film 245A functioning as a barrier layer is formed.

As the insulating film 245A, aluminum oxide is formed by an ALD method, for example. With use of an ALD method, a dense film with a smaller number of defects such as cracks and pinholes or with a uniform thickness can be formed.

Subsequently, a film 290A to be a hard mask is formed over the insulating film 245A (see FIG. 2). As the film 290A to be a hard mask, tungsten or tantalum nitride is formed by a sputtering method, for example.

Next, a resist mask 292 is formed over the film 290A to be a hard mask by a photolithography method. Part of the film 290A to be a hard mask and part of the insulating film 245A are selectively removed using the resist mask 292, whereby a hard mask 290B and an insulating layer 245B are formed (FIG. 3).

Then, part of the conductive film 240A is selectively removed using the hard mask 290B and the insulating layer 245B, whereby an island-shaped conductive layer 240B is formed (FIG. 4). Note that part or all of the hard mask 290B may be removed at this time.

Subsequently, part of the oxide film 230A and part of the oxide film 230B are selectively removed using the island-shaped conductive layer 240B, the insulating layer 245B, and the hard mask 290B as masks. In this step, part of the insulator 224 is concurrently removed in some cases. After that, the hard mask 290B is removed, so that a stacked-layer structure of the island-shaped oxide 230*a*, the island-shaped oxide 230*b*, the island-shaped conductive layer 240B, and the island-shaped insulating layer 245B can be formed.

Furthermore, the processing of the conductive film 240A using the hard mask 290B in this step can inhibit occurrence of etching that is unnecessary for the shape of the conductor 240 (also referred to as CD loss).

For example, in the case where a resist mask is used, the mask is side-etched in etching to expose the surface of an end portion of an object to be processed, and the corner is sometimes rounded. In the case where the defect is large in the conductor 240, the volume of the conductor 240 is sometimes decreased compared to the designed value, so that the on-state current becomes small in some cases.

In view of this, with the use of the hard mask, when a material that has high selectivity of the etching rate to the hard mask is used as the object to be processed, the shape of the hard mask is maintained in etching and thus the defect in shape of the object to be processed can be inhibited. Specifically, the following material is preferably used for the mask: in the case where the etching rate of the material used for the hard mask is 1, the etching rate of the object to be processed is greater than or equal to 5, preferably greater than or equal to 10.

Next, an insulating film 280A is deposited over the stacked-layer structure of the island-shaped oxide 230*a*, the island-shaped oxide 230*b*, the island-shaped conductive layer 240B, and the island-shaped insulating layer 245B.

The insulating film 280A can be deposited by a sputtering method, a CVD method, an MBE method, a PLD method, an ALD method, or the like.

In this embodiment, as the insulating film 280A, a silicon oxide film is deposited by a CVD method or a sputtering method. Note that heat treatment may be performed before the insulating film 280A is deposited. The heat treatment may be performed under reduced pressure, and the insulating film may be successively deposited without exposure to the air. The treatment can remove moisture and hydrogen adsorbed onto the surface of the insulator 224 and the like, and can reduce the moisture concentration and the hydrogen concentration of the oxide 230*a*, the oxide 230*b*, and the insulator 224. The above heat treatment conditions can be used.

Here, the insulator 280 is deposited using the deposition condition where the constant Y, which satisfies Formula 1 described above, is $0 < Y \leq 8.0$, preferably $0 < Y \leq 7.0$. By the deposition using the deposition condition where the constant Y is $0 < Y \leq 8.0$, preferably $0 < Y \leq 7.0$, a high-quality film with a reduced hydrogen concentration can be formed. Moreover, by optimizing the deposition power PW, the pressure P, and the flow rate f the insulator can be deposited without implantation of hydrogen contained in the deposition gas into components under the insulator (specifically, the insulator 224, the oxide 230, the conductive layer 240B, and the insulating layer 245B).

The insulating film 280A may have a multilayer structure. The insulating film 280A may have a structure in which a silicon oxide film is deposited by a sputtering method and another silicon oxide film is deposited over the silicon oxide film by a CVD method, for example.

Next, the insulating film 280A is subjected to CMP treatment, so that the insulator 280 having a flat top surface is formed (see FIG. 5). Then, part of the insulator 280 and part of the conductive layer 240B are processed to form an opening reaching the oxide 230*b* (see FIG. 6).

Note that in the transistor 200 illustrated in FIG. 1, the conductor 260 is provided to be embedded in an opening formed in the insulator 280 and the like. That is, the conductor 260 is embedded in the opening provided in the insulator 280 with the insulator 250 and the like therebetween, whereby the conductor 260 can be arranged in a region between the conductor 240*a* and the conductor 240*b* in a self-aligned manner without positional alignment.

The opening is preferably formed to overlap with the conductor 205. The conductor 240*a*, the conductive layer 240B, the insulator 245*a*, and the insulating layer 245B are formed by forming the opening. At this time, the thickness of the oxide 230*b* in a region overlapping with the opening is reduced in some cases (see FIG. 6).

Part of the insulator 280, part of the insulating layer 245B, and part of the conductive layer 240B may be processed under different conditions. For example, part of the insulator 280 may be processed by a dry etching method, part of the insulating layer 245B may be processed by a wet etching method, and part of the conductive layer 240B may be processed by a dry etching method.

Here, it is preferable to remove impurities that are attached onto the surfaces of the oxide 230*a*, the oxide 230*b*, and the like or diffused into the oxide 230*a*, the oxide 230*b*, and the like. The impurities result from components contained in the insulator 280, the insulating layer 245B, and the conductive layer 240B; components contained in a member used in an apparatus used to form the opening; and components contained in a gas or a liquid used for etching, for instance. Examples of the impurities include aluminum, silicon, tantalum, fluorine, and chlorine.

In order to remove the above impurities and the like, cleaning treatment may be performed. Examples of the cleaning method include wet cleaning using a cleaning solution and the like, plasma treatment using plasma, and cleaning by heat treatment, and any of these cleaning methods may be performed in appropriate combination.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Alternatively, such cleaning methods may be performed in combination as appropriate.

Next, heat treatment may be performed. The heat treatment is preferably performed in an oxygen-containing atmosphere. The heat treatment may be performed under reduced pressure, and an oxide film 230C may be successively deposited without exposure to the air (see FIG. 7). Such treatment can remove moisture and hydrogen adsorbed onto the surface of the oxide 230b or the like and can reduce the moisture concentration and the hydrogen concentration in the oxide 230a and the oxide 230b. The heat treatment temperature is preferably higher than or equal to 100° C. and lower than or equal to 400° C. In this embodiment, the heat treatment temperature is 200° C.

An insulating film 250A can be deposited by a sputtering method, a CVD method, an MBE method, a PLD method, an ALD method, or the like (see FIG. 7). In this embodiment, as the insulating film 250A, silicon oxynitride is deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulating film having few impurities can be deposited.

Here, the insulating film 250A is deposited using the deposition condition where the constant Y, which satisfies Formula 1 described above, is $0<Y\leq8.0$, preferably $0<Y\leq7.0$. By the deposition using the deposition condition where the constant Y is $0<Y\leq8.0$, preferably $0<Y\leq7.0$, a high-quality film with a reduced hydrogen concentration can be formed. Moreover, by optimizing the deposition power PW, the pressure P, and the flow rate f the insulator can be deposited without implantation of hydrogen contained in the deposition gas into components under the insulator (specifically, the insulator 224, the oxide 230, the conductor 240, the insulator 245, and the insulator 280).

Next, a conductive film 260A and a conductive film 260B are deposited in this order. The conductive film 260A and the conductive film 260B can be deposited by a sputtering method, a CVD method, an MBE method, a PLD method, an ALD method, or the like. In this embodiment, the conductive film 260A is deposited by an ALD method, and the conductive film 260B is deposited by a CVD method (see FIG. 7).

Subsequently, the oxide film 230C, the insulating film 250A, the conductive film 260A, and the conductive film 260B are polished by CMP treatment until the insulator 280 is exposed, whereby the insulator 250 and the conductor 260 (the conductor 260a and the conductor 260b) are formed (see FIG. 8). The insulator 250 is positioned to cover the inner wall of the opening. The conductor 260 is positioned to fill the opening with the insulator 250 therebetween.

Next, heat treatment may be performed. In this embodiment, treatment is performed at 400° C. in a nitrogen atmosphere for one hour. The heat treatment can reduce the moisture concentration and the hydrogen concentration in the insulator 250 and the insulator 280.

Then, the insulator 282 is deposited over the insulator 250, the conductor 260, and the insulator 280. The insulator 282 can be deposited by a sputtering method, a CVD method, an MBE method, a PLD method, an ALD method, or the like. An aluminum oxide film or an silicon nitride film is preferably deposited as the insulator 282 by a sputtering method, for example. When an aluminum oxide film or a silicon nitride film is deposited by a sputtering method, diffusion of hydrogen contained in the insulator 284 into the oxide 230 can be inhibited. Forming the insulator 282 to be in contact with the conductor 260 is preferable, in which case oxidation of the conductor 260 can be inhibited.

When an aluminum oxide film is formed as the insulator 282 by a sputtering method, oxygen can be supplied to the insulator 280. Oxygen supplied to the insulator 280 is sometimes supplied to the channel formation region included in the oxide 230b through the insulator 250. Furthermore, when oxygen is supplied to the insulator 280, oxygen that is contained in the insulator 280 before the formation of the insulator 282 is sometimes supplied to the channel formation region included in the oxide 230b through the insulator 250.

The insulator 282 may have a multilayer structure. For example, a structure may be employed in which an aluminum oxide film is deposited by a sputtering method and silicon nitride is deposited over the aluminum oxide film by a sputtering method.

Next, heat treatment may be performed. For the heat treatment, the above heat treatment conditions can be used. The heat treatment can reduce the moisture concentration and the hydrogen concentration of the insulator 280. Moreover, oxygen contained in the insulator 282 can be injected into the insulator 280.

Before the insulator 282 is deposited, the following steps may be performed: first, an aluminum oxide film is deposited over the insulator 280 and the like by a sputtering method, heat treatment is performed under the above heat treatment conditions, and then the aluminum oxide film is removed by CMP treatment. Through these steps, a larger number of excess-oxygen regions can be formed in the insulator 280. Note that in these steps, part of the insulator 280, part of the conductor 260, and part of the insulator 250 are removed in some cases.

An insulator may be provided between the insulator 280 and the insulator 282. As the insulator, silicon oxide deposited by a sputtering method is used, for example. Providing the insulator can form an excess-oxygen region in the insulator 280.

Next, the insulator 284 may be deposited over the insulator 282. The insulator 284 can be deposited by a sputtering method, a CVD method, an MBE method, a PLD method, an ALD method, or the like (see FIG. 1).

Through the above process, the semiconductor device including the transistor 200 illustrated in FIG. 1 can be manufactured.

After the transistor 200 is formed, an opening may be formed to surround the transistor 200 and an insulator having a high barrier property against hydrogen or water may be formed to cover the opening.

Note that the insulator having a barrier property, specifically, a metal oxide such as aluminum oxide and a nitride such as silicon nitride may have a function of inhibiting diffusion of hydrogen (hereinafter also referred to as a barrier property against hydrogen). When compared in particular with silicon oxide, aluminum oxide and silicon nitride have a function of inhibiting diffusion of oxygen or impurities such as water and hydrogen.

Surrounding the transistor 200 by the insulator having a high barrier property can prevent entry of moisture and hydrogen from the outside. Alternatively, a plurality of transistors 200 may be collectively surrounded by the insulator having a high barrier property against hydrogen or water. When an opening is formed to surround the transistor 200, for example, the formation of an opening reaching the insulator 214 or the insulator 222 and the formation of the insulator having a high barrier property in contact with the insulator 214 or the insulator 222 are suitable because these formation steps can also serve as part of the manufacturing steps of the transistor 200. Note that for the insulator having a high barrier property against hydrogen or water, a material similar to that for the insulator 222 is used, for example.

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. Another object of one embodiment of the present invention is to provide a semiconductor device with low power consumption.

<Variation Example 1 of Semiconductor Device>

An example of a semiconductor device including the transistor 200 of one embodiment of the present invention will be described below with reference to FIG. 9.

Figure 9A:
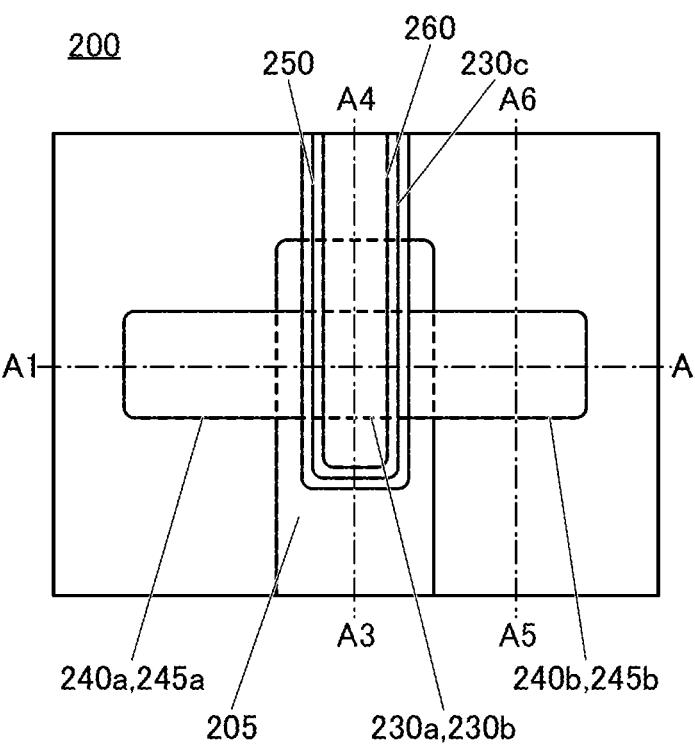
FIG. 9A is a top view of a semiconductor device of one embodiment of the present invention.
Figure 9C:
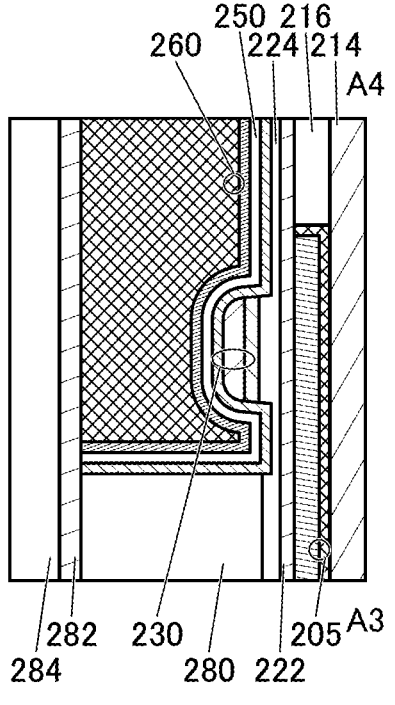
FIG. 9B to FIG. 9D are cross-sectional views of a semiconductor device of one embodiment of the present invention.
Figure 9B:
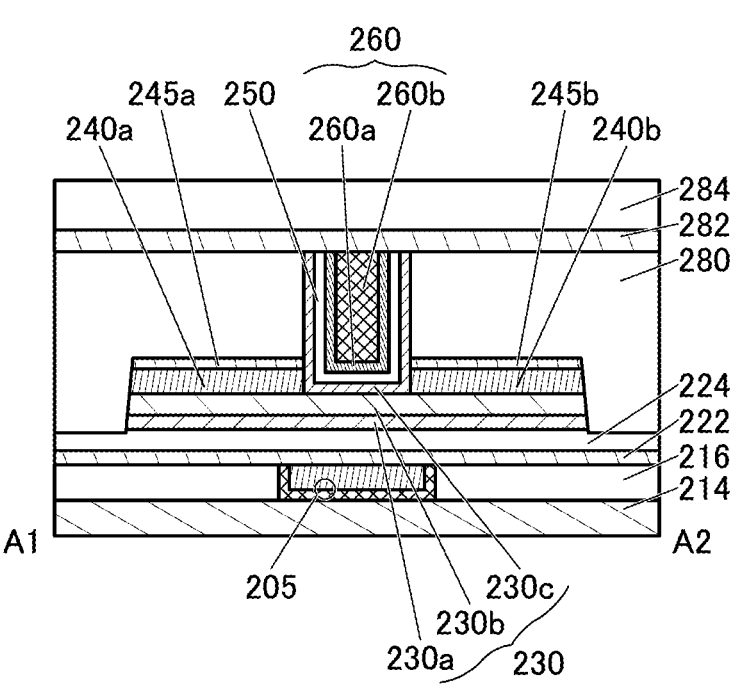
Figure 9D:
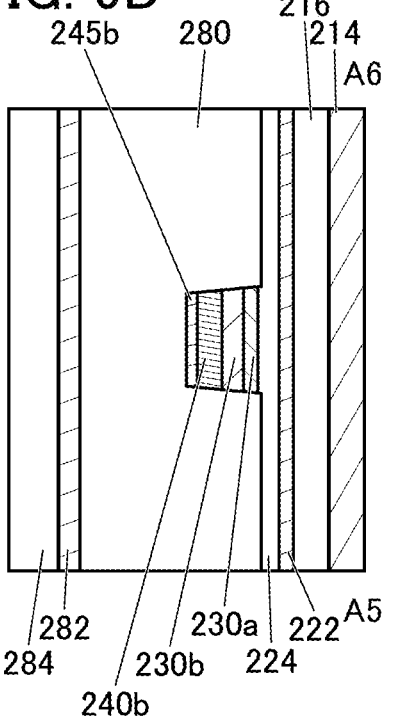

Here, FIG. 9A is a top view. FIG. 9B is a cross-sectional view corresponding to a portion indicated by the dashed-dotted line A1-A2 in FIG. 9A. FIG. 9C is a cross-sectional view corresponding to a portion indicated by the dashed-dotted line A3-A4 in FIG. 9A. FIG. 9D is a cross-sectional view corresponding to a portion indicated by the dashed-dotted line A5-A6 in FIG. 9A. For clarity of the drawing, some components are not illustrated in the top view of FIG. 9A.

The semiconductor device illustrated in FIG. 9 differs from the semiconductor device illustrated in FIG. 1 in including the oxide 230c. Providing the oxide 230c can compensate for a defect caused on the surface of the oxide 230b or the oxide 230a when an opening is provided by processing the insulator 280, the insulator 245, and the conductor 240. Note that in some cases, the oxide 230a, the oxide 230b, and the oxide 230c are collectively referred to as the oxide 230.

A metal oxide that can be used as the oxide 230a or the oxide 230b can be used as the oxide 230c.

For example, in the case where the oxide 230b is an In—Ga—Zn oxide, an In—Ga—Zn oxide, a Ga—Zn oxide, gallium oxide, or the like may be used as the oxide 230a and the oxide 230c.

The oxide 230b and the oxide 230c preferably have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called a thermal budget).

Although the oxide 230c is shown as a single layer in the transistor 200 illustrated in FIG. 9, the present invention is not limited thereto. For example, the oxide 230c may have a stacked-layer structure of two or more layers.

A film to be the oxide 230c can be formed by a sputtering method, a CVD method, an MBE method, a PLD method, an ALD method, or the like. The film to be the oxide 230c is deposited by a method similar to that for the oxide film 230A or the oxide film 230B in accordance with characteristics required for the oxide film 230C. In this embodiment, the film to be the oxide 230c is deposited by a sputtering method using an In—Ga—Zn oxide target with In:Ga:Zn=1:3:4 [atomic ratio] or 4:2:4.1 [atomic ratio]. Alternatively, the film to be the oxide 230c is deposited by a sputtering method in such a manner that a film is deposited using an In—Ga—Zn oxide target having an atomic ratio of In:Ga:Zn=4:2:4.1 [atomic ratio] and another film is deposited thereover using an In—Ga—Zn oxide target having an atomic ratio of In:Ga:Zn=1:3:4 [atomic ratio].

In particular, in the deposition of the film to be the oxide 230c, part of oxygen contained in a sputtering gas is supplied to the oxide 230a and the oxide 230b in some cases. Therefore, the proportion of oxygen contained in the sputtering gas for the film to be the oxide 230c is higher than or equal to 70%, preferably higher than or equal to 80%, further preferably 100%.

Next, heat treatment may be performed. The heat treatment may be performed under reduced pressure, and the insulating film 250A may be successively deposited without exposure to the air. Such treatment can remove moisture and hydrogen adsorbed onto the surface of the film to be the oxide 230c and can reduce the moisture concentration and the hydrogen concentration in the oxide 230a, the oxide 230b, and the oxide film 230C. The heat treatment temperature is preferably higher than or equal to 100° C. and lower than or equal to 400° C.

<Variation Example 2 of Semiconductor Device>

An example of a semiconductor device including the transistor 200 of one embodiment of the present invention will be described below with reference to FIG. 10.

Figures 10A, 10B, 10C:
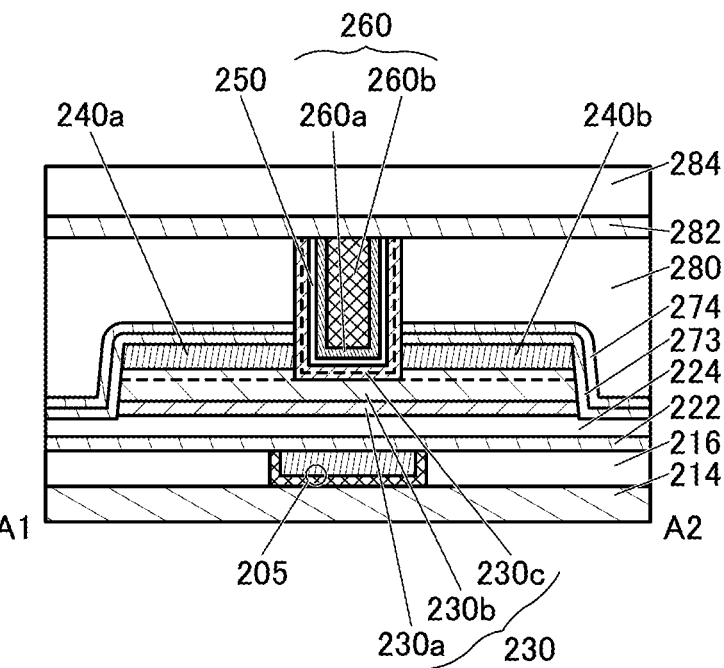
FIG. 10A is a top view of a semiconductor device of one embodiment of the present invention.
FIG. 10B and FIG. 10C are cross-sectional views of a semiconductor device of one embodiment of the present invention.

Here, FIG. 10A is a top view. FIG. 10B is a cross-sectional view corresponding to a portion indicated by the dashed-dotted line A1-A2 in FIG. 10A. FIG. 10C is a cross-sectional view corresponding to a portion indicated by the dashed-dotted line A3-A4 in FIG. 10A. For clarity of the drawing, some components are not illustrated in the top view of FIG. 10A.

The semiconductor device illustrated in FIG. 10 is different from the semiconductor device illustrated in FIG. 9 in that the oxide 230b has a stacked-layer structure. Additionally, it is different in that the oxide 230c has a stacked-layer structure. It is also different in that an insulator 273 and an insulator 274 are included.

The oxide 230c may have a stacked-layer structure of two or more layers. For example, in FIG. 10, a first oxide of the oxide 230c and a second oxide of the oxide 230c over the first oxide of the oxide 230c are included.

Specifically, the first oxide of the oxide 230c preferably contains at least one of the metal elements contained in the metal oxide used in the oxide 230b, and further preferably contains all of these metal elements. For example, it is preferable that an In—Ga—Zn oxide be used for the first oxide of the oxide 230c, and an In—Ga—Zn oxide, a Ga—Zn oxide, or gallium oxide be used for the second oxide of the oxide 230*c*. Owing to this structure, the density of defect states at the interface between the oxide 230*b* and the first oxide of the oxide 230*c* can be decreased.

The second oxide of the oxide 230*c* is preferably a metal oxide that inhibits diffusion or passage of oxygen, compared to the first oxide of the oxide 230*c*. Providing the second oxide of the oxide 230*c* between the insulator 250 and the first oxide of the oxide 230*c* can inhibit diffusion of oxygen contained in the insulator 280 into the insulator 250. Therefore, the oxygen is more likely to be supplied to the oxide 230*b* through the first oxide of the oxide 230*c*.

When the atomic ratio of In to the metal element of the main component in the metal oxide used for the second oxide of the oxide 230*c* is smaller than the atomic ratio of In to the metal element of the main component in the metal oxide used for the first oxide of the oxide 230*c*, the diffusion of In to the insulator 250 side can be inhibited. Since the insulator 250 functions as a gate insulator, the transistor exhibits poor characteristics when In enters the insulator 250 and the like. Thus, when the oxide 230*c* has a stacked-layer structure, a highly reliable semiconductor device can be provided.

The oxide 230*b* may have a stacked-layer structure of two or more layers. For example, in FIG. 10, a first oxide of the oxide 230*b* and a second oxide of the oxide 230*b* over the first oxide of the oxide 230*b* are included.

Specifically, the second oxide of the oxide 230*b* is preferably provided between the first oxide of the oxide 230*b* and the conductor 240 (the conductor 240*a* and the conductor 240*b*) functioning as the source electrode and the drain electrode. In this structure, the second oxide of the oxide 230*b* preferably has a function of inhibiting passage of oxygen.

Accordingly, it is preferable to place the second oxide of the oxide 230*b* having a function of inhibiting passage of oxygen between the first oxide of the oxide 230*b* and the conductor 240 that functions as the source electrode and the drain electrode, in which case the electrical resistance between the conductor 240 and the first oxide of the oxide 230*b* is reduced. Such a structure improves the electrical characteristics of the transistor 200 and the reliability of the transistor 200.

The conductor 240 and the first oxide of the oxide 230*b* are not in contact with each other, which inhibits the conductor 240 from absorbing oxygen of the first oxide of the oxide 230*b*. Preventing oxidation of the conductor 240 can inhibit the decrease in conductivity of the conductor 240.

A metal oxide containing the element M may be used as the second oxide of the oxide 230*b*. In particular, aluminum, gallium, yttrium, or tin is preferably used as the element M. The concentration of the element M in the second oxide of the oxide 230*b* is preferably higher than that in the first oxide of the oxide 230*b*. Alternatively, gallium oxide may be used as the second oxide of the oxide 230*b*. A metal oxide such as an In-M-Zn oxide may be used as the second oxide of the oxide 230*b*.

Specifically, the atomic ratio of the element M to In in the metal oxide used as the second oxide of the oxide 230*b* is preferably greater than the atomic ratio of the element M to In in the metal oxide used as the first oxide of the oxide 230*b*. The thickness of the second oxide of the oxide 230*b* is preferably greater than or equal to 0.5 nm and less than or equal to 5 nm, further preferably greater than or equal to 1 nm and less than or equal to 3 nm. The second oxide of the oxide 230*b* preferably has crystallinity. When the second oxide of the oxide 230*b* has crystallinity, release of oxygen in the first oxide of the oxide 230*b* can be reduced. When the second oxide of the oxide 230*b* has a crystal structure such as a hexagonal crystal structure, release of oxygen in the first oxide of the oxide 230*b* can be inhibited in some cases.

Contact between the conductor 240 (the conductor 240*a* and the conductor 240*b*) and the oxide 230 may make oxygen in the oxide 230 diffuse into the conductor 240, resulting in oxidation of the conductor 240. It is highly possible that oxidation of the conductor 240 lowers the conductivity of the conductor 240. Note that diffusion of oxygen in the oxide 230 into the conductor 240 can be rephrased as absorption of oxygen in the oxide 230 by the conductor 240.

Oxygen in the oxide 230 (typically in the oxide 230*b*) diffuses into the conductor 240, whereby another layer may be formed between the conductor 240 and the oxide 230. The layer contains more oxygen than the conductor 240 does, and thus the layer presumably has an insulating property. In this case, the three-layer structure of the conductor 240, the layer, and the oxide 230 can be regarded as a three-layer structure formed of metal-insulator-semiconductor, which is sometimes referred to as an MIS (Metal-Insulator-Semiconductor) structure or a diode junction structure having an MIS structure as its main part.

The insulator 273 having a barrier property may be provided to cover the top surface of the conductor 240 and the side surfaces of the oxide 230*a*, the oxide 230*b*, and the conductor 240. Note that when the insulator 273 is provided, the insulator 245 is not necessarily provided.

For example, oxygen vacancies are formed in the region of the oxide 230 that overlaps with the conductor 240 by the introduction of the metal element of the conductor 240 or absorption of oxygen by the conductor 240. That is, the vicinity of the surface of the oxide 230 that is in contact with the conductor 240 can locally have a lower resistance. When the region of the oxide 230 that overlaps with the conductor 240 has a lower resistance, the on-state current of the transistor 200 can be increased.

Meanwhile, excess oxygen included in the insulator 280 is diffused into oxide 230 through the side surface of the region of the oxide 230 that overlaps with the conductor 240; hence, the local lower-resistance region formed in the region of the oxide 230 that overlaps with the conductor 240 may be reduced and the on-state current of the transistor 200 may be lowered.

When the insulator 273 is provided, excess oxygen included in the insulator 280 can be inhibited from being supplied through the side surface of the region of the oxide 230 that overlaps with the conductor 240. On the other hand, excess oxygen included in the insulator 280 can be supplied to the channel formation region of the oxide 230*b* through the oxide 230*c*. Thus, oxygen vacancies formed in the channel formation region of the oxide 230 can be efficiently filled without a reduction of the lower-resistance region formed in the vicinity of the surface of the oxide 230 in contact with the conductor 240.

When the insulator 224 has an excess-oxygen region, excess oxygen contained in the insulator 224 is diffused into the oxide 230*b* through the oxide 230*a* in the oxide 230. In other words, excess oxygen can be supplied from the oxide 230*a* side. Accordingly, the reduction of the lower-resistance region formed in the vicinity of the surface of the oxide 230 in contact with the conductor 240 can be inhibited, and oxygen vacancies formed in the channel formation region of the oxide 230 can be filled.

The insulator 273 is preferably an aluminum oxide film formed using a sputtering apparatus. When the aluminum oxide film is formed as the insulator 273 under an oxygen gas atmosphere, excess oxygen can be introduced into the insulator 224 while the insulator 273 is deposited.

The insulator 274 may be provided over the insulator 273. Note that like the insulator 273, the insulator 274 preferably has a function of inhibiting diffusion of oxygen.

Specifically, coverage with the insulator 273 deposited by a sputtering method is low. Thus, the insulator 274 is preferably deposited by an ALD method. This is because since an ALD method can form a film having excellent step coverage and excellent thickness uniformity, the insulator 274 deposited by an ALD method is less likely to be affected by the shape of an underlying object and has favorable step coverage.

<Application Example of Semiconductor Device>

An example in which a stacked-layer structure of an interlayer film of one embodiment of the present invention and a plug are applied to the semiconductor device including the transistor 200 of this example will be described below with reference to FIG. 11.

Figures 11A, 11B, 11C, 11D:
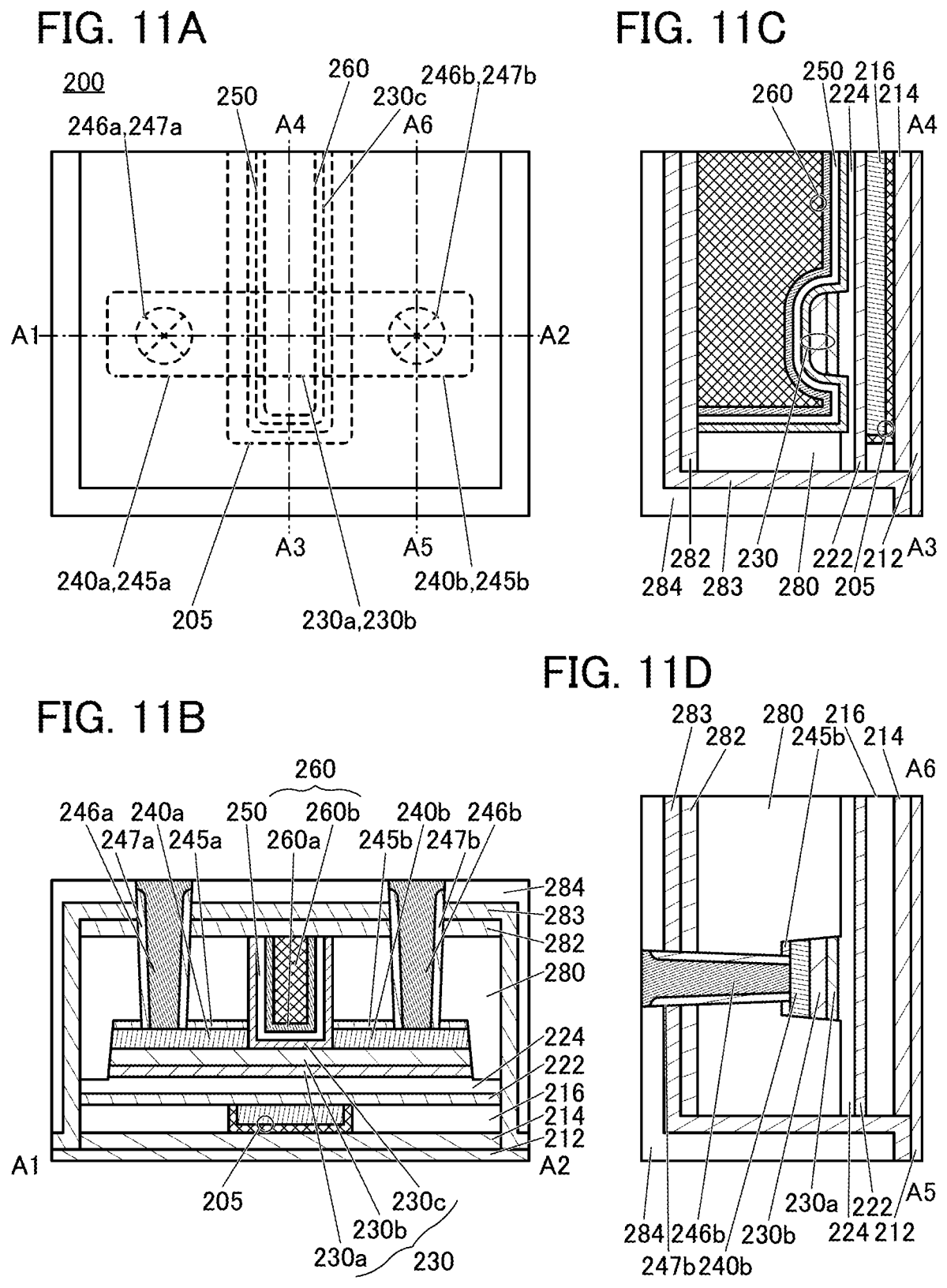

Here, FIG. 11A is a top view. FIG. 11B is a cross-sectional view corresponding to a portion indicated by the dashed-dotted line A1-A2 in FIG. 11A. FIG. 11C is a cross-sectional view corresponding to a portion indicated by the dashed-dotted line A3-A4 in FIG. 11A. FIG. 11D is a cross-sectional view corresponding to a portion indicated by the dashed-dotted line A5-A6 in FIG. 11A. For clarity of the drawing, some components are not illustrated in the top view of FIG. 11A.

In the semiconductor device illustrated in FIG. 11, the insulator 280, the insulator 282, an insulator 283, and the insulator 284 have opening portions that expose the transistor 200. In the opening portions, conductors 246 (a conductor 246a and a conductor 246b) that function as plugs electrically connected to the transistor 200 are provided. Insulators 247 are provided on the side surfaces of the opening portions.

Note that the conductors 246 have a function of a plug or a wiring that is electrically connected to the transistor 200.

Furthermore, the semiconductor device illustrated in FIG. 11 includes an insulator 212 and the insulator 283, which function as barrier layers, over and under the transistor 200. The insulator 212 and the insulator 283 are in contact with each other at a side of the transistor 200 or in an end portion region of the substrate. In other words, the semiconductor device illustrated in FIG. 11 has a structure in which the transistor 200 and the insulator 280 including an excess-oxygen region are sealed by the barrier layers.

The region where the insulator 212 and the insulator 283 are in contact with each other may be provided along a scribe line. For example, when a plurality of transistors 200 are arranged in a matrix, a region where the insulator 212 and the insulator 283 are in contact with each other may be provided along the row and column where the plurality of transistors are aligned.

When the region where the insulator 212 and the insulator 283 are in contact with each other is provided at an end portion of the substrate, the region may be provided to overlap with the scribe line.

The insulator 283 is provided over the insulator 282. The insulator 284 is formed using a material having high selectivity of the etching rate to a conductor 248 when the conductor 248 is processed. Thus, the insulator 284 is provided over the insulator 283 if necessary.

The insulators 247 are preferably in contact with the insulator 283. When the insulators 247 and the insulator 283 are in contact with each other, the transistor 200 and the insulator 280 including an excess-oxygen region are sealed with the barrier layers.

Specifically, the insulators 247 are provided in contact with the side walls of the openings in the insulator 283, the insulator 282, and the insulator 280, and the conductors 246 are formed in contact with these side surfaces. At least at part of the bottom portions of the openings, the transistor 200 is positioned and the conductors 246 are in contact with the transistor 200.

Note that in <Variation example of semiconductor device> and <Application example of semiconductor device>, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

According to the above, a highly reliable semiconductor device can be provided. A semiconductor device having favorable electrical characteristics can be provided. A semiconductor device that can be miniaturized or highly integrated can be provided. A semiconductor device with low power consumption can be provided.

The structure, method, and the like described above in this embodiment can be used in appropriate combination with structures, methods, and the like described in the other embodiments and the examples.

Embodiment 2

In this embodiment, one embodiment of a semiconductor device will be described with reference to FIG. 12 and FIG. 13.

[Memory Device 1]

Figure 12:
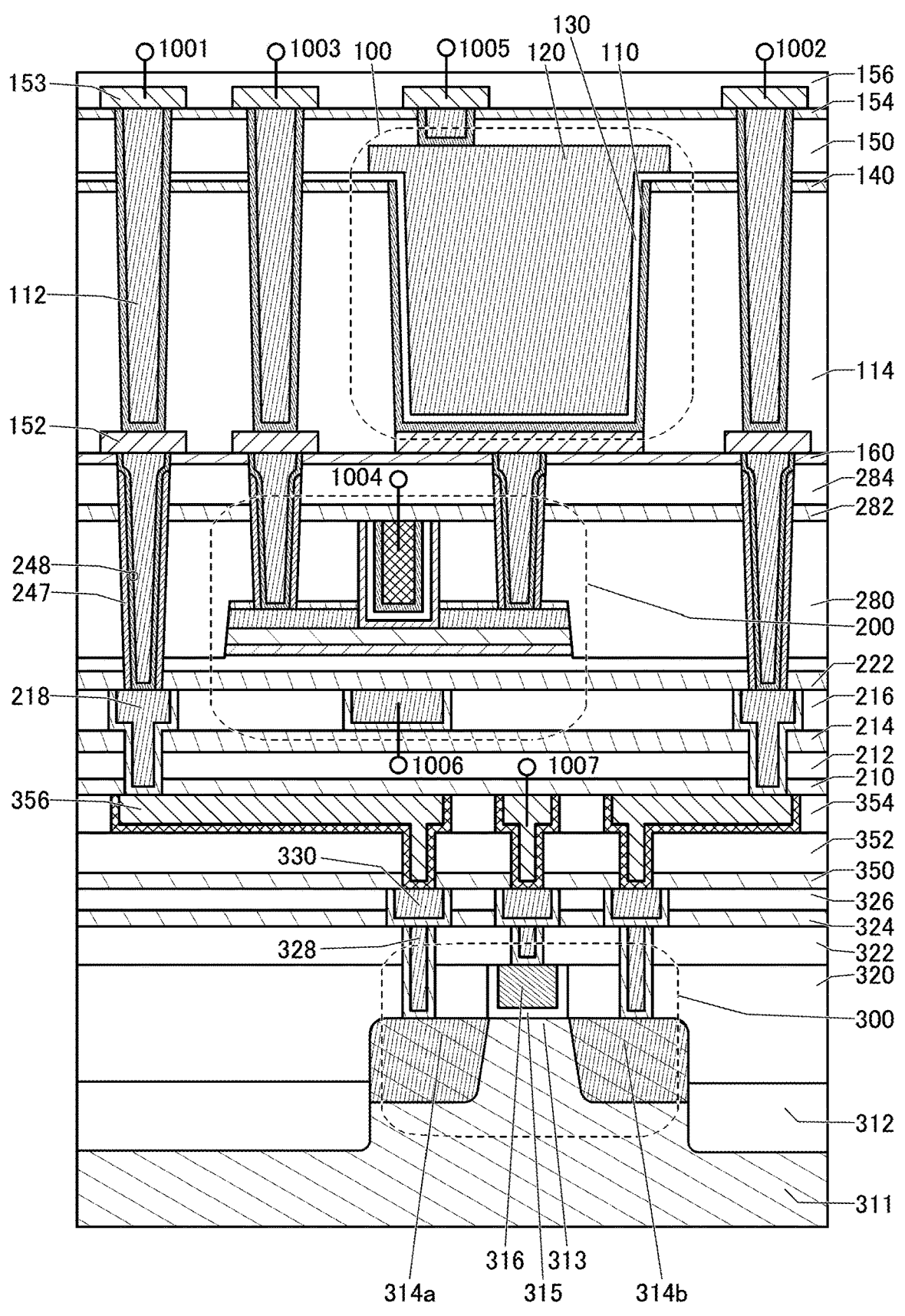
FIG. 12 is a cross-sectional view of a semiconductor device of one embodiment of the present invention.

FIG. 12 illustrates an example of a semiconductor device (memory device) in which a capacitor of one embodiment of the present invention is used. In the semiconductor device of one embodiment of the present invention, the transistor 200 is provided above a transistor 300, and a capacitor 100 is provided above the transistor 200. At least part of the capacitor 100 or the transistor 300 preferably overlaps with the transistor 200. Accordingly, an area occupied by the capacitor 100, the transistor 200, and the transistor 300 in a top view can be reduced, whereby the semiconductor device of this embodiment can be miniaturized or highly integrated. The semiconductor device of this embodiment can be applied to logic circuits typified by a CPU (Central Processing Unit) and a GPU (Graphics Processing Unit) and memory circuits typified by a DRAM (Dynamic Random Access Memory) and an NVM (Non-Volatile Memory), for example.

The transistor 200 described in the above embodiment can be used as the transistor 200. Therefore the description in the above embodiment can be referred to for the transistor 200 and a layer including the transistor 200.

The transistor 200 is a transistor in which a channel is formed in a semiconductor layer containing an oxide semiconductor. The off-state current of the transistor 200 is low; thus, by using the transistor 200 in a memory device, stored data can be retained for a long time. In other words, such a memory device does not require refresh operation or has extremely low frequency of the refresh operation, which leads to a sufficient reduction in power consumption of the memory device. The transistor 200 exhibits favorable electrical characteristics at high temperatures, in comparison with a transistor including silicon in a semiconductor layer. For example, the transistor 200 exhibits favorable electrical characteristics even in the temperature range of 125° C. to 150° C. Moreover, the transistor 200 has an on/off ratio of 10 digits or larger in the temperature range of 125° C. to 150° C. In other words, in comparison with a transistor including silicon in a semiconductor layer, the transistor 200 excels in characteristics such as on-state current and frequency characteristics at higher temperatures.

In the semiconductor device illustrated in FIG. 12, a wiring 1001 is electrically connected to a source of the transistor 300, a wiring 1002 is electrically connected to a drain of the transistor 300, and a wiring 1007 is electrically connected to a gate of the transistor 300. A wiring 1003 is electrically connected to one of the source and the drain of the transistor 200, a wiring 1004 is electrically connected to the first gate of the transistor 200, and a wiring 1006 is electrically connected to the second gate of the transistor 200. The other of the source and the drain of the transistor 200 is electrically connected to one electrode of the capacitor 100, and a wiring 1005 is electrically connected to the other electrode of the capacitor 100.

The semiconductor device illustrated in FIG. 12 has characteristics of being capable of retaining charge stored in the one electrode of the capacitor 100 by switching of the transistor 200; thus, writing, retention, and reading of data can be performed. The transistor 200 is an element in which a back gate is provided in addition to the source, the gate (top gate), and the drain. That is, the transistor 200 is a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), and phase-change memory. In addition, the structure of MRAM, ReRAM, and phase-change memory may change at the atomic level when data is rewritten. By contrast, in the semiconductor device illustrated in FIG. 12, data rewriting is performed by charging or discharging of electrons with the transistor and the capacitor; thus, the semiconductor device has characteristics such as high write endurance and a few structure changes.

Furthermore, by arranging the semiconductor devices illustrated in FIG. 12 in a matrix, a memory cell array can be formed. In this case, the transistor 300 can be used for a read circuit, a driver circuit, or the like that is connected to the memory cell array. As described above, the semiconductor device illustrated in FIG. 12 constitutes the memory cell array. When the semiconductor device illustrated in FIG. 12 is used as a memory element, an operating frequency of 200 MHz or higher is achieved at a driving voltage of 2.5 V and an evaluation environment temperature ranging from −40° C. to 85° C., for example.

<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314*a* and a low-resistance region 314*b* functioning as a source region and a drain region.

Here, the insulator 315 is placed over the semiconductor region 313, and the conductor 316 is placed over the insulator 315. The transistors 300 formed in the same layer are electrically isolated from each other by an insulator 312 functioning as an element isolation insulating layer. The insulator 312 can be formed using an insulator similar to an insulator 326 or the like described later. The transistor 300 can be a p-channel transistor or an n-channel transistor.

In the substrate 311, a region of the semiconductor region 313 where a channel is formed, a region in the vicinity thereof, the low-resistance region 314*a* and the low-resistance region 314*b* functioning as the source region and the drain region, and the like preferably contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to the semiconductor material used for the semiconductor region 313.

For the conductor 316 functioning as the gate electrode, a semiconductor material such as silicon containing the element that imparts n-type conductivity, such as arsenic or phosphorus, or the element that imparts p-type conductivity, such as boron, or a conductive material such as a metal material, an alloy material, or a metal oxide material can be used.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Here, in the transistor 300 illustrated in FIG. 12, the semiconductor region 313 (part of the substrate 311) in which the channel is formed has a convex shape. The conductor 316 is provided to cover a side surface and the top surface of the semiconductor region 313 with the insulator 315 therebetween. Such a transistor 300 is also referred to as a FIN-type transistor because it utilizes a convex portion of a semiconductor substrate. Note that an insulator functioning as a mask for forming the convex portion may be included in contact with an upper portion of the convex portion. Although the case where the convex portion is formed by processing part of the semiconductor substrate is described here, a semiconductor film having a convex shape may be formed by processing an SOI substrate.

Note that the transistor 300 illustrated in FIG. 12 is an example and the structure is not limited thereto; an appropriate transistor is used in accordance with a circuit configuration or a driving method.

As illustrated in FIG. 12, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device illustrated in FIG. 12, a silicon-based semiconductor material and an oxide semiconductor can be used in different layers. The semiconductor device illustrated in FIG. 12 can be manufactured in a process similar to that employing a manufacturing apparatus that is used in the case of a silicon-based semiconductor material, and can be highly integrated.

<Capacitor>

The capacitor 100 includes an insulator 114 over an insulator 160, an insulator 140 over the insulator 114, a conductor 110 positioned in an opening formed in the insulator 114 and the insulator 140, an insulator 130 over the conductor 110 and the insulator 140, a conductor 120 over the insulator 130, and an insulator 150 over the conductor 120 and the insulator 130. Here, at least parts of the conductor 110, the insulator 130, and the conductor 120 are positioned in the opening formed in the insulator 114 and the insulator 140.

The conductor 110 functions as a lower electrode of the capacitor 100, the conductor 120 functions as an upper electrode of the capacitor 100, and the insulator 130 functions as a dielectric of the capacitor 100. The capacitor 100 has a structure in which the upper electrode and the lower electrode face each other with the dielectric positioned therebetween on a side surface as well as the bottom surface of the opening in the insulator 114 and the insulator 140; hence, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used for the insulator 280 can be used for the insulator 114 and the insulator 150. The insulator 140 preferably functions as an etching stopper at the time of forming the opening in the insulator 114 and is formed using an insulator that can be used for the insulator 214.

The shape of the opening formed in the insulator 114 and the insulator 140 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 110 is positioned in contact with the opening formed in the insulator 140 and the insulator 114. The top surface of the conductor 110 is preferably substantially level with the top surface of the insulator 140. A conductor 152 provided over the insulator 160 is in contact with the bottom surface of the conductor 110. The conductor 110 is preferably deposited by an ALD method, a CVD method, or the like and is formed using a conductor that can be used for the conductor 205, for example.

The insulator 130 is positioned to cover the conductor 110 and the insulator 140. The insulator 130 is preferably deposited by an ALD method or a CVD method, for example. The insulator 130 can be provided as stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for example.

For the insulator 130, a material with high dielectric strength, such as silicon oxynitride, or a high dielectric constant (high-k) material is preferably used. Alternatively, a stacked-layer structure using a material with high dielectric strength and a high permittivity (high-k) material may be employed.

Examples of an insulator of a high permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can ensure sufficient capacitance of the capacitor 100 even when the insulator 130 has a large thickness. When the insulator 130 has a large thickness, leakage current generated between the conductor 110 and the conductor 120 can be inhibited.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator with high dielectric strength can increase the dielectric strength and inhibit electrostatic breakdown of the capacitor 100.

The conductor 120 is positioned to fill the opening formed in the insulator 140 and the insulator 114. The conductor 120 is electrically connected to the wiring 1005 through a conductor 112 and a conductor 153. The conductor 120 is preferably deposited by an ALD method, a CVD method, or the like and is formed using a conductor that can be used for the conductor 205, for example.

Since the transistor 200 has a structure in which an oxide semiconductor is used, the transistor 200 is highly compatible with the capacitor 100. Specifically, since the transistor 200 containing an oxide semiconductor has a low off-state current, a combination of the transistor 200 and the capacitor 100 enables stored data to be retained for a long time.

<Wiring Layer>

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are provided to be stacked in this order as interlayer films over the transistor 300. Moreover, a conductor 328, a conductor 330, and the like that are electrically connected to the conductor 153 functioning as a terminal are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 12, an insulator 350, an insulator 352, and an insulator 354 are provided to be stacked in this order. A conductor 356 is formed in the insulator 350, the insulator 352, and the insulator 354. The conductor 356 functions as a plug or a wiring.

An insulator 210, an insulator 212, the insulator 214, and the insulator 216 are stacked in this order over the insulator 354 and the conductor 356. A conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the transistor 300.

The conductor 112, conductors (the conductor 120 and the conductor 110) included in the capacitor 100, and the like are embedded in the insulator 114, the insulator 140, the insulator 130, the insulator 150, and an insulator 154. Note that the conductor 112 functions as a plug or a wiring that electrically connects the capacitor 100, the transistor 200, or the transistor 300 to the conductor 153 functioning as a terminal.

The conductor 153 is provided over the insulator 154, and the conductor 153 is covered with an insulator 156. Here, the conductor 153 is in contact with the top surface of the conductor 112 and functions as a terminal of the capacitor 100, the transistor 200, or the transistor 300.

Examples of an insulator that can be used for an interlayer film include an oxide, a nitride, an oxynitride, a nitride oxide, a metal oxide, a metal oxynitride, and a metal nitride oxide, each of which has an insulating property. For example, when a material with a low dielectric constant is used for the insulator functioning as an interlayer film, the parasitic capacitance generated between wirings can be reduced. Thus, a material is preferably selected depending on the function of an insulator.

For example, for the insulator 320, the insulator 322, the insulator 326, the insulator 352, the insulator 354, the insulator 212, the insulator 114, the insulator 150, the insulator 156, and the like, an insulator with a low dielectric constant is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (nylon, aramid, and the like), polyimide, polycarbonate, and acrylic.

It is preferable that the resistivity of an insulator provided over or under the conductor 152 or the conductor 153 be higher than or equal to $1.0 \times 10^{12}$ Ωcm and lower than or equal to $1.0 \times 10^{15}$ Ωkm, preferably higher than or equal to $5.0 \times 10^{12}$ Ωcm and lower than or equal to $1.0 \times 10^{14}$ Ωkm, further preferably higher than or equal to $1.0 \times 10^{13}$ Ωcm and lower than or equal to $5.0 \times 10^{13}$ Ωcm. The resistivity of the insulator provided over or under the conductor 152 or the conductor 153 is preferably within the above range, in which case the insulator can disperse charges accumulated between the transistor 200, the transistor 300, the capacitor 100, and wirings such as the conductor 152 while maintaining the insulating property, and thus, poor characteristics and electrostatic breakdown of the transistor and the semiconductor device including the transistor due to the charges can be inhibited. For such an insulator, silicon nitride or silicon nitride oxide can be used. For example, the resistivity of the insulator 160 or the insulator 154 can be set within the above range.

When a transistor using an oxide semiconductor is surrounded by an insulator having a function of inhibiting passage of oxygen and impurities such as hydrogen, the electrical characteristics of the transistor can be stable. Thus, an insulator having a function of inhibiting passage of oxygen and impurities such as hydrogen is used for the insulator 324, the insulator 350, the insulator 210, and like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electric conductivity, typified by polycrystalline silicon containing an impurity element such as phosphorus, or silicide such as nickel silicide may be used.

For example, for the conductor 328, the conductor 330, the conductor 356, the conductor 218, the conductor 112, the conductor 152, the conductor 153, and the like, a single layer or stacked layers of a conductive material such as a metal material, an alloy material, a metal nitride material, a metal oxide material, and the like that are formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is sometimes provided in the vicinity of the oxide semiconductor. In that case, an insulator having a barrier property is preferably provided between the insulator including the excess-oxygen region and a conductor provided in the insulator including the excess-oxygen region.

For example, the insulator 247 is preferably provided between the insulator 280 containing excess oxygen and the conductor 248 in FIG. 12. When the insulator 247 is provided in contact with the insulator 282, the conductor 248 and the transistor 200 can be sealed by the insulators having a barrier property.

That is, the excess oxygen contained in the insulator 280 can be inhibited from being absorbed by the conductor 248 when the insulator 247 is provided. In addition, by including the insulator 247, the diffusion of hydrogen, which is an impurity, into the transistor 200 through the conductor 248 can be inhibited.

Here, the conductor 248 functions as a plug or a wiring that is electrically connected to the transistor 200 or the transistor 300.

Specifically, the insulator 247 is provided in contact with a side wall of the opening in the insulator 284, the insulator 282, and the insulator 280, and the conductor 248 is formed in contact with its side surface. The conductor 240 is located on at least part of the bottom portion of the opening, and the conductor 248 is in contact with the conductor 240.

The conductor 248 is preferably formed using a conductive material containing tungsten, copper, or aluminum as its main component. The conductor 248 may have a stacked-layer structure. Although the transistor 200 having a structure in which the conductor 248 has a stacked-layer structure of two layers is illustrated, the present invention is not limited thereto. For example, the conductor 248 may be provided as a single layer or to have a stacked-layer structure of three or more layers.

In the case where the conductor 248 has a stacked-layer structure, a conductive material having a function of inhibiting passage of impurities such as water and hydrogen is preferably used as a conductor that is in contact with the conductor 240 and in contact with the insulator 280, the insulator 282, and the insulator 284 with the insulator 247 therebetween. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. The use of the conductive material can prevent oxygen added to the insulator 280 from being absorbed by the conductor 248. Moreover, impurities such as water and hydrogen contained in a layer above the insulator 284 can be inhibited from diffusing into the oxide 230 through the conductor 248.

As the insulator 247, for example, an insulator that can be used as the insulator 214 or the like is used. The insulator 247 can inhibit diffusion of impurities such as water and hydrogen contained in the insulator 280 and the like into the oxide 230 through the conductor 248. In addition, oxygen contained in the insulator 280 can be prevented from being absorbed by the conductor 248.

Although not illustrated, the conductor 152 functioning as a wiring may be placed in contact with the top surface of the top surface of the conductor 248. For the conductor functioning as a wiring, a conductive material containing tungsten, copper, or aluminum as its main component is preferably used. The conductor may have a stacked-layer structure and may be a stack of titanium or titanium nitride and the conductive material, for example. Note that the conductor may be formed to be embedded in an opening provided in an insulator.

The above is the description of the structure example. With the use of this structure, a semiconductor device using a transistor including an oxide semiconductor can be miniaturized or highly integrated. Alternatively, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided.

[Memory Device 2]

Figure 13:
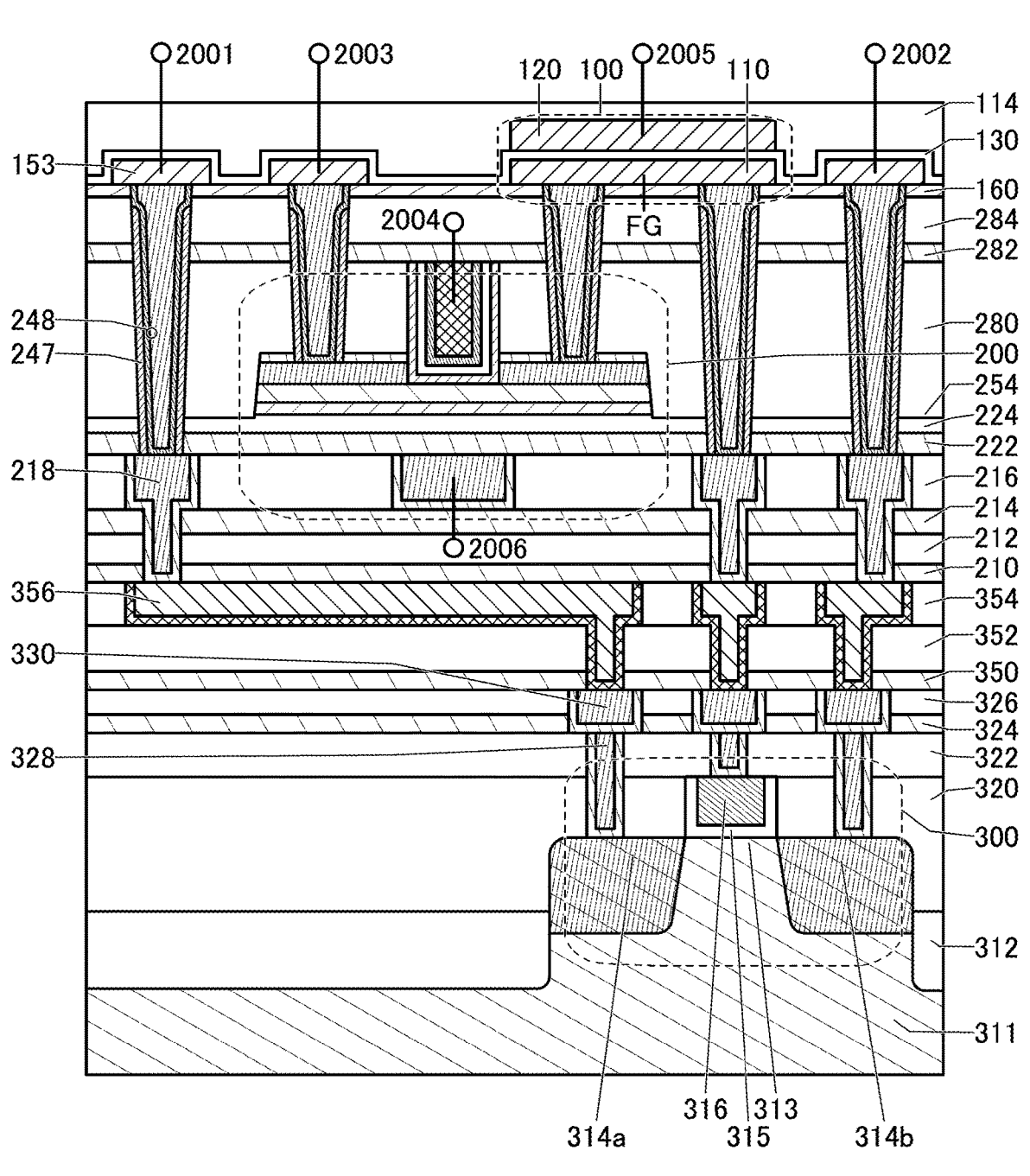
FIG. 13 is a cross-sectional view of a semiconductor device of one embodiment of the present invention.

FIG. 13 illustrates an example of a semiconductor device (memory device) using the semiconductor device of one embodiment of the present invention. Like the semiconductor device illustrated in FIG. 12, the semiconductor device illustrated in FIG. 13 includes the transistor 200, the transistor 300, and the capacitor 100. Note that the semiconductor device illustrated in FIG. 13 differs from the semiconductor device illustrated in FIG. 12 in that the capacitor 100 is a planar capacitor and that the transistor 200 is electrically connected to the transistor 300.

In the semiconductor device of one embodiment of the present invention, the transistor 200 is provided above the transistor 300, and the capacitor 100 is provided above the transistor 300 and the transistor 200. At least part of the capacitor 100 or the transistor 300 preferably overlaps with the transistor 200. Accordingly, an area occupied by the capacitor 100, the transistor 200, and the transistor 300 in a top view can be reduced, whereby the semiconductor device of this embodiment can be miniaturized or highly integrated.

Note that the transistor 200 and the transistor 300 mentioned above can be used as the transistor 200 and the transistor 300, respectively. Therefore, the above description can be referred to for the transistor 200, the transistor 300, and the layers including them.

In the semiconductor device illustrated in FIG. 13, a wiring 2001 is electrically connected to the source of the transistor 300, and a wiring 2002 is electrically connected to the drain of the transistor 300. A wiring 2003 is electrically connected to one of the source and the drain of the transistor 200, a wiring 2004 is electrically connected to the first gate of the transistor 200, and a wiring 2006 is electrically connected to the second gate of the transistor 200. The gate of the transistor 300 and the other of the source and the drain of the transistor 200 are electrically connected to one electrode of the capacitor 100, and a wiring 2005 is electrically connected to the other electrode of the capacitor 100. Note that a node where the gate of the transistor 300, the other of the source and the drain of the transistor 200, and the one electrode of the capacitor 100 are connected to each other is hereinafter referred to as a node FG in some cases.

The semiconductor device illustrated in FIG. 13 is capable of retaining the potential of the gate of the transistor 300 (the node FG) by switching of the transistor 200; thus, data writing, retention, and reading can be performed.

By arranging the semiconductor devices illustrated in FIG. 13 in a matrix, a memory cell array can be formed.

The layer including the transistor 300 has the same structure as that in the semiconductor device illustrated in FIG. 12, and therefore, the above description can be referred to for the structure below the insulator 354.

The insulator 210, the insulator 212, the insulator 214, and the insulator 216 are positioned over the insulator 354. Here, like the insulator 350 and the like, the insulator 210 is preferably an insulator having a function of inhibiting passage of oxygen and impurities such as hydrogen.

The conductor 218 is embedded in the insulator 210, the insulator 212, the insulator 214, and the insulator 216. The conductor 218 functions as a plug or a wiring that is electrically connected to the capacitor 100, the transistor 200, or the transistor 300. For example, the conductor 218 is electrically connected to the conductor 316 functioning as the gate electrode of the transistor 300.

The conductor 248 functions as a plug or a wiring that is electrically connected to the transistor 200 or the transistor 300. For example, the conductor 248 electrically connects the conductor 240*b* functioning as the other of the source and the drain of the transistor 200 and the conductor 110 functioning as one electrode of the capacitor 100 through the conductor 248.

The planar capacitor 100 is provided above the transistor 200. The capacitor 100 includes the conductor 110 functioning as a first electrode, the conductor 120 functioning as a second electrode, and the insulator 130 functioning as a dielectric. Note that as the conductor 110, the conductor 120, and the insulator 130, those described above in Memory device 1 can be used.

The conductor 153 and the conductor 110 are provided in contact with the top surface of the conductor 248. The conductor 153 is in contact with the top surface of the conductor 248 and functions as a terminal of the transistor 200 or the transistor 300.

The conductor 153 and the conductor 110 are covered with the insulator 130, and the conductor 120 is positioned to overlap with the conductor 110 with the insulator 130 therebetween. In addition, the insulator 114 is positioned over the conductor 120 and the insulator 130.

Although FIG. 13 illustrates an example in which a planar capacitor is used as the capacitor 100, the semiconductor device of this embodiment is not limited thereto. For example, the capacitor 100 may be a cylinder capacitor 100 like that illustrated in FIG. 12.

[Memory Device 3]

Figure 14:
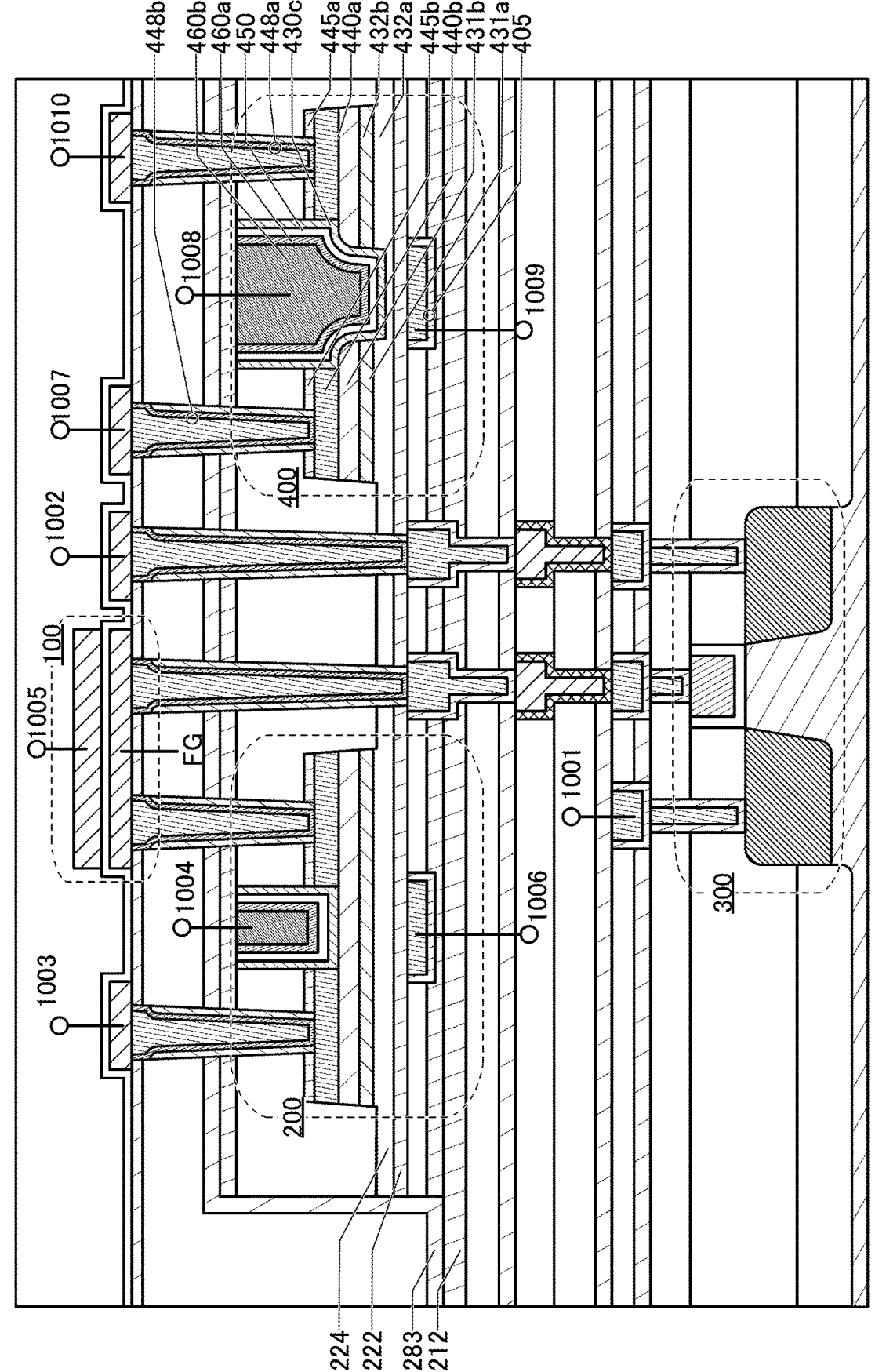
FIG. 14 is a cross-sectional view illustrating a structure of a memory device of one embodiment of the present invention.

FIG. 14 illustrates an example of a memory device using the semiconductor device of one embodiment of the present invention. The memory device illustrated in FIG. 14 includes a transistor 400 in addition to the semiconductor device including the transistor 200, the transistor 300, and the capacitor 100 illustrated in FIG. 13.

The transistor 400 can control a second gate voltage of the transistor 200. For example, a first gate and a second gate of the transistor 400 are diode-connected to a source of the transistor 400, and the source of the transistor 400 is connected to the second gate of the transistor 200. When a negative potential of the second gate of the transistor 200 is retained in this structure, the first gate-source voltage and the second gate-source voltage of the transistor 400 become 0 V. In the transistor 400, a drain current at the time when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

Hence, in FIG. 14, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to the back gate of the transistor 200. The gate of the transistor 300 and the other of the source and the drain of the transistor 200 are electrically connected to one electrode of the capacitor 100, and the wiring 1005 is electrically connected to the other electrode of the capacitor 100. The wiring 1007 is electrically connected to the source of the transistor 400, a wiring

1008 is electrically connected to the gate of the transistor 400, a wiring 1009 is electrically connected to the back gate of the transistor 400, and a wiring 1010 is electrically connected to a drain of the transistor 400. The wiring 1006, the wiring 1007, the wiring 1008, and the wiring 1009 are electrically connected to each other.

When the memory devices illustrated in FIG. 14 are arranged in a matrix like the memory devices illustrated in FIG. 12 and FIG. 13, a memory cell array can be formed. Note that one transistor 400 can control the second gate voltages of a plurality of transistors 200. For this reason, the number of transistors 400 is preferably smaller than the number of transistors 200.

<Transistor 400>

The transistor 400 and the transistors 200 are formed in the same layer and thus can be fabricated in parallel. The transistor 400 includes a conductor 460 (a conductor 460*a* and a conductor 460*b*) functioning as the first gate electrode, a conductor 405 functioning as the second gate electrode, the insulator 222, the insulator 224, and an insulator 450 functioning as a gate insulating layer, an oxide 430*c* including a region where a channel is formed, a conductor 440*a*, an oxide 431*a*, and an oxide 431*b* functioning as one of the source and the drain, a conductor 440*b*, an oxide 432*a*, and an oxide 432*b* functioning as the other of the source and the drain, and an insulator 445*a* and an insulator 445*b* functioning as a barrier layer.

The conductor 405 in the transistor 400 is in the same layer as the conductor 205. The oxide 431*a* and the oxide 432*a* are in the same layer as the oxide 230*a*, and the oxide 431*b* and the oxide 432*b* are in the same layer as the oxide 230*b*. The conductor 440 (the conductor 440*a* and the conductor 440*b*) is in the same layer as the conductor 240. The insulator 445 (the insulator 445*a* and the insulator 445*b*) is in the same layer as the insulator 245. The oxide 430*c* is in the same layer as the oxide 230*c*. The insulator 450 is in the same layer as the insulator 250. The conductor 460 is in the same layer as the conductor 260.

Note that the components formed in the same layer can be formed at the same time. For example, the oxide 430*c* can be formed by processing an oxide film to be the oxide 230*c*.

In the oxide 430*c* functioning as an active layer of the transistor 400, oxygen vacancies and impurities such as hydrogen and water are reduced, as in the oxide 230 or the like. Accordingly, the threshold voltage of the transistor 400 can be higher than 0 V, the off-state current can be reduced, and the drain current at the time when the second gate voltage and the first gate voltage are 0 V can be extremely low.

This embodiment can be implemented in an appropriate combination with the structures described in the other embodiments and the like.

This embodiment can be implemented in an appropriate combination with the structures described in the other embodiments, examples, and the like.

Embodiment 3

In this embodiment, a memory device of one embodiment of the present invention including a transistor in which an oxide is used as a semiconductor (hereinafter referred to as an OS transistor in some cases) and a capacitor (hereinafter such a memory device is also referred to as an OS memory device in some cases) will be described with reference to FIG. 15 and FIG. 16. The OS memory device is a memory device including at least a capacitor and an OS transistor that controls the charging and discharging of the capacitor. Since the OS transistor exhibits an extremely low off-state current, the OS memory device has excellent retention characteristics and thus can function as a nonvolatile memory.

<Configuration Example of Memory Device>

Figures 15A, 15B:
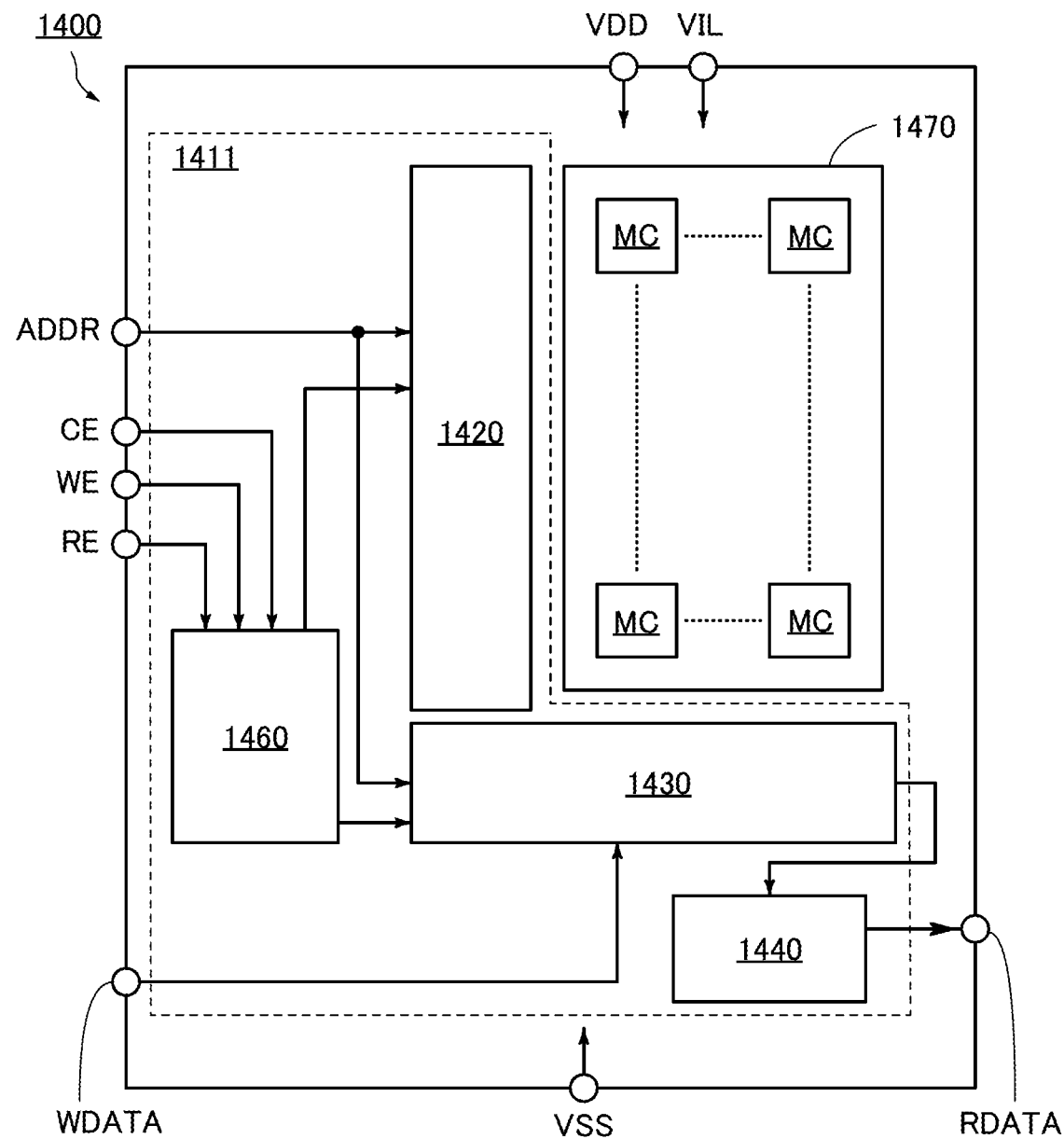
FIG. 15A is a block diagram illustrating a structure example of a memory device of one embodiment of the present invention.
FIG. 15B is a perspective view.

FIG. 15A illustrates a configuration example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, and a write circuit. The precharge circuit has a function of precharging wirings. The sense amplifier has a function of amplifying a data signal read from a memory cell. Note that the wirings are connected to memory cells included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE denotes a chip enable signal, WE denotes a write enable signal, and RE denotes a read-out enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the configuration of the memory cell MC, the number of memory cells MC in one column, and the like. The number of wirings that connect the memory cell array 1470 to the column circuit 1430 depends on the configuration of the memory cell MC, the number of memory cells MC in one row, and the like.

Note that FIG. 15A shows an example in which the peripheral circuit 1411 and the memory cell array 1470 are formed on the same plane; however, this embodiment is not limited thereto. For example, as shown in FIG. 15B, the memory cell array 1470 may be provided over part of the peripheral circuit 1411 so that they overlap. For example, the sense amplifier may be provided below the memory cell array 1470 so that they overlap.

FIG. 16 illustrates configuration examples of a memory cell applicable to the memory cell MC.

[DOSRAM]

FIG. 16A to FIG. 16C illustrate circuit configuration examples of a memory cell of a DRAM. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 16A includes a transistor M1 and a capacitor CA. Note that the transistor M1 includes a gate (also referred to as a top gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 16A corresponds to the memory device illustrated in FIG. 12. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 illustrated in FIG. 12 corresponds to a transistor provided in the peripheral circuit 1411 of the memory device 1400 illustrated in FIG. 15B.

The memory cell MC is not limited to the memory cell 1471, and the circuit configuration can be changed. For example, as in a memory cell 1472 illustrated in FIG. 16B, the back gate of the transistor M1 may be connected not to the wiring BGL but to the wiring WOL in the memory cell MC. As another example, the memory cell MC may be configured with a single-gate transistor, that is, the transistor M1 that does not have a back gate, like a memory cell 1473 in FIG. 16C.

In the case where the semiconductor device described in the above embodiment is used in the memory cell 1471 or the like, the transistor 200 can be used as the transistor M1, and the capacitor 100 can be used as the capacitor CA. The use of an OS transistor as the transistor M1 enables leakage current of the transistor M1 to be extremely low. That is, with the use of the transistor M1, written data can be retained for a long period of time; thus, the frequency of refresh operation for the memory cell can be decreased. Alternatively, refresh operation for the memory cell can be omitted. Since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 to overlap with the memory cell array 1470 as described above, the bit line can be shortened. This reduces bit line capacity, which reduces the storage capacity of the memory cell.

[NOSRAM]

FIG. 16D to FIG. 16G illustrate circuit configuration examples of a gain-cell type memory cell including two transistors and one capacitor. A memory cell 1474 illustrated in FIG. 16D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Here, the memory cell 1474 illustrated in FIG. 16D corresponds to the memory device illustrated in FIG. 13. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 2003, the wiring 2004, the wiring 2006, the wiring 2005, the wiring 2002, and the wiring 2001, respectively.

The memory cell MC is not limited to the memory cell 1474, and the circuit configuration can be changed as appropriate. For example, like a memory cell 1475 illustrated in FIG. 16E, the memory cell MC may have a configuration in which the back gate of the transistor M2 is connected not to the wiring BGL but to the wiring WOL. As another example, like a memory cell 1476 in FIG. 16F, the memory cell MC may be a memory cell including a single-gate transistor, that is, the transistor M2 that does not include a back gate. As another example, the memory cell MC may have a configuration in which the wiring WBL and the wiring RBL are combined into one wiring BIL as in a memory cell 1477 in FIG. 16G.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. The use of an OS transistor as the transistor M2 enables the leakage current of the transistor M2 to be extremely low. Consequently, with the use of the transistor M2, written data can be retained for a long period of time, and thus the frequency of refresh operation for the memory cell can be decreased. Alternatively, refresh operation for the memory cell can be omitted. Since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor.

Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistor M2 and the transistor M3, the circuit of the memory cell array 1470 can be configured using only n-channel transistors.

FIG. 16H illustrates an example of a gain-cell type memory cell including three transistors and one capacitor. A memory cell 1478 illustrated in FIG. 16H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not need to include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be configured using only n-channel transistors.

In the case where the semiconductor device described in the above embodiment is used in the memory cell 1478, the transistor 200 can be used as the transistor M4, the transistor 300 can be used as the transistor M5 and the transistor M6, and the capacitor 100 can be used as the capacitor CC. The use of an OS transistor as the transistor M4 enables the leakage current of the transistor M4 to be extremely low.

Note that the configurations of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

The structure described in this embodiment can be used in an appropriate combination with the structures described in the other embodiments, examples, and the like.

Embodiment 4

In this embodiment, an example of a chip 1200 on which a semiconductor device of the present invention is mounted will be described using FIG. 17. A plurality of circuits (systems) are mounted on the chip 1200. The technology for integrating a plurality of circuits (systems) into one chip is referred to as system-on-chip (SoC) in some cases.

Figure 17A:
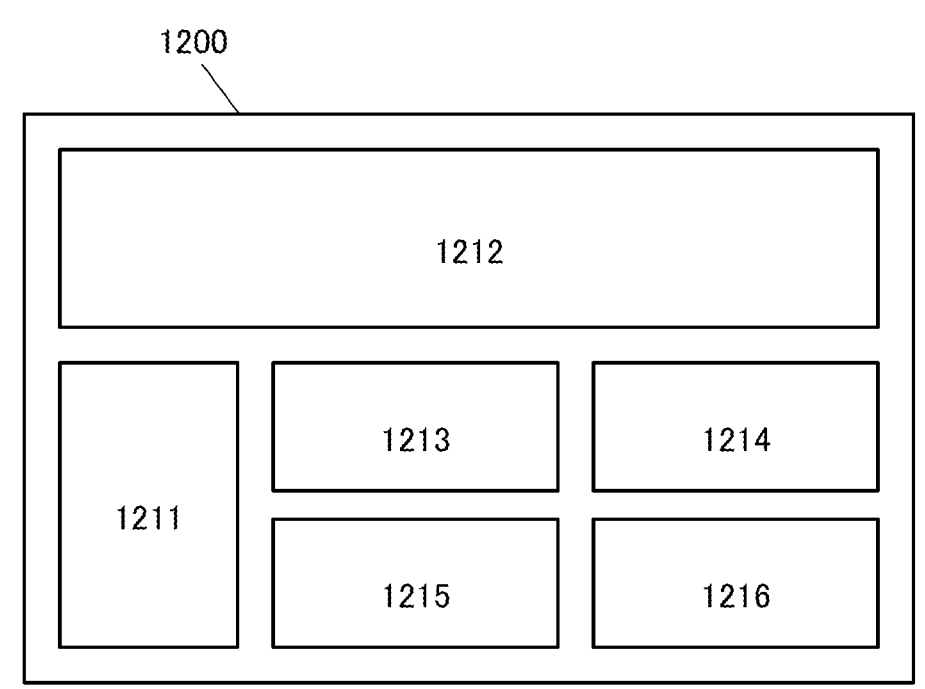
FIG. 17A is a block diagram of a semiconductor device of one embodiment of the present invention.

As illustrated in FIG. 17A, the chip 1200 includes a CPU 1211, a GPU 1212, one or more of analog arithmetic units 1213, one or more of memory controllers 1214, one or more of interfaces 1215, one or more of network circuits 1216, and the like.

Figure 17B:
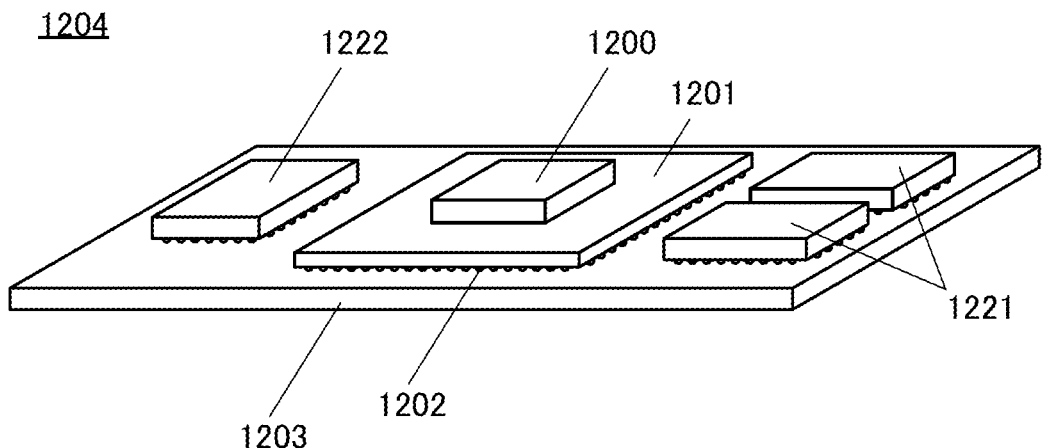
FIG. 17B is a schematic view.

A bump (not illustrated) is provided on the chip 1200 and is connected to a first surface of a printed circuit board (PCB) 1201 as shown in FIG. 17B. A plurality of bumps 1202 are provided on the rear side of the first surface of the PCB 1201, whereby the PCB 1201 is connected to a motherboard 1203.

Memory devices such as DRAMs 1221 and a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for temporarily storing data. Alternatively, a common memory for the CPU 1211 and the GPU 1212 may be provided on the chip 1200. The NOSRAM or the DOSRAM described above can be used as the memory. The GPU 1212 is suitable for parallel computation of a number of data and thus can be used for image processing or a product-sum operation. When an image processing circuit or a product-sum operation circuit using an oxide semiconductor of the present invention is provided in the GPU 1212, image processing and product-sum operation can be performed with low power consumption.

Since the CPU 1211 and the GPU 1212 are provided on the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a circuit for a network such as a LAN (Local Area Network). The network circuit 1216 may also include a circuit for network security.

The circuits (systems) can be formed on the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using the SoC technology, and thus can have a small size. The GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments, examples, and the like.

Embodiment 5

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, a computer refers not only to a tablet computer, a notebook computer, and a desktop computer, but also to a large computer such as a server system. Alternatively, the semiconductor device described in the above embodiment is applied to a variety of removable memory devices such as memory cards (e.g., SD cards), USB memories, and SSDs (solid state drives). FIG. 18 schematically illustrates some structure examples of removable memory devices. The semiconductor device described in the above embodiment is processed into a packaged memory chip and used in a variety of storage devices and removable memories, for example.

Figures 18A, 18B, 18C, 18D, 18E:
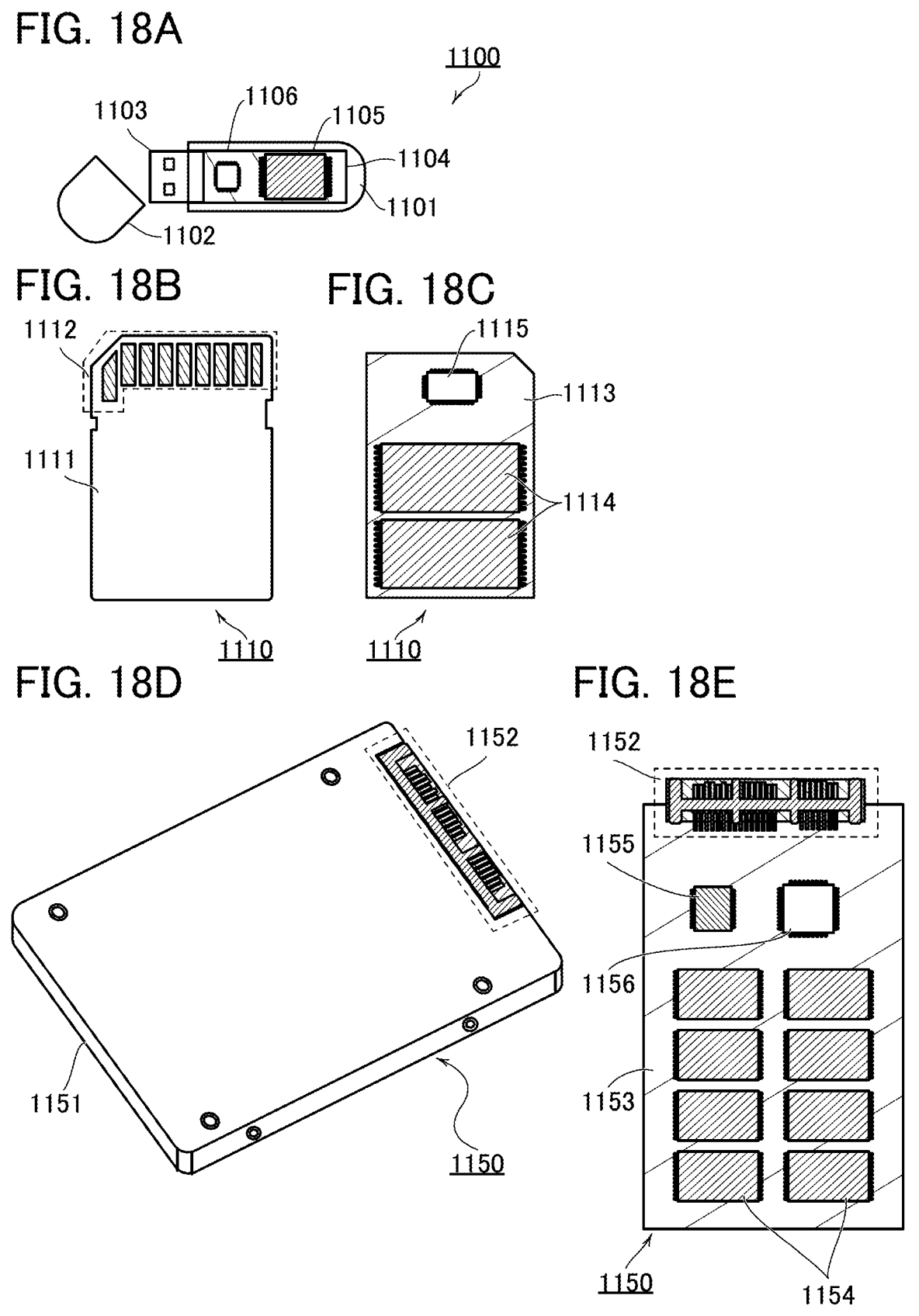

FIG. 18A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

FIG. 18B is a schematic external view of an SD card, and FIG. 18C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. In that case, data can be read from and written to the memory chip 1114 through radio communication between a host device and the SD card 1110. The semiconductor device described in the above embodiment can be incorporated in the memory chip 1114 or the like on the substrate 1113.

FIG. 18D is a schematic external view of an SSD, and FIG. 18E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments, examples, and the like.

Embodiment 6

The semiconductor device of one embodiment of the present invention can be used in a processor such as a CPU and a GPU or a chip. FIG. 19 illustrates specific examples of electronic devices including processors such as CPUs and GPUs, or chips of one embodiment of the present invention.
<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium. FIG. 19 illustrates examples of electronic devices.
[Information Terminal]

Figures 19A, 19B, 19C, 19D, 19E, 19F, 19G, 19H:
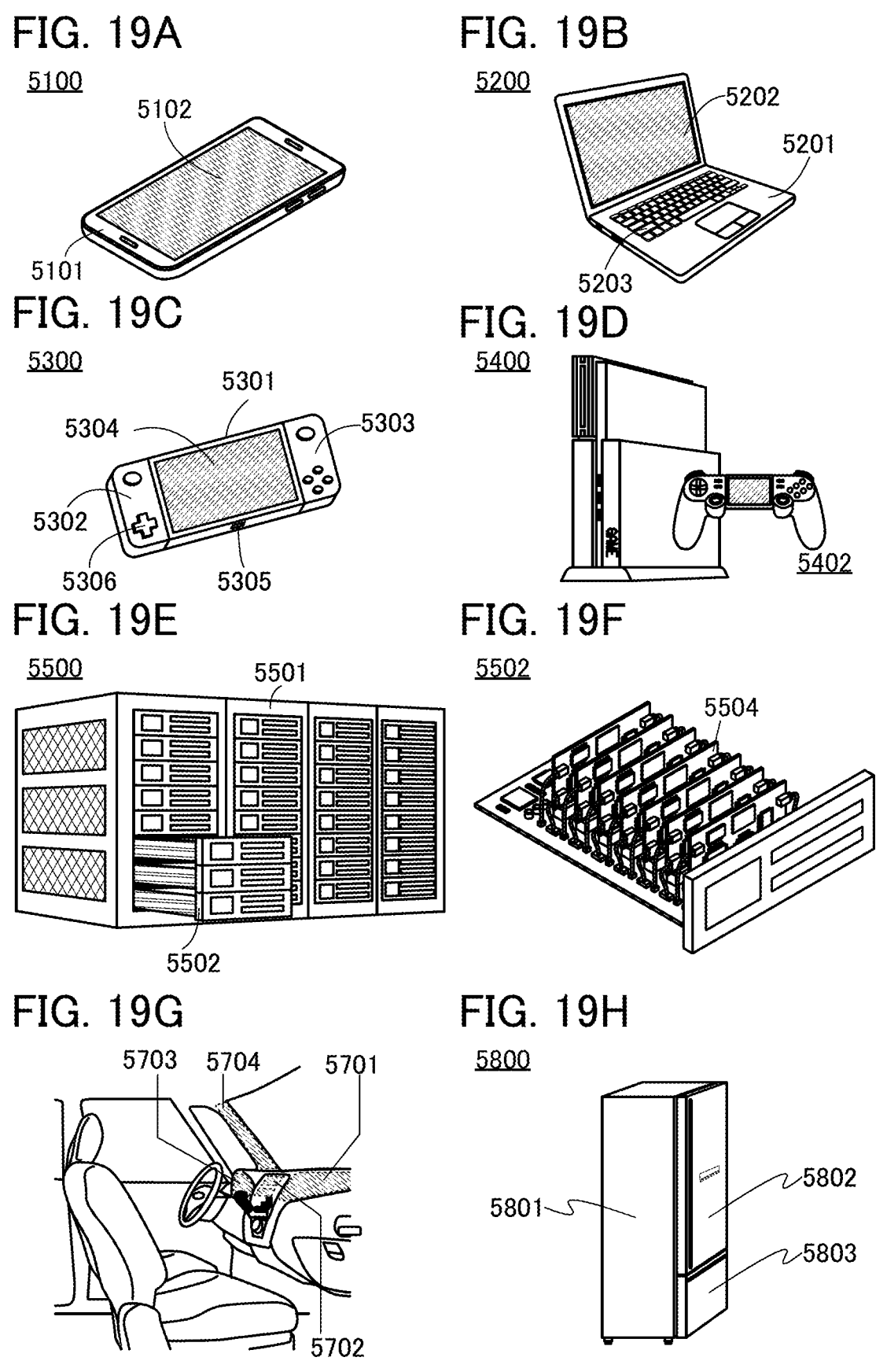

FIG. 19A illustrates a mobile phone (smartphone), which is a type of information terminal. An information terminal 5100 includes a housing 5101 and a display portion 5102. As input interfaces, a touch panel is provided in the display portion 5102, and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

FIG. 19B illustrates a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence when the chip of one embodiment of the present invention is applied to the notebook information terminal 5200. Examples of the application utilizing artificial intelligence include design-support software, text correction software, and software for automatic menu generation. Furthermore, with the use of the notebook information terminal 5200, novel artificial intelligence can be developed.

Note that although FIG. 19A and FIG. 19B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.
[Game Machines]

FIG. 19C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302, and the housing 5303, for example.

FIG. 19D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 19C and FIG. 19D, the game machine using the GPU or the chip of one embodiment of the present invention is not limited thereto. Examples of game machines to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

FIG. 19E illustrates a supercomputer 5500 as an example of a large computer. FIG. 19F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific and technological computation. In scientific and technological computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, the peripheral circuit, and the module can be reduced.

Although a supercomputer is shown as an example of a large computer in FIG. 19E and FIG. 19F, a large computer using the GPU or the chip of one embodiment of the present invention is not limited thereto. Examples of large computers to which the GPU or the chip of one embodiment of the present invention is applied include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

FIG. 19G illustrates an area around a windshield inside an automobile, which is an example of a moving vehicle. FIG. 19G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. The content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

FIG. 19H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as an example of a household appliance, other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments, examples, and the like.

Example 1

In this example, a stacked-layer structure including an insulator of one embodiment of the present invention was fabricated and analyzed with SIMS. Note that Sample 1A to Sample 1H were fabricated in this example.

<1. Structure and Fabrication Method of Samples>

Figures 20A, 20B:
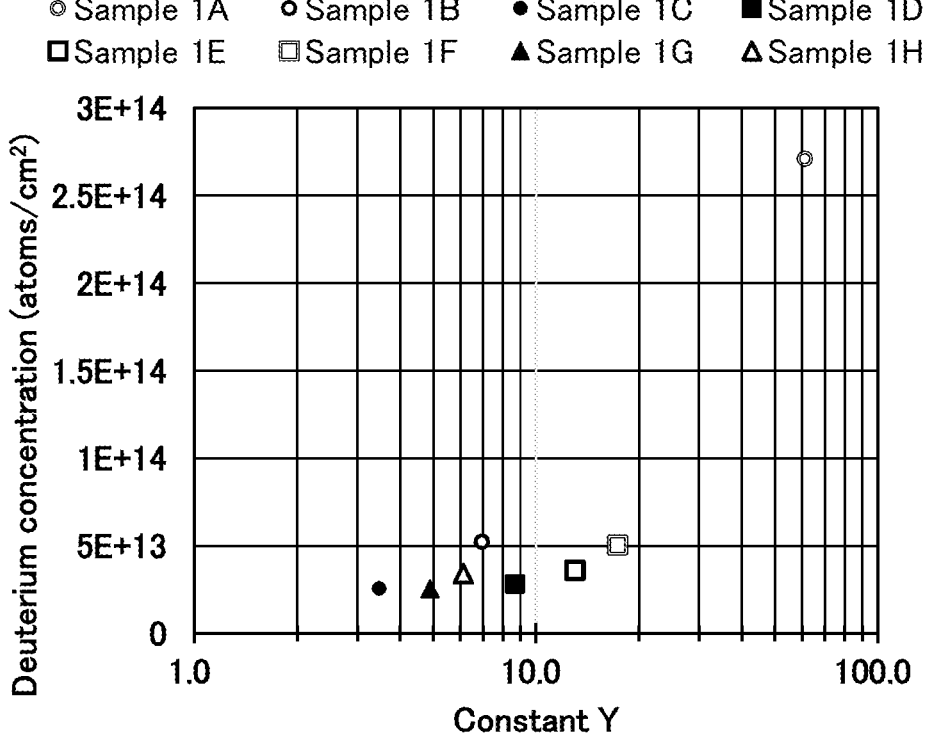
FIG. 20A is a schematic view of a sample of Example.
FIG. 20B is a graph showing the added concentration of deuterium.

Sample 1A, Sample 1B, Sample 1C, Sample 1D, Sample 1E, Sample 1F, Sample 1G, and Sample 1H according to one embodiment of the present invention are described below. FIG. 20A illustrates the structure of Sample 1A to Sample 1H. Sample 1A to Sample 1H each include a substrate 900, an insulator 914 over the substrate 900, an insulator 916 over the insulator 914, an insulator 922 over the insulator 916, an oxide semiconductor 930 (an oxide semiconductor 930a, an oxide semiconductor 930b, an oxide semiconductor 930c, and an oxide semiconductor 903d) over the insulator 922, and an insulator 950 over the oxide semiconductor 930.

Next, a method for fabricating the samples is described.

First, a silicon substrate was prepared as the substrate 900. Then, a 100-nm-thick thermal oxide film was formed as the insulator 914 over the substrate 900.

Next, a 20-nm-thick hafnium oxide film was formed as the insulator 916 over the insulator 914. Then, a 30-nm-thick silicon oxynitride film was formed as the insulator 922 over the insulator 916.

Next, a 5-nm-thick oxide semiconductor 930a containing In, Ga, and Zn was deposited over the insulator 922 by a sputtering method. The oxide semiconductor 930a was deposited under the conditions where an oxide target containing In, Ga, and Zn (an atomic ratio of In:Ga:Zn=1:3:4) was used, oxygen ($O_2$) at a flow rate of 45 sccm was used as a deposition gas, the deposition pressure was 0.7 Pa, the deposition power was 500 W, the substrate temperature was 130° C., and the target-substrate distance was 60 mm. Subsequently, a 15-nm-thick oxide semiconductor 930b containing In, Ga, and Zn was deposited over the oxide semiconductor 930a by a sputtering method. The oxide semiconductor 930b was deposited under the conditions where an oxide target containing In, Ga, and Zn (an atomic ratio of In:Ga:Zn=4:2:4.1) was used, oxygen ($O_2$) at a flow rate of 45 sccm was used as a deposition gas, the deposition pressure was 0.7 Pa, the deposition power was 500 W, the substrate temperature was 130° C., and the target-substrate distance was 60 mm.

Next, heat treatment was performed in a reduced-pressure atmosphere at 200° C. for five minutes.

Then, an 8-nm-thick oxide semiconductor 930c containing In, Ga, and Zn was deposited over the oxide semiconductor 930b by a sputtering method. The oxide semiconductor 930c was deposited under the conditions where an oxide target containing In, Ga, and Zn (an atomic ratio of In:Ga:Zn=4:2:4.1) was used, oxygen ($O_2$) at a flow rate of 45 sccm was used as a deposition gas, the deposition pressure was 0.7 Pa, the deposition power was 500 W, the substrate temperature was 130° C., and the target-substrate distance was 60 mm. Subsequently, an 8-nm-thick oxide semiconductor 930b containing In, Ga, and Zn was deposited over the oxide semiconductor 930a by a sputtering method. An oxide semiconductor 930d was deposited under the conditions where an oxide target containing In, Ga, and Zn (an atomic ratio of In:Ga:Zn=1:3:4) was used, oxygen ($O_2$) at a flow rate of 45 sccm was used as a deposition gas, the deposition pressure was 0.7 Pa, the deposition power was 500 W, the substrate temperature was 130° C., and the target-substrate distance was 60 mm.

Next, a 10.8-nm-thick silicon oxide film was deposited as the insulator 950 over the oxide semiconductor 930d by a CVD method. Here, the deposition conditions of Sample 1A to Sample 1H are shown in Table 1.

By adding deuterium ($D_2$) at a flow rate of 200 sccm during the deposition of the insulator 950, the amount of hydrogen diffused into the component under the insulator 950 during the deposition was examined.

TABLE 1

| Sample name | Constant Y | f [sccm] | PW [W] | P [Pa] | Deposition temp. [° C.] |
|---|---|---|---|---|---|
| Sample 1A | 61.2 | 1.0 | 150 | 200 | 350 |
| Sample 1B | 6.9 | 1.0 | 85 | 40 | 400 |
| Sample 1C | 3.5 | 2.0 | 85 | 40 | 400 |
| Sample 1D | 8.7 | 2.0 | 85 | 100 | 400 |
| Sample 1E | 13.0 | 2.0 | 85 | 150 | 400 |
| Sample 1F | 17.3 | 2.0 | 85 | 200 | 400 |
| Sample 1G | 4.9 | 2.0 | 120 | 40 | 400 |
| Sample 1H | 6.1 | 2.0 | 150 | 40 | 400 |

Through the above steps, Sample 1A to Sample 1H of this example were fabricated. Measurements were performed on Sample 1A to Sample 1H before and after heat treatment assuming a thermal budget in the BEOL process.

Note that the heat treatment was performed in a nitrogen atmosphere at 400° C. for one hour.

<2. Measurement of Amount of Deuterium ($D_2$) in Oxide Semiconductor 930 of Each Sample>

FIG. 20B shows the results of measuring the amount of deuterium in the oxide semiconductor 930 by performing SIMS analysis from the substrate side with the oxide semiconductor 930 of Sample 1A to Sample 1H as a quantitative layer, to detect the deuterium ($D_2$) concentration. Note that the hydrogen concentration evaluation was performed by secondary ion mass spectrometry (SIMS) with the use of a dynamic SIMS apparatus IMS-7f produced by CAMECA SAS as an analysis apparatus.

FIG. 20B shows the concentration [atoms/$cm^2$] of deuterium ($D_2$) calculated by integrating the profile of the deuterium ($D_2$) concentration in the oxide semiconductor 930 serving as the quantitative layer in each sample.

As shown in FIG. 20B, when the constant Y is 0<Y<18, preferably 0<Y≤7.0 in the deposition conditions for the insulator 950, the amount of hydrogen diffused into the component under the insulator 950 (the oxide semiconductor 930 in this example) was reduced in the step of depositing the insulator 950.

In other words, the following were found regarding the deposition power PW [W], the effective electrode area S [$cm^2$], the deposition pressure P [Pa], and the flow rate f [sccm] of a deposition gas containing hydrogen, which are variables for determining the constant Y.

It was found that when the flow rate of the deposition gas flow rate f [sccm] increases, the amount of hydrogen diffused into the underlying component decreases. Meanwhile, it was found that the amount of hydrogen diffused into the underlying component increases as a deposition power per unit area, which is calculated by dividing the deposition power PW [W] by the effective electrode area S [$cm^2$], and the deposition pressure P [Pa] increase.

The amount of increase of hydrogen diffused into the underlying component particularly in the case where the deposition power increased was found to be relatively small. In contrast, in the case where the deposition pressure P [Pa] was increased, the amount of hydrogen diffused into the underlying component increased gradually. It was also found that the increase in the amount of diffused hydrogen along with the increase in the deposition gas flow rate f [sccm] has a sharp slope and the deposition gas flow rate f [sccm] has a greater influence than the deposition power and the deposition pressure P [Pa].

From the above, setting the constant Y to 0<Y<17, preferably 0<Y≤7.0 in the deposition conditions for the insulator provided an insulator that can be deposited without diffusion of hydrogen into the underlying component.

The structure described above in this example can be used in an appropriate combination with the other examples or the other embodiments.

Example 2

In this example, a stacked-layer structure including an insulator of one embodiment of the present invention was fabricated and observed with an optical microscope. Note that Sample 2A to Sample 2I were fabricated in this example.

<1. Structure and Fabrication Method of Samples>

Figures 21A, 21B:
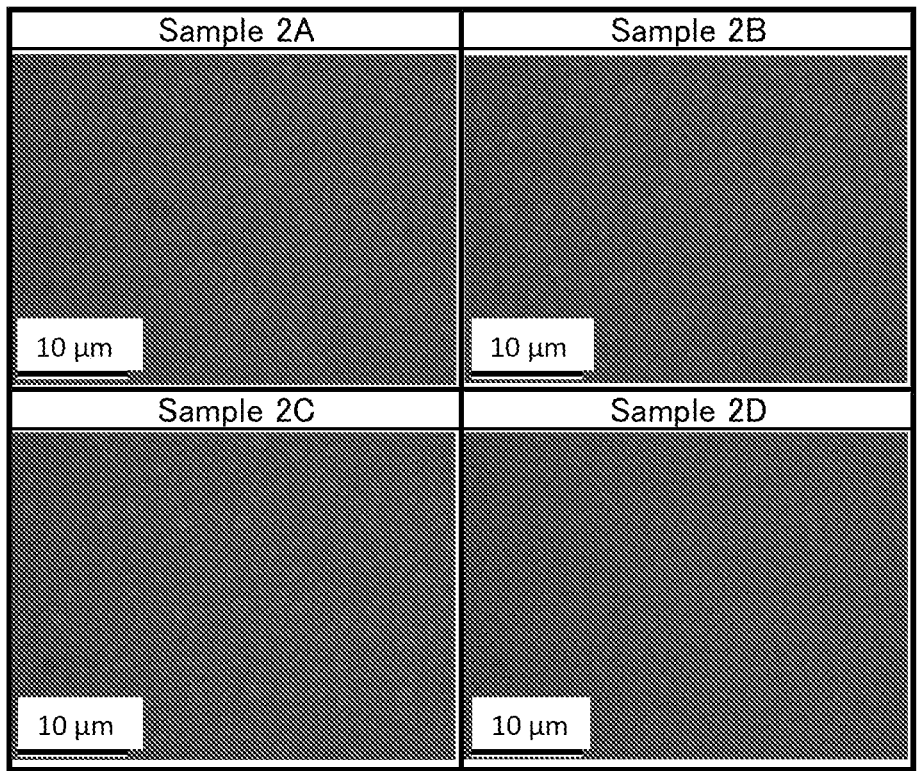
FIG. 21A is a schematic view of a sample of Example.
FIG. 21B shows states of top surfaces.

Sample 2A, Sample 2B, Sample 2C, Sample 2D, Sample 2E, Sample 2F, Sample 2G, Sample 2H, and Sample 2I according to one embodiment of the present invention will be described below. FIG. 21A shows the structure of Sample 2A to Sample 2I. Sample 2A to Sample 2I each include a substrate 800, an insulator 814 over the substrate 800, an insulator 816 over the insulator 814, an insulator 820 over the insulator 816, an insulator 822 over the insulator 820, an insulator 824 over the insulator 822, an oxide semiconductor 830 (an oxide semiconductor 830a and an oxide semiconductor 830b) over the insulator 824, a conductor 840 over the oxide semiconductor 830, an insulator 845 (an insulator 845a and an insulator 845b) over the conductor 840, and an insulator 880 over the insulator 845.

Next, a method for fabricating the samples is described.

First, a silicon substrate was prepared as the substrate 800. Then, a 400-nm-thick thermal oxide film was formed as the insulator 814 over the substrate 800.

Next, a 40-nm-thick aluminum oxide film was formed as the insulator 816 over the insulator 814. Then, a 200-nm-thick silicon oxynitride film was formed as the insulator 820 over the insulator 816.

Subsequently, a 20-nm-thick hafnium oxide film was formed as the insulator 822 over the insulator 820. Then, a 30-nm-thick silicon oxynitride film was formed as the insulator 824 over the insulator 822.

Next, a 5-nm-thick oxide semiconductor 830a containing In, Ga, and Zn was deposited over the insulator 824 by a sputtering method. The oxide semiconductor 830a was deposited under the conditions where an oxide target containing In, Ga, and Zn (an atomic ratio of In:Ga:Zn=1:3:4) was used, oxygen ($O_2$) at a flow rate of 45 sccm was used as a deposition gas, the deposition pressure was 0.7 Pa, the deposition power was 500 W, the substrate temperature was 130° C., and the target-substrate distance was 60 mm. Then, a 15-nm-thick oxide semiconductor 830b containing In, Ga, and Zn was deposited over the oxide semiconductor 830a by a sputtering method. The oxide semiconductor 830b was deposited under the conditions where an oxide target containing In, Ga, and Zn (an atomic ratio of In:Ga:Zn=4:2:4.1) was used, oxygen ($O_2$) at a flow rate of 45 sccm was used as a deposition gas, the deposition pressure was 0.7 Pa, the deposition power was 500 W, the substrate temperature was 130° C., and the target-substrate distance was 60 mm.

Subsequently, a 25-nm-thick tungsten nitride film was formed as the conductor 840 over the oxide semiconductor 830b by a sputtering method.

Next, a 5-nm-thick aluminum oxide film was formed as the insulator 845a over the conductor 840 by a sputtering method. Then, a 3-nm-thick aluminum oxide film was formed as the insulator 845b over the insulator 845a by an ALD method.

Next, a 170-nm-thick silicon oxide film was formed as the insulator 880 over the insulator 845b by a CVD method. Here, the deposition conditions of Sample 2A to Sample 2I are shown in Table 2.

TABLE 2

| Sample name | Constant Y | f [sccm] | PW [W] | P [Pa] |
|---|---|---|---|---|
| Sample 1A | 32.5 | 2.0 | 200 | 200 |
| Sample 1B | 19.5 | 2.0 | 120 | 200 |
| Sample 1C | 13.8 | 2.0 | 85 | 200 |
| Sample 1D | 8.1 | 2.0 | 50 | 200 |
| Sample 1E | 9.8 | 2.0 | 120 | 100 |
| Sample 1F | 6.9 | 2.0 | 85 | 100 |
| Sample 1G | 2.8 | 2.0 | 85 | 40 |
| Sample 1H | 1.9 | 5.0 | 45 | 133 |
| Sample 1I | 1.4 | 2.3 | 50 | 40 |

Through the above steps, Sample 2A to Sample 2I of this example were fabricated.

<2. Observation with Optical Micrographs of Samples>

FIG. 21B and FIG. 22 show the results of observing Sample 2A to Sample 2I with an optical microscope (bright field, a magnification of 1000 times).

Figure 22A:
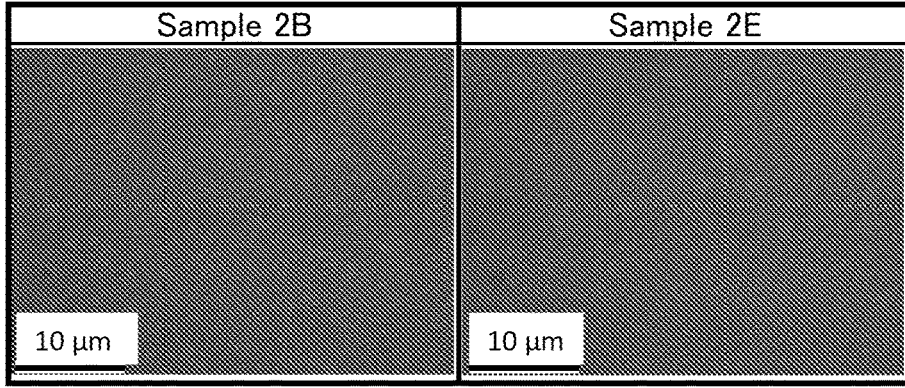
FIGS. 22A and 22B show states of top surfaces of samples of Example.
Figure 22B:
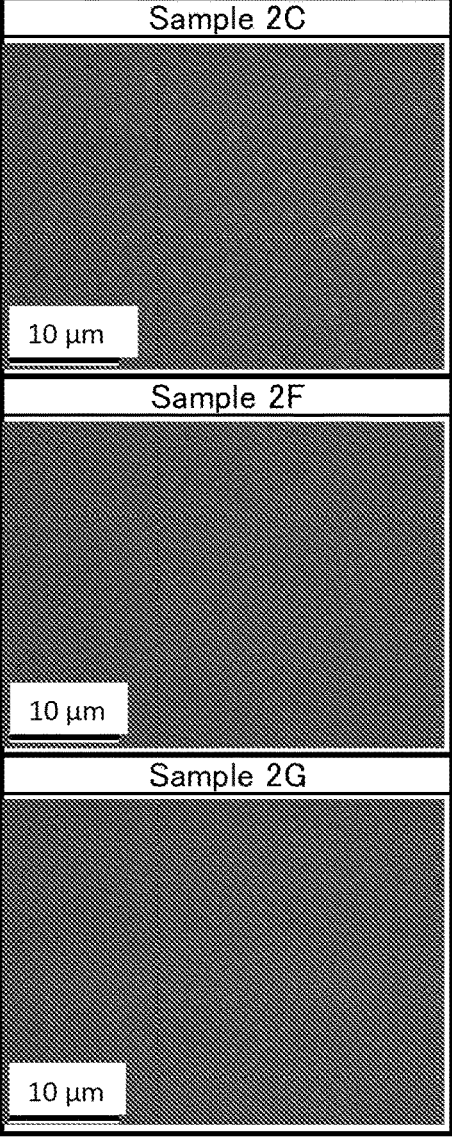

FIG. 21B shows optical micrographs of Sample 2A, Sample 2B, Sample 2C, and Sample 2D, which employ the condition where the deposition pressure in the deposition is 200 [Pa]. FIG. 22A shows optical micrographs of Sample 2B and Sample 2E, which employ the condition where the deposition power in the deposition is 120 [W]. FIG. 22B shows optical micrographs of Sample 2C, Sample 2F, and Sample 2G, which employ the condition where the deposition power in the deposition is 85 [W].

It was found from FIG. 21B that the amount of film lifting is smaller as the deposition power in the deposition is lower. It was found from FIG. 22 that the amount of film lifting is smaller as the deposition pressure in the deposition is lower.

Figure 23:
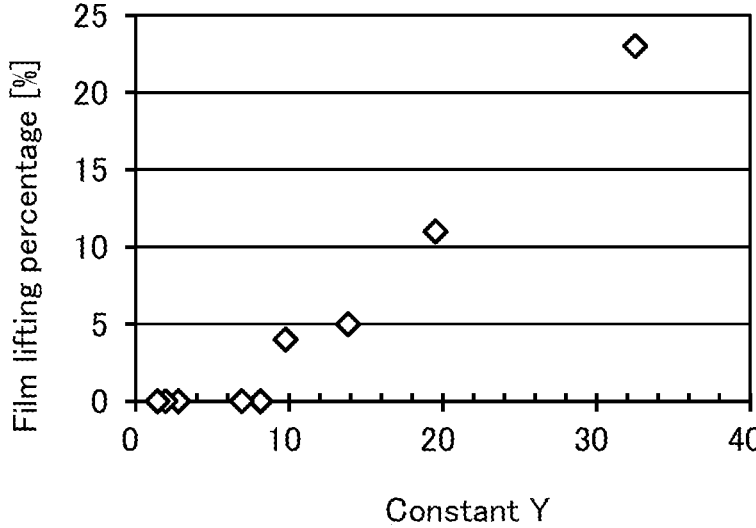
FIG. 23 is a graph showing the proportions of film lifting of samples of Example.

Here, FIG. 23 shows the percentage [%] of film lifting with respect to the value of the constant Y in Sample 2A to Sample 2I. Note that the percentage of film lifting was calculated by image analysis of the optical micrographs. It was found from FIG. 23 that there is a correlation between the value of the constant Y and the percentage of occurrence of film lifting.

In other words, when the constant Y was 0<Y<10, occurrence of film lifting and peeling was reduced. In particular, when the constant Y was 0<Y≤8.0, occurrence of film lifting and peeling was prevented.

Therefore, when the constant Y was 0<Y≤8.0 in the deposition conditions for the insulator 880, film lifting and peeling between the insulator close to the insulator 880 and the conductor was prevented from occurring.

The structure described above in this example can be used in an appropriate combination with the other examples or the other embodiments.

Example 3

In this example, semiconductor devices each including the transistor 200 illustrated in FIG. 9, which is one embodiment of the present invention, were fabricated as Sample 3A and Sample 3B, and tests for reliability of the transistor 200 were performed. Note that the channel length and channel width of the transistor 200 were each designed to be 60 nm.

<Method for Fabricating Samples>

A method for fabricating Sample 3A and Sample 3B is described below.

An In—Ga—Zn oxide was formed as the oxide 230a, the oxide 230b, and the oxide 230c by a sputtering method. As a film be the oxide 230a, a 5-nm-thick In—Ga—Zn oxide was deposited using a target with In:Ga:Zn=1:3:4 [atomic ratio]. As a film be the oxide 230b, a 15-nm-thick In—Ga—Zn oxide was deposited using a target with In:Ga:Zn=4:2:4.1 [atomic ratio].

Moreover, as the oxide 230c, an In—Ga—Zn oxide was formed by a sputtering method. As the oxide 230c, first, an 8-nm-thick In—Ga—Zn oxide was deposited using a target with In:Ga:Zn=4:2:4.1 [atomic ratio], and then, an 8-nm-thick In—Ga—Zn oxide was deposited using a target with In:Ga:Zn=1:3:4 [atomic ratio].

As the conductor 240, a 25-nm-thick titanium nitride was formed by a sputtering method. Subsequently, aluminum oxide was formed as the insulator 245. As a film to be the insulator 245, first, a 5-nm-thick aluminum oxide was deposited by a sputtering method, and then, a 3-nm-thick aluminum oxide film was deposited by an ALD method.

As the insulator 280 functioning as an interlayer film in contact with the transistor 200, a 110-nm-thick silicon oxynitride (SiON) film was deposited by a CVD method.

Here, the deposition conditions for the insulator 280 in each sample are described below.

TABLE 3

| Sample name | Constant Y | f [sccm] | PW [W] | P [Pa] |
|---|---|---|---|---|
| Sample 3A | 32.5 | 2.0 | 200 | 200 |
| Sample 3B | 1.9 | 5.0 | 45 | 133 |

Through the above steps, the sample 3A and the sample 3B were fabricated.

<2. Cross-Sectional Observation of Samples>

Cross-sectional observation of Sample 3A and the sample 3B was performed. The cross-sectional observation was performed with a scanning transmission electron microscope (STEM). As an apparatus for the observation, HD-2700 manufactured by Hitachi High-Technologies Corporation was used. FIG. 24 shows cross-sectional STEM observation results.

Figure 24A:
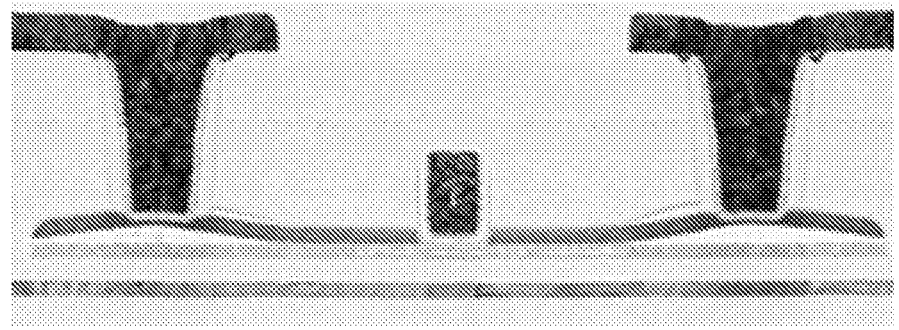
FIG. 24A and FIG. 24B each show a cross section of a sample of Example.
Figure 24B:
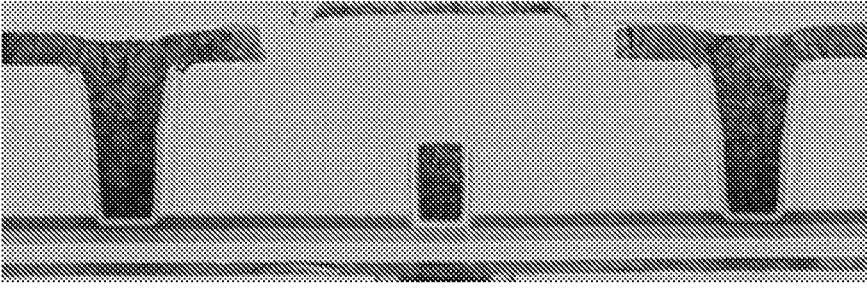

FIG. 24A shows a cross-sectional STEM image of Sample 3A with a constant Y of 32.5, and FIG. 24B shows a cross-sectional STEM image of Sample 3B with a constant Y of 1.9.

It was found from FIG. 24 that the use of the insulator with a constant Y of 1.9 as the insulator 280 in contact with the transistor 200 can provide the transistor 200 of the present invention. It was also found that the use of the insulator with a constant Y of 32.5 as the insulator 280 in contact with the transistor 200 resulted in film lifting between the oxide 230 and the conductor 240.

The structure described above in this example can be used in an appropriate combination with the other examples or the other embodiments.

REFERENCE NUMERALS

200: transistor, 205: conductor, 210: insulator, 212: insulator, 214: insulator, 216: insulator, 218: conductor, 222: insulator, 224: insulator, 230: oxide, 230a: oxide, 230A: oxide film, 230b: oxide, 230B: oxide film, 230c: oxide, 230C: oxide film, 240: conductor, 240a: conductor, 240A: conductive film, 240b: conductor, 240B: conductive layer, 245: insulator, 245a: insulator, 245A:

insulating film, 245b: insulator, 245B: insulating layer, 246: conductor, 247: insulator, 248: conductor, 250: insulator, 250A: insulating film, 260: conductor, 260a: conductor, 260A: conductive film, 260b: conductor, 260B: conductive film, 273: insulator, 274: insulator, 280: insulator, 280A: insulating film, 282: insulator, 283: insulator, 284: insulator, 290: hard mask, 290A: film, 290B: hard mask, 292: resist mask, 295: opening portion, 300: transistor, 311: substrate, 312: insulator, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 405a: conductor, 405b: conductor, 430c: oxide, 431a: oxide, 431b: oxide, 432a: oxide, 432b: oxide, 440: conductor, 440a: conductor, 440b: conductor, 445: insulator, 445a: insulator, 445b: insulator, 450: insulator, 460: conductor, 460a: conductor, 460b: conductor, 800: substrate, 814: insulator, 816: insulator, 820: insulator, 822: insulator, 824: insulator, 830: oxide semiconductor, 830a: oxide semiconductor, 830b: oxide semiconductor, 840: conductor, 845: insulator, 845a: insulator, 845b: insulator, 880: insulator, 900: substrate, 903d: oxide semiconductor, 914: insulator, 916: insulator, 922: insulator, 924: insulator, 930: oxide semiconductor, 930a: oxide semiconductor, 930b: oxide semiconductor, 930c: oxide semiconductor, 930d: oxide semiconductor, 950: insulator, 980: insulator This application is based on Japanese Patent Application Serial No. 2020-056394 filed on Mar. 26, 2020, the entire contents are hereby incorporated herein by reference.

The invention claimed is:

1. A method for manufacturing a semiconductor device, comprising:

forming an oxide semiconductor over a substrate;

forming a conductor over and in contact with the oxide semiconductor;

removing part of the conductor and part of the oxide semiconductor, thereby forming an island-shaped conductor and an island-shaped oxide semiconductor, and forming an insulator over the island-shaped conductor by a chemical vapor deposition method under conditions satisfying a relation of Formula (1) below,

[Formula 1]

$$0 < \frac{(PW[W]/S[\text{cm}^2]) \times P[Pa]}{f[sccm]} \leq 8 \tag{1}$$

wherein PW [W] represents a deposition power, S [cm²] represents an effective electrode area, P [Pa] represents a deposition pressure, and f [sccm] represents a flow rate of a silane-based deposition gas, wherein PW [W] is 85 or less, and wherein P [Pa] is 100 or less.

2. The method for manufacturing a semiconductor device, according to claim 1, further comprising:

removing part of the island-shaped conductor, thereby exposing the island-shaped oxide semiconductor, wherein the insulator is deposited in an exposed region of the island-shaped oxide semiconductor.

3. The method for manufacturing a semiconductor device, according to claim 2, further comprising:

depositing a metal oxide film over and in contact with the island-shaped conductor.

4. The method for manufacturing a semiconductor device, according to claim 3, wherein the metal oxide film inhibits diffusion of hydrogen and impurities.

5. The method for manufacturing a semiconductor device, according to claim 4, wherein the metal oxide film is an insulating film.

6. The method for manufacturing a semiconductor device, according to claim 1, wherein the oxide semiconductor is an In—Ga—Zn oxide.

7. The method for manufacturing a semiconductor device, according to claim 1, wherein the conductor comprises nitrogen.

8. The method for manufacturing a semiconductor device, according to claim 1, wherein P [Pa] is 40 or less.

9. The method for manufacturing a semiconductor device, according to claim 1, further comprising:

removing part of the insulator and part of the island-shaped conductor, thereby exposing the island-shaped oxide semiconductor.

10. A method for manufacturing a semiconductor device, comprising:

forming an oxide semiconductor over a substrate;

forming a conductor over and in contact with the oxide semiconductor;

removing part of the conductor and part of the oxide semiconductor, thereby forming an island-shaped conductor and an island-shaped oxide semiconductor, and forming an insulator over the island-shaped conductor by a chemical vapor deposition method under conditions satisfying a relation of Formula (2) below,

[Formula 2]

$$0 < \frac{(PW[W]/S[\text{cm}^2]) \times P[Pa]}{f[sccm]} \le 7 \qquad (2)$$

wherein PW [W] represents a deposition power, S [cm$^2$] represents an effective electrode area, P [Pa] represents a deposition pressure, and f [sccm] represents a flow rate of a silane-based deposition gas, wherein PW [W] is 85 or less, and wherein P [Pa] is 100 or less.

11. The method for manufacturing a semiconductor device, according to claim 10, further comprising:

removing part of the island-shaped conductor, thereby exposing the island-shaped oxide semiconductor, wherein the insulator is deposited in an exposed region of the island-shaped oxide semiconductor.

12. The method for manufacturing a semiconductor device, according to claim 11, further comprising:

depositing a metal oxide film over and in contact with the island-shaped conductor.

13. The method for manufacturing a semiconductor device, according to claim 12, wherein the metal oxide film inhibits diffusion of hydrogen and impurities.

14. The method for manufacturing a semiconductor device, according to claim 12, wherein the metal oxide film is an insulating film.

15. The method for manufacturing a semiconductor device, according to claim 10, wherein the oxide semiconductor is an In—Ga—Zn oxide.

16. The method for manufacturing a semiconductor device, according to claim 10, wherein the conductor comprises nitrogen.

17. The method for manufacturing a semiconductor device, according to claim 10, wherein P [Pa] is 40 or less.

18. The method for manufacturing a semiconductor device, according to claim 10, further comprising:

removing part of the insulator and part of the island-shaped conductor, thereby exposing the island-shaped oxide semiconductor.

* * * * *